United States Patent [19]

Akamatsu et al.

[11] 4,298,838
[45] Nov. 3, 1981

[54] TRANSFORMER DEVICE

[75] Inventors: Masahiko Akamatsu, Amagasaki; Ryohei Uchida, Himeji, both of Japan

[73] Assignee: Mitsubishi Denki Kabushiki Kaisha, Tokyo, Japan

[21] Appl. No.: 873,950

[22] Filed: Jan. 31, 1978

Related U.S. Application Data

[62] Division of Ser. No. 759,192, Jan. 13, 1977, abandoned.

[30] Foreign Application Priority Data

Jan. 14, 1976 [JP] Japan .................................. 51-3660
Jan. 14, 1976 [JP] Japan .................................. 51-3669
Apr. 9, 1976 [JP] Japan .................................. 51-40676

[51] Int. Cl.$^3$ .................... G01R 33/00; H03K 7/00; H01H 85/22
[52] U.S. Cl. .............................. 324/117 R; 324/127; 328/150; 332/12; 336/212
[58] Field of Search .................. 324/117 R, 127, 253, 324/118; 336/212; 330/8; 328/13, 150; 332/12; 307/314

[56] References Cited

U.S. PATENT DOCUMENTS 1,812,740 6/1931 Ehlers ................................. 336/212
3,454,879 7/1969 Smitka ............................ 324/117 R
3,768,011 10/1973 Swain .............................. 324/117 R

*Primary Examiner*—Ernest F. Karlsen

*Attorney, Agent, or Firm*—Oblon, Fisher, Spivak, McClelland & Maier

[57] ABSTRACT

A transformer device comprises a saturable magnetic core having control and controlled windings, the saturable magnetic core being controlled in a feedback mode through switch means such as transistor switch means. The transformer device may comprise two magnetic cores and changes in magnetic resistance between the two magnetic cores are differentially fed back and amplified to cause an oscillative switch means to be turned on and off. A current to be detected flows in the control winding and detected by the controlled winding. The detected output corresponds to the polarity and the absolute value of the current supplied to the control winding. The transformer device not only can detect or measure the primary current but can identify the polarity thereof, differing from prior art dc current or potential transformers. The transformer device of the invention operates substantially free of slot-ripple inherent in the prior art transformer. In the transformer device of the invention, the magnetic core is driven always in an unsaturated region whereby the ripple ascribed to the exciting current is minimized. Thus the transformer device is ideal for applications where an instantaneous output in value and polarity corresponding to the primary current is desired substantially free of ripple component. The effective use of the transformer device includes current or voltage measurement, electric motors and other industrial machines, as well as inverters and choppers.

3 Claims, 71 Drawing Figures

| CONDITION | 1 | 2 | 3 | |
|---|---|---|---|---|
| | SAME MATERIAL | DIFFERENT MATERIAL | SAME MATERIAL | SAME MAG. PATH |
| Cor 1 | MAGNETIC PATH: SHORT | REQ. EXCITING mag. fld. Hex-Sm | $N21 > N22$ & $\frac{N11}{N21} = \frac{N12}{N22}$ | |
| Cor 2 | MAGNETIC PATH: LONG | " HEX: Large | | |
| RELATIONSHIP OF NUMBER OF TURNS | $N11 = N12$, $N21 = N22$. | | | |

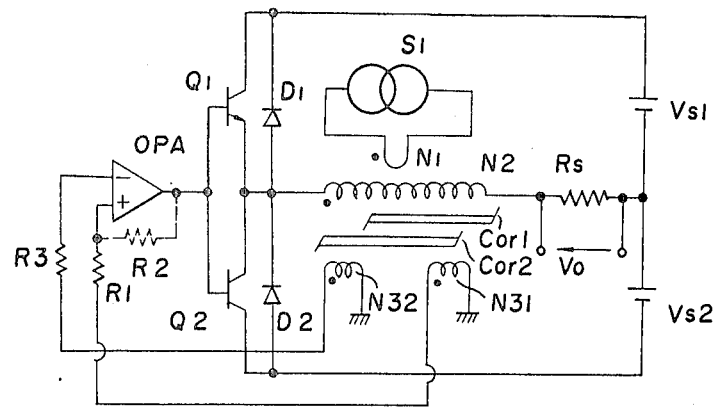
F I G. 11
F I G. 12
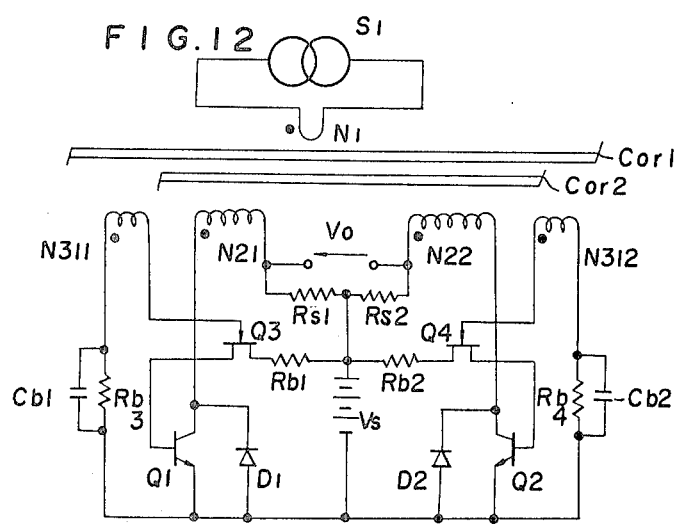
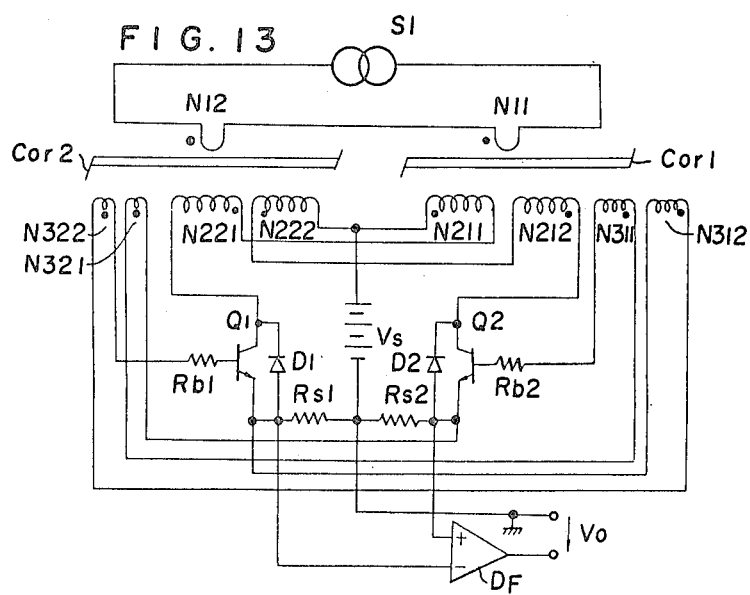
F I G. 13

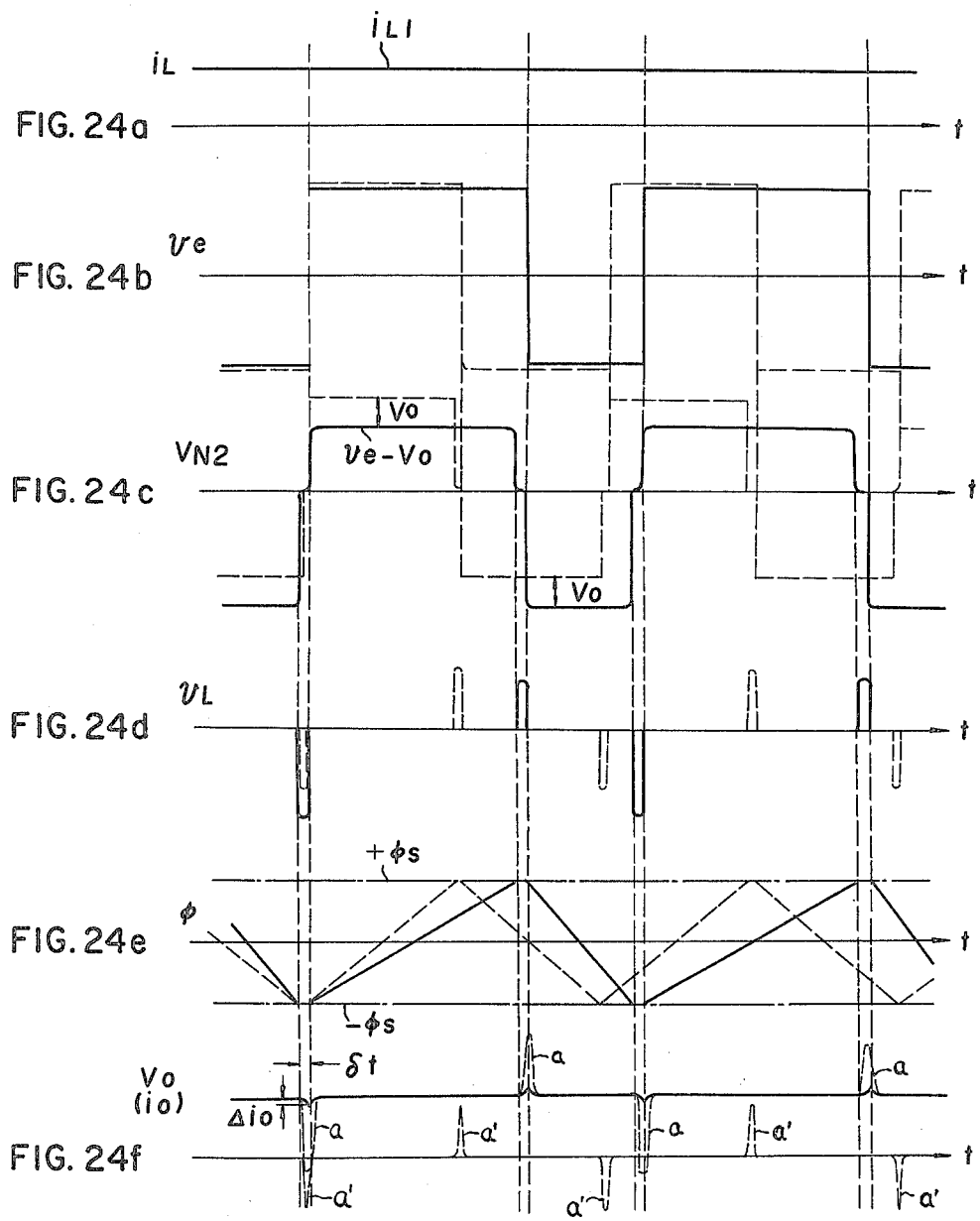

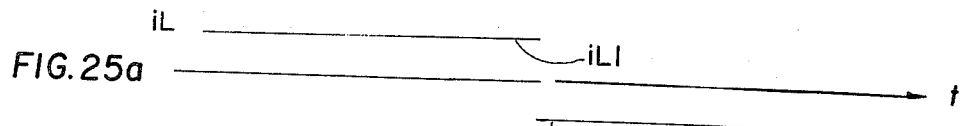
FIG. 25a
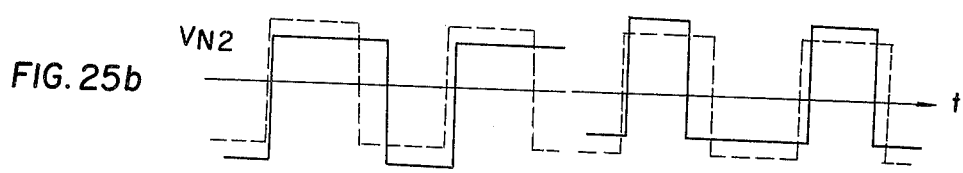
FIG. 25b
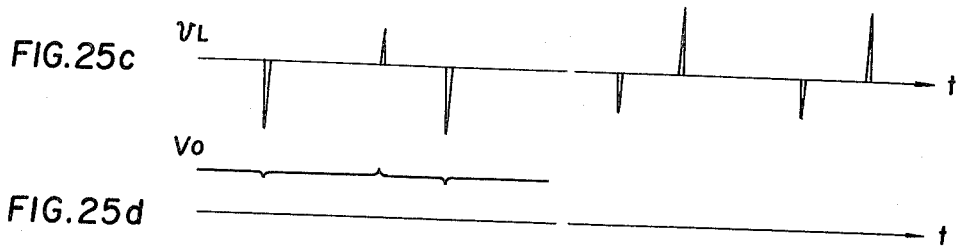
FIG. 25c
FIG. 25d
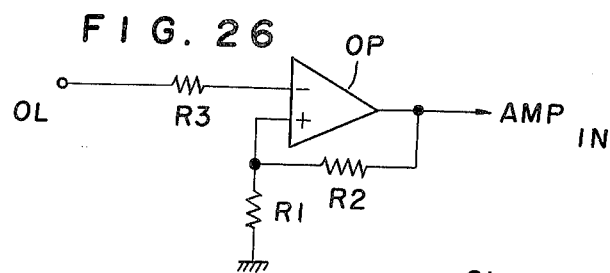
FIG. 26
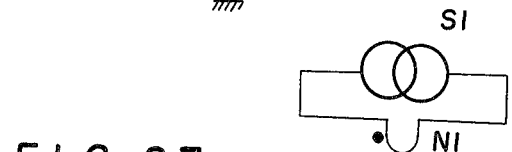
FIG. 27

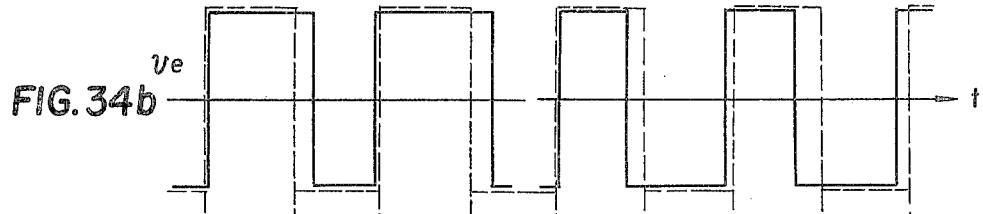
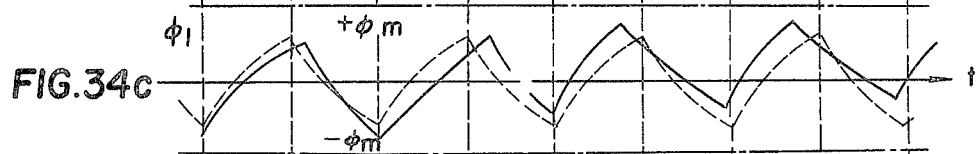
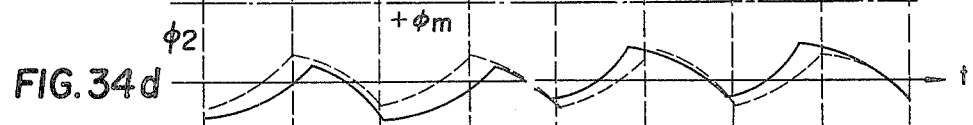
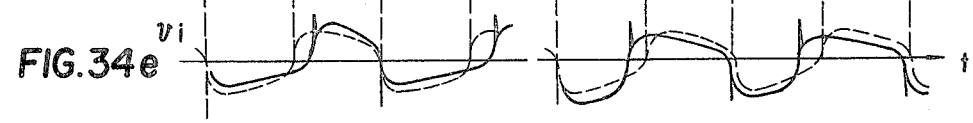
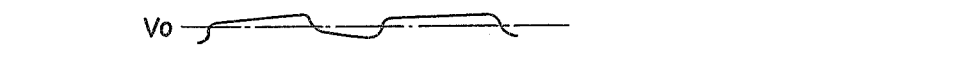

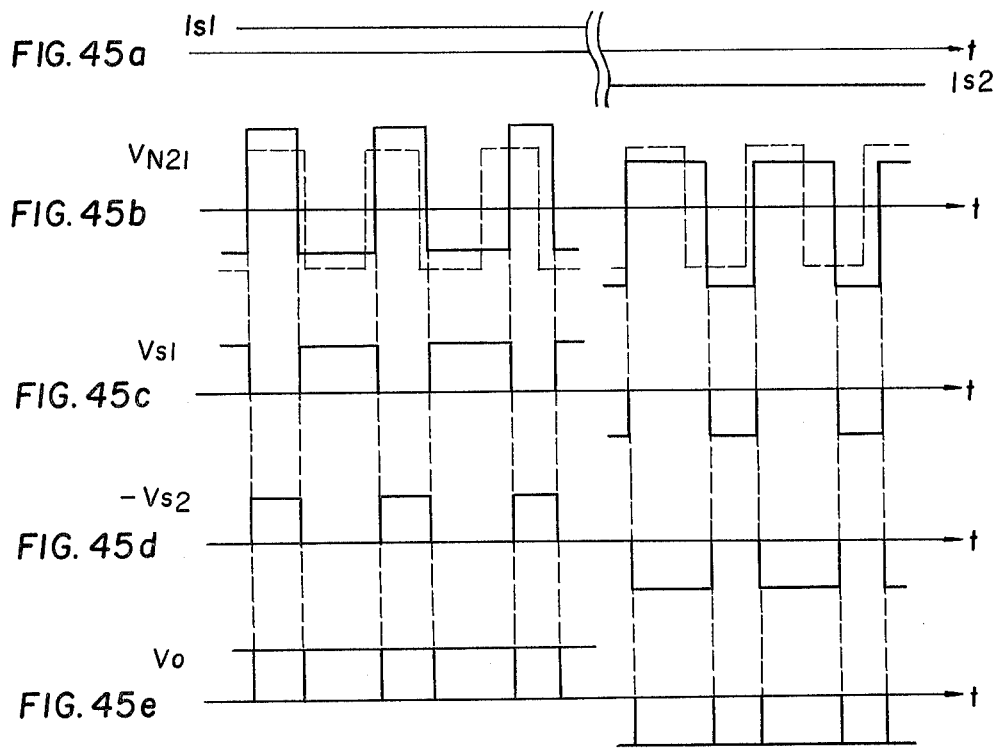
FIG. 45a
FIG. 45b
FIG. 45c
FIG. 45d
FIG. 45e
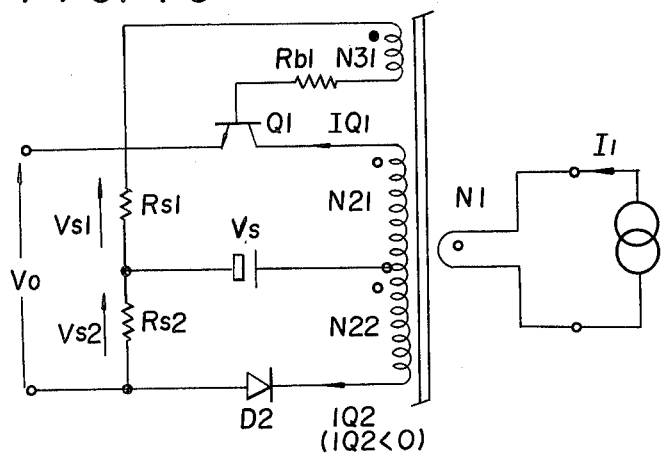
FIG. 46
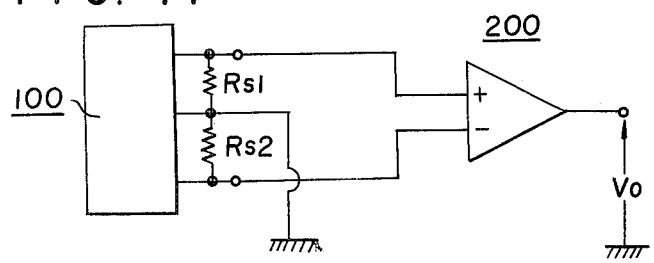
FIG. 47

FIG. 48
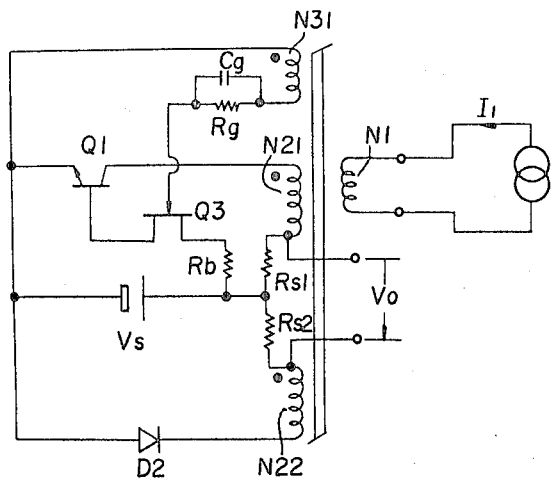
FIG. 49a
FIG. 49b.
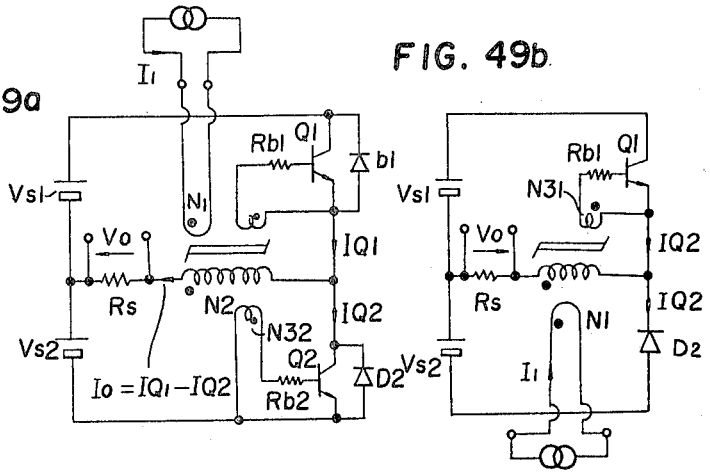
FIG. 50 (a)
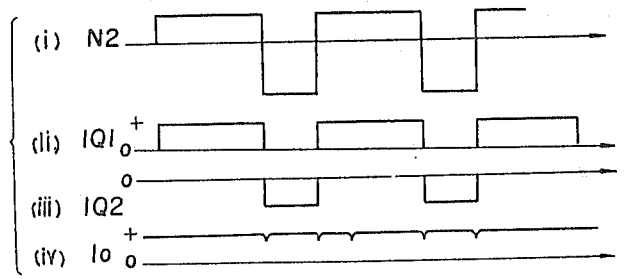
FIG. 50 (b)
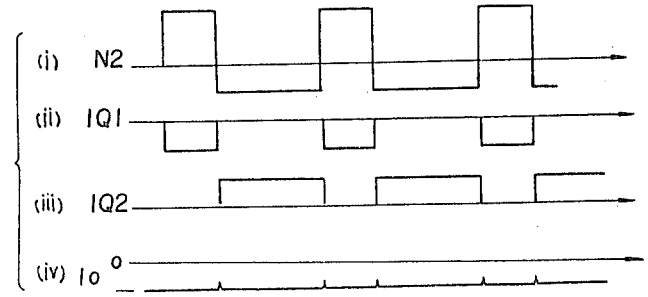

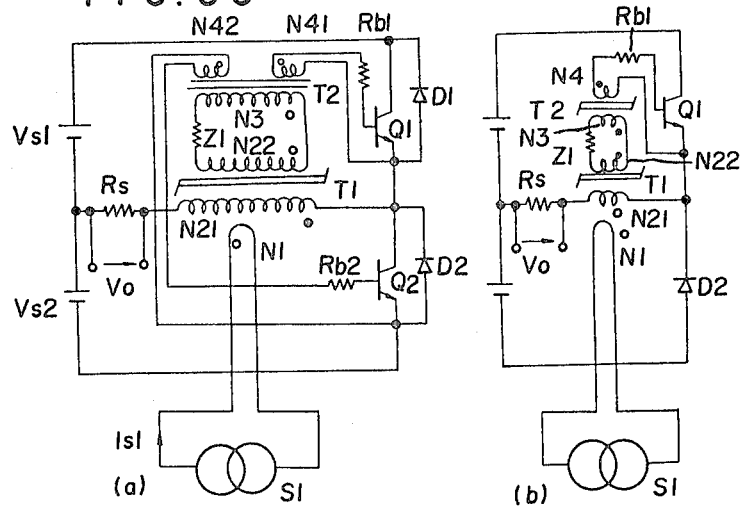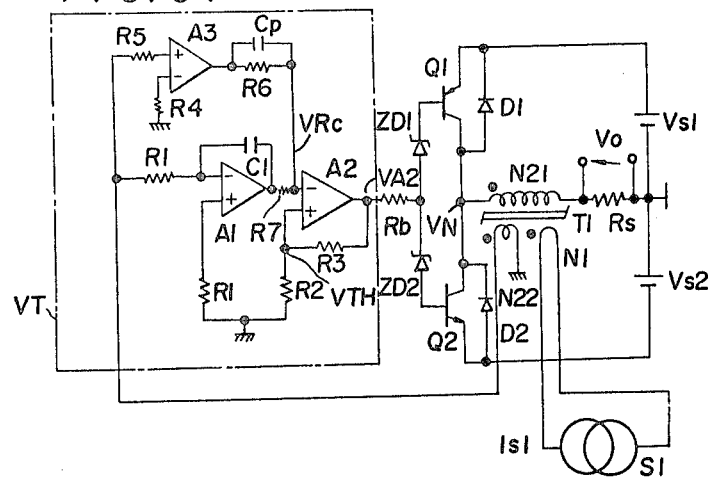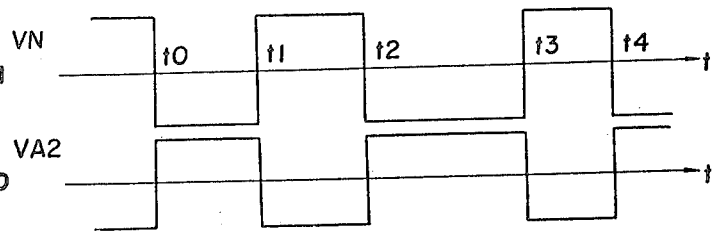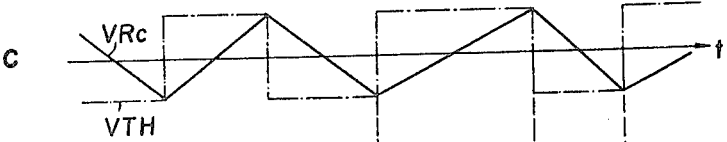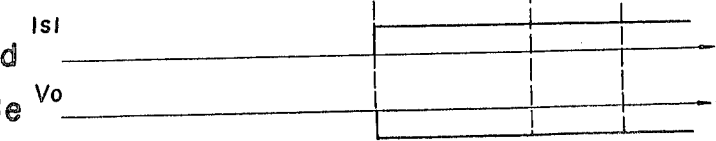

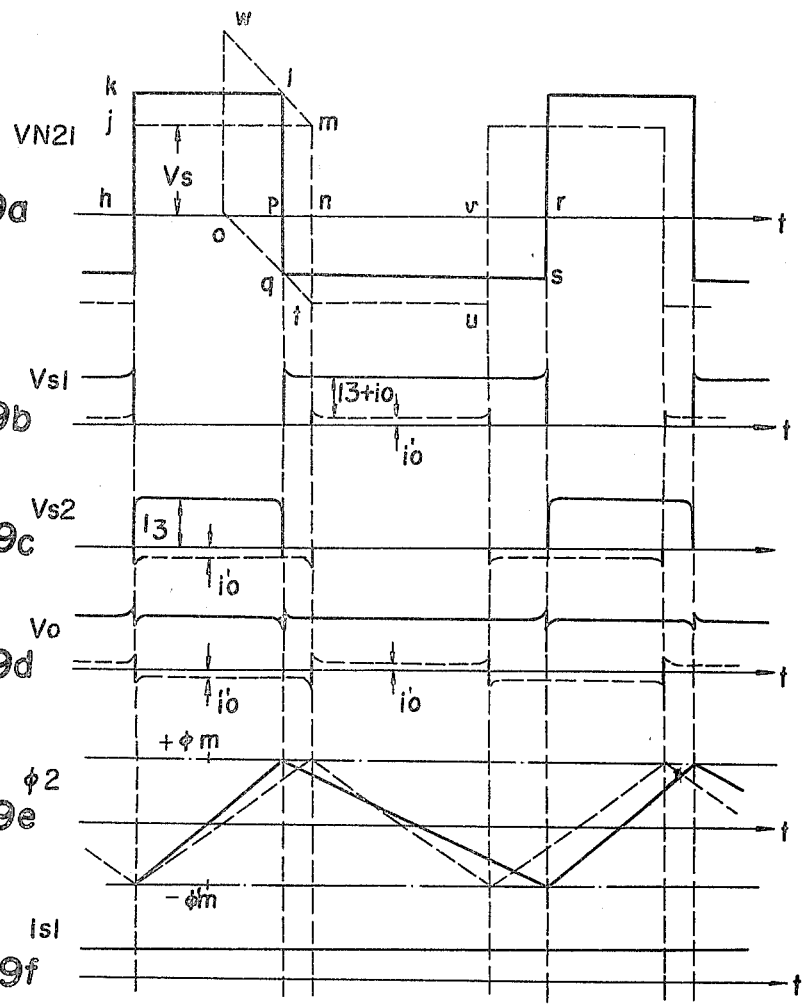

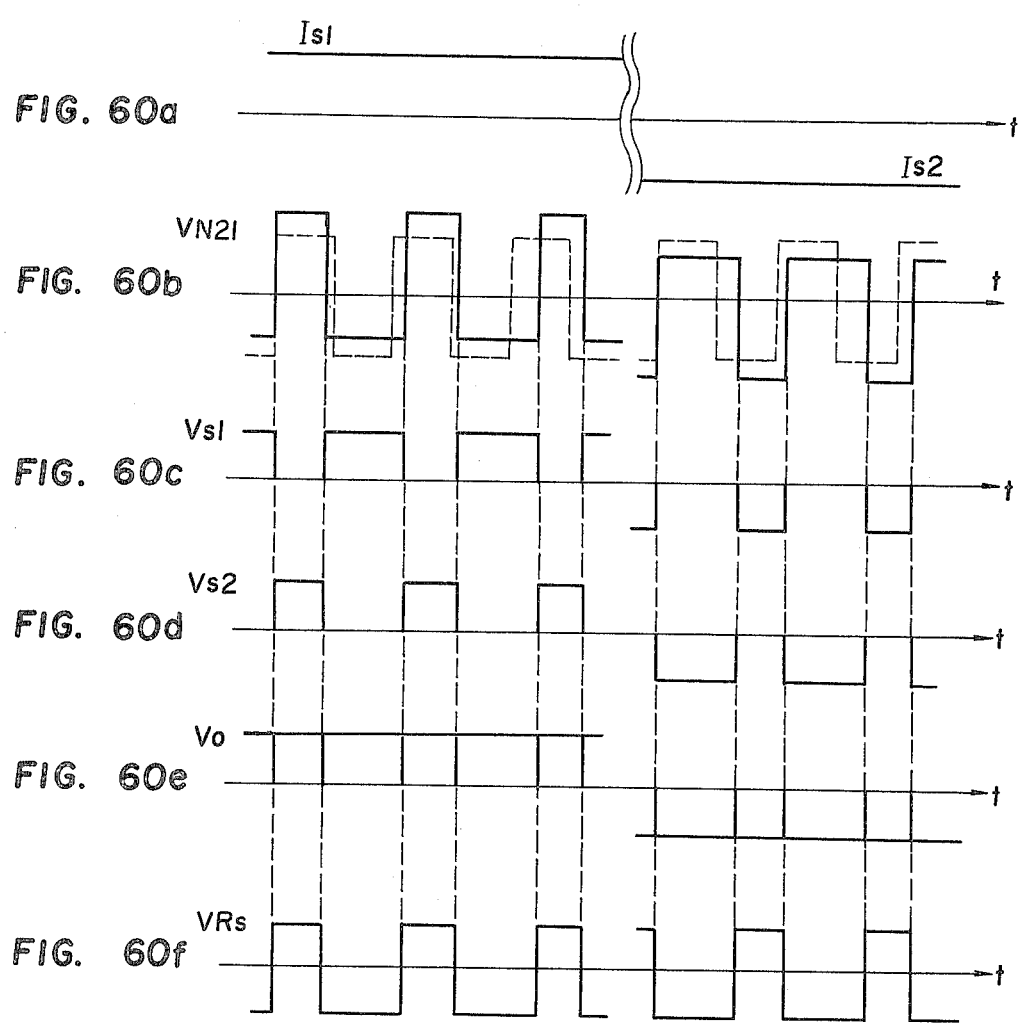

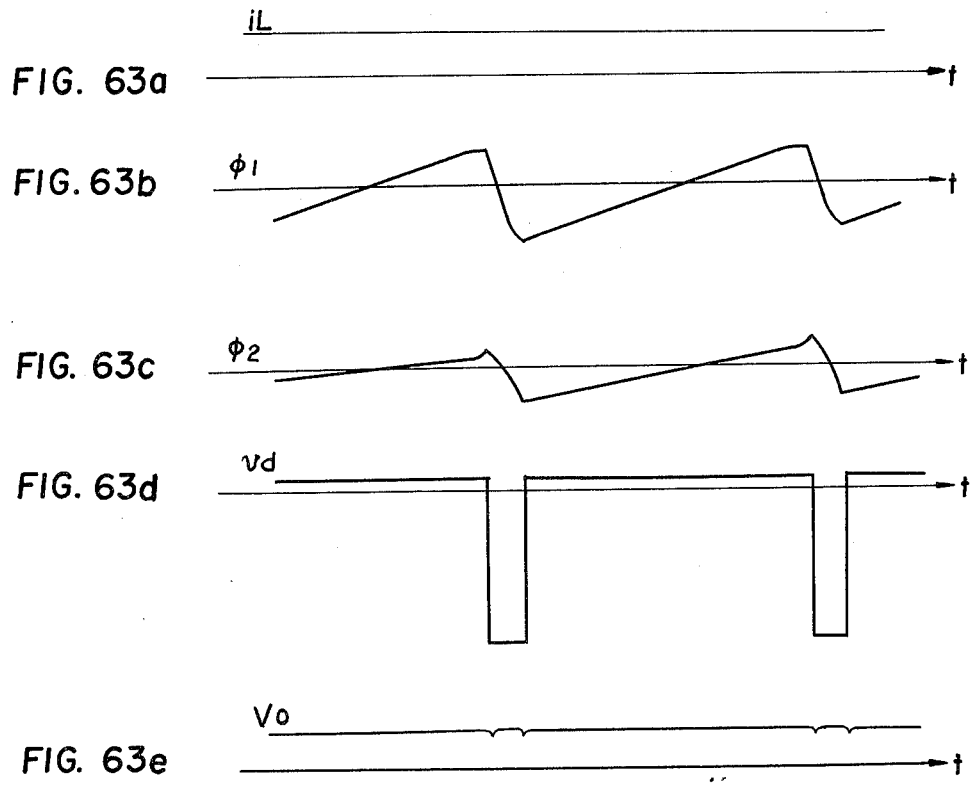
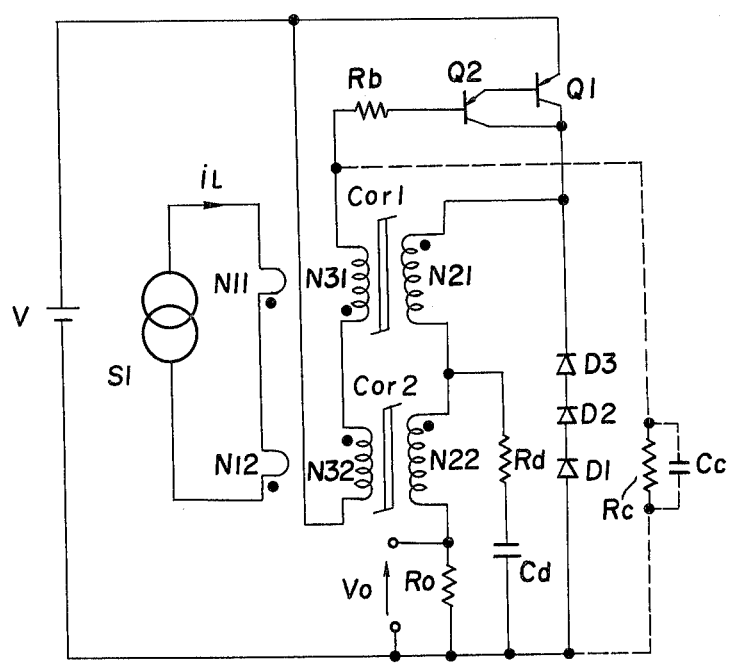

FIG. 67a  $i_L$
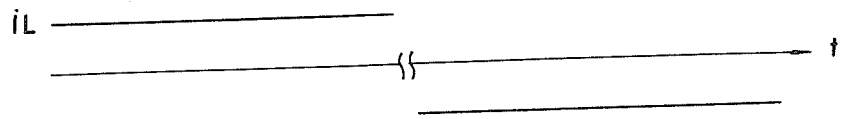
FIG. 67b  $v_e$
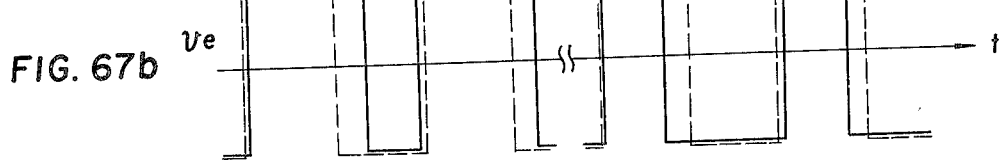
FIG. 67c  $\phi_1$
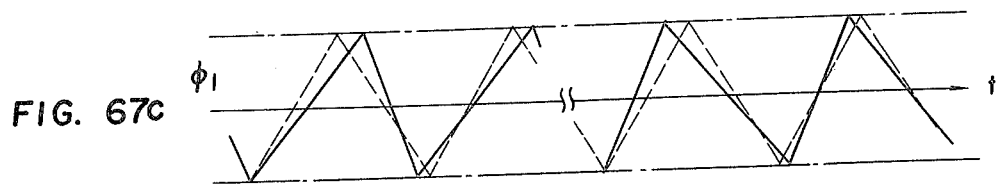
FIG. 67d  $v_{N22}$
FIG. 67e  $v_i$
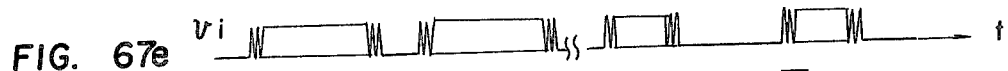
FIG. 67f  $v_{o1}$
FIG. 67g  $v_{o2}$
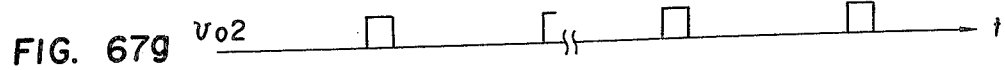
FIG. 67h  $v_{o3}$
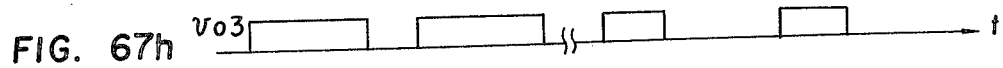
FIG. 67i  $v_o$
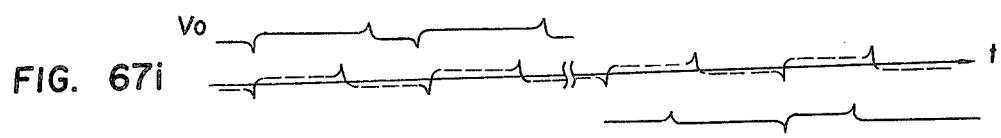

TRANSFORMER DEVICE

This is a division, of application Ser. No. 759,192, filed Jan. 13, 1977, now abandoned.

BACKGROUND OF THE INVENTION

The present invention relates to transformer devices comprising a saturable core having control and controlled windings, the saturable core being controlled in a feedback mode by switch means.

Means for detecting dc current have been known in which a resistance element is inserted in the path of the current to be detected and a voltage drop across the resistance element is measured in place of current, A dc transformer is commonly used when the current is desired to be detected indirectly from the circuit carrying the current.

The prior art transformer device is unable to identify the polarity of the current or voltage detected unless by providing the saturable cores with a third winding through which the voltage phase is detected. Another prior art approach has been to use a Hall element. In practice, however, the Hall output accompanies a considerable ripple each time one of the two saturable cores is saturated. Another known approach has depended upon the use of a magnetic responsive element which, however, is not stable enough against variations in ambient temperature.

SUMMARY OF THE INVENTION

An object of the invention is to provide a simplified transformer device in which the current or voltage is detected together with its polarity without depending on the ac power source used in the prior art device for exciting an isolated dc current or voltage transformer for obtaining a control output.

Another object of the invention is to provide a transformer device operable free of instantaneous error due to ripple by operating the core outside its saturation region, the core being inexpensive by the use of an inexpensive material such as silicon steel whose saturability and permeability are not high enough.

Another object of the invention is to provide a transformer device, the construction of which is simplified by using a single saturable reactor.

Another object of the invention is to provide a transformer device operable on both ac and dc components in which the polarity of a current or voltage detected is identified corresponding to a state of operation for deriving the detected current or voltage as a proportional value.

DESCRIPTION OF THE DRAWINGS

FIGS. 4(b), 5(b) and 5(c) are diagrams showing flux characteristics of the cores, FIGS. 24 and 25 are waveform diagrams for illustrating operations of the circuit shown in FIG. 20, FIG. 26 is a diagram showing a circuit used in a stage before an amplifier oscillated in self-quenching mode by the use of a reactor voltage in the circuit shown in FIG. 20, FIGS. 28, 29, 35 to 37 and 39 are diagrams showing embodiments of the invention, FIG. 34 is a diagram showing transient of state with time for illustrating operations of the circuit shown in FIG. 28, FIGS. 40, 43 and 44 are diagrams showing emodiments of the invention, FIG. 45 is a diagram for illustrating operations of the circuit shown in FIG. 44, FIGS. 46 to 49 are diagrams showing other embodiments of the invention, FIG. 50 is a waveform diagram for illustrating operations of the circuit shown in FIG. 49, FIGS. 51 and 52 are diagrams showing other embodiments of the invention, FIGS. 53 to 57 are diagrams showing other embodiments of the invention, FIGS. 58 to 60 are diagrams for illustrating operations of the circuits shown in FIGS. 53 and 57, FIGS. 61, 64 and 65 are circuit diagrams showing other embodiments of the invention, FIG. 63 is a diagram showing transient of state for illustrating operations of the circuit shown in FIG. 61, FIGS. 66, 68 and 69 are diagrams showing other embodiments of the invention, FIG. 67 is a diagram for illustrating operations of the circuit shown in FIG. 66.

Figure 1:
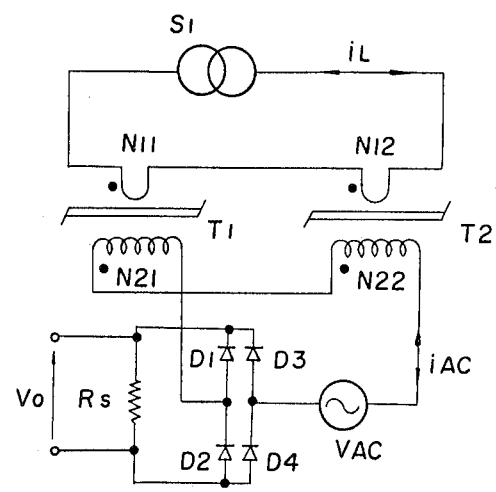
FIG. 1 is a circuit diagram showing constructional features of a prior art dc current transformer device.
Figure 70:
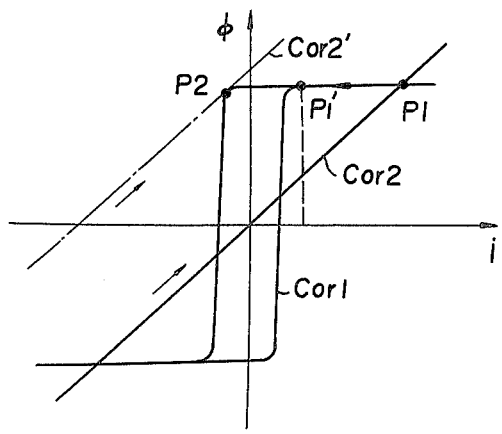
FIG. 70 is a diagram for illustrating the relationship between cores.

Like constituent components are indicated not always by the identical references in FIGS. 1 through 70.

DESCRIPTION OF THE INVENTION

Further features and advantages of the invention will become more apparent from the following description of preferred embodiments of the invention.

Figure 2:
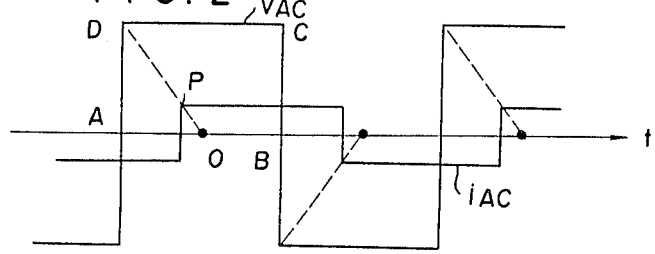
FIG. 2 is a waveform diagram for illustrating operations of the device shown in FIG. 1, FIGS. 3 and 6 to 14 are circuit diagrams showing features of transformer devices embodying the invention.

With reference now to FIG. 1, there is schematically shown the construction of a prior art dc current transformer device, in which the references $T_1$ and $T_2$ denote saturable cores with windings $N_{21}$ and $N_{22}$ and windings $N_{11}$ and $N_{12}$ where $N_{21} = N_{22}$ and $N_{11} = N_{12}$ with respect to the number of turns. The windings $N_{21}$ and $N_{22}$ are reversely serially connected to each other and excited from an ac power source $V_{AC}$. A resistor $R_s$ is connected in the ac circuit through a rectifying means compising diodes $D_1$ to $D_4$. A voltage drop across the resistor $R_s$ is detected as an output $V_o$. In this prior art circuit, the direction of the current detected cannot be identified because the output $V_o$ is derived from dc components provided by rectifying an ac current induced on the secondary side. To identify the direction of the current, another winding must be wound on each core whereby the polarity of the voltage induced across the secondary winding is detected. This approach, however, involves a circuit arrangement too intricate for practical uses. FIG. 2 shows ac voltage and current waveforms present in the circuit shown in FIG. 1; the voltage $V_{AC}$ is of square waveform in relation to a detected current $i_{AC}$ which varies in proportion to the current $i_L$ flowing on the primary side. The current $i_{AC}$ rises to point P which moves along segment OD as shown in FIG. 2, where point 0 is the center of segment AB. The cores $T_1$ and $T_2$ are used in the state of locked magnetization. The current flowing through the primary and secondary windings conforms to the equiampere-turn law on the side of unsaturable core while the other core is saturated. The cores $T_1$ and $T_2$ repeat being saturated and unsaturated alternately.

Figure 3:
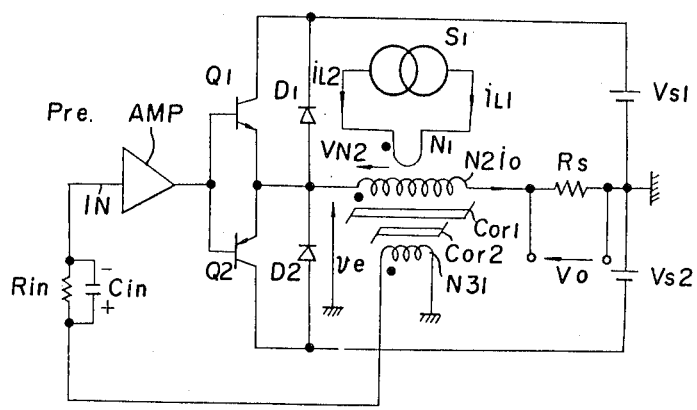

Referring to FIG. 3, a circuit diagram is shown for illustrating one embodiment of the invention, in which the references $V_{s1}$ and $V_{s2}$ denote dc power sources, $Q_1$ and $Q_2$ transistors, $D_1$ and $D_2$ diodes, and AMP an amplifier operated from the power sources $V_{s1}$ and $V_{s2}$. Receiving a positive voltage at input terminal IN, the amplifier generates an output saturated to a positive being approximately $V_{s1}$. Receiving a negative voltage, the amplifier output is saturated to a negative being approximately $V_{s2}$. The output of the amplifier is applied to the bases of transistors $Q_1$ and $Q_2$. The two transistors have their emitters connected in common to a winding $N_2$ which is wound on cores $Cor_1$ and $Cor_2$ in common. The other end of the winding $N_2$ is connected to a load resistor $R_s$. The other end of the resistor is connected to the junction between the two power sources $V_{s1}$ and $V_{s2}$, i.e., a grounding point in this example. A current source $S_1$ is provided externally, offering a current to be measured. This current is supplied to the winding $N_1$ wound on the two cores in common. When the cores are annular in shape, the winding $N_1$ is wound a few turns on the cores through the core openings. In this embodiment, the number of turns of the winding $N_1$ is far less than that of the winding $N_2$ to maintain a locked magnetization state in which the magnetization characteristics of cores $T_1$ and $T_2$ are restrained on the side of $N_2$. A winding $N_{31}$ is wound on the core $Cor_1$, having one end connected to a ground potential, and the other end to the input terminal IN of the amplifier AMP. In FIG. 3, the beginnings of the windings are indicated by dots. Connections are made so that the voltage induced across the winding $N_{31}$ by a voltage applied to the winding $N_2$ through the amplifier AMP and transistor $Q_1$ or $Q_2$ is positively fed back to the amplifier.

Figure 4A:
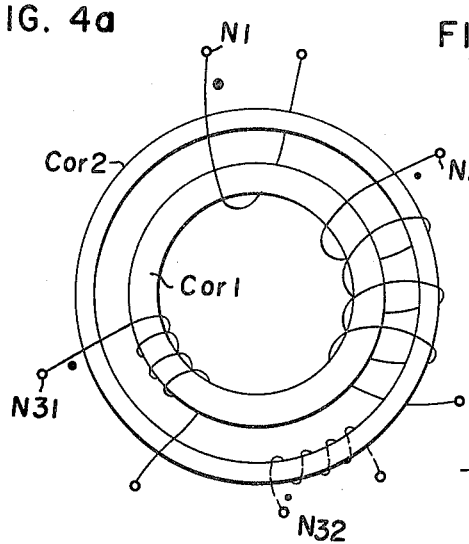
FIGS. 4(a) and 5(b) are diagrams showing relationships between cores and windings according to the invention.
Figure 4B:
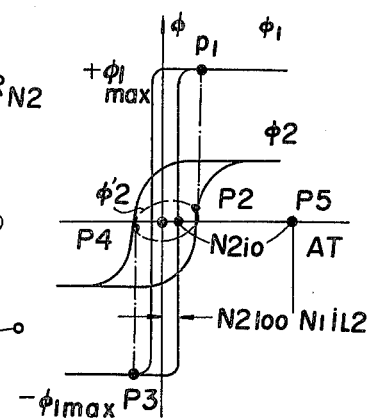

When the cores $Cor_1$ and $Cor_2$ are of the same material, the magnetic path of the core $Cor_1$ is made shorter than that of the core $Cor_2$. Windings $N_1$, $N_2$ and $N_{31}$ are wound on these cores as shown in FIG. 4(a). The cross-sectional areas of the magnetic paths of cores $Cor_1$ and $Cor_2$ may be arbitrarily determined; the cross-sectional area of the magnetic path of the core $Cor_2$ may be small. FIG. 4(b) shows flux characteristics of the two cores in comparison. The excitation ampere-turn of flux $\phi_1$ of core $Cor_1$ whose magnetic path is shorter is smaller than that of core $Cor_2$. In other words, the core $Cor_1$ can be magnetized more easily than the core $Cor_2$. The positive and negative saturation fluxes $+\phi_{1max}$ and $-\phi_{1max}$ of the core $Cor_1$ may be smaller than those of the core $Cor_2$, depending on the cross-sectional areas of their paths and the number of windings $N_2$. The circuit shown in FIG. 3 operates in the following manner. Assume the cores $Cor_1$ and $Cor_2$ are both in unsaturable state. When the amplifier output is positive, the voltage $V_{s1}$ is applied to the winding $N_2$ through the transistor $Q_1$. The magnetomotive force developed in the two cores in area where the winding $N_2$ is wound is given as $(i_o N_2 - iL_1 N_1) = N_2 I_{oo}$, where $I_{oo}$ denotes the exciting current, and $iL_1$ the input current. Because the core $Cor_1$ is more easily magnetized than the core $Cor_2$ (that is, the former is excited by a smaller magnetomotive force than the latter), the flux change is smaller in the latter than in the former. For example, when a voltage $V_{s1}$ is applied across the winding $N_2$, the flux of the core $Cor_1$ changes from $-\phi_{1max}$ to $+\phi_{1max}$ as opposed to the flux of the core $Cor_2$ which remains almost unchanged. When the core $Cor_1$ is saturated as the result that its flux $\phi_1$ reaches $+\phi_{1max}$, the exciting current $I_{oo}$ starts exciting the core $Cor_2$. (Should $Cor_2$ be absent, the exciting current $I_{oo}$ increases although it is limited by the resistor $R_s$.) After all, the exciting current $I_{oo}$ increases slightly. The operating point at this moment lies at point $P_1$ for $\phi_1$ and at point $P_2$ for $\phi_2$ as shown in FIG. 4(b). Before the core $Cor_1$ is saturated a positive voltage is induced across the winding $N_{31}$ on the side indicated by the dot due to the function of transistors $Q_1$ and $Q_2$. This voltage decreases or vanishes when the flux $\phi_1$ reaches $+\phi_{1max}$. As a result, the amplifier output, i.e., the transistor output voltage $V_e$ decreases, a reactance voltage of negative polarity is produced across the winding $N_{31}$ due to leakage or saturation inductance, and consequently the amplifier input and the output exciting voltage $V_e$ are inverted. When the internal circuit of the amplifier or the input circuit of the amplifier is provided with some differential function, the amplifier input and the output exciting voltage $V_e$ are inverted only due to the increase in the voltage across the winding $N_{31}$ as the result of saturation in the core $Cor_1$. The voltage $V_e$ is positively fed back to the amplifier input, causing the amplifier output to be inverted. Therefore an inverted voltage is applied across the winding $N_2$. That is, a voltage $V_{s2}$ is applied across the winding $N_2$ through the resistor $R_s$ and the transistor $Q_2$ in FIG. 3. This causes a negative voltage to be induced across the winding $N_{31}$ wound on the core $Cor_1$, with the result that the amplifier output is maintained intermittently negative. As described above, when the two cores operate at points $P_1$ and $P_2$ respectively, an inverted voltage is applied across the winding $N_2$ by the function of the winding $N_{31}$. In consequence, the flux $\phi_1$ of $Cor_1$ leaves $+\phi_{1max}$ and moves toward $-\phi_{1max}$. Even during this flux transition (i.e., even after the voltage applied to the winding $N_2$ is inverted), most part of flux change takes place in the core $Cor_1$ and no substantial flux change occur in the core $Cor_2$ as in the state before the voltage applied to the winding $N_2$ is inverted. When the flux $\phi_1$ reaches $-\phi_{1max}$, the voltage across the winding $N_2$ is inverted again. $P_3$ and $P_4$ in FIG. 4(b) are the operating points of the cores $Cor_1$ and $Cor_2$ at the instant the core Cor₁ is saturated. By repeating a series of the above operations, the circuit shown in FIG. 3 sustains self-oscillation. In this circuit, should the core Cor₂ be absent, a large current flows instantaneously in the winding N₂ at the moment the polarity across the winding N₂ is inverted. With the unsaturable core Cor₂, the increase in the exciting current is minimized and hence the transient current at polarity inversion does not substantially increase and hence the circuit maintains self-oscillation.

Assume the core Cor₁ is not saturated under the condition that the transistor $Q_1$ is on and the transistor $Q_2$ is off. Then a negative input current $iL_2$ flows in the winding N₁ from its starting end according to the condition: $iL_2N_1 = N_2(|i_o| + I_{oo}) \approx N_2|i_o|$ where $i_o < 0$. Therefore the current flows out of the winding N₂ from its starting end. Assume $N_1iL_2$ is at point $P_5$ in FIG. 4(b). A current corresponding to $N_2i_o$ comes out of the starting end of winding N₂. This current flows from the emitter to the collector in the transistor $Q_1$ which is in the on state. If the current amplification factor is low in the emitter-collector direction in the transistor $Q_1$, the current bypasses through the diode $D_1$. In other words, the purpose of the diode $D_1$ is to pass the reverse current and thereby to compensate for the low current amplification factor of $Q_1$. To the same effect the transistor $Q_2$ is provided with the diode $D_2$. However, these diodes may be omitted when the transistors $Q_1$ and $Q_2$ have a sufficient current amplification factor. The negative input current $iL_2$ causes the secondary current to flow by way of $V_{s1}$—$N_2$—$Q_1$ or $D_1$—$V_{s1}$ while the flux is on the rise. When the flux $\phi_1$ is saturated, the core Cor₂ is unsaturable until the voltage across the winding N₂ is inverted. Therefore, during the polarity inversion, a current flows in the same path as above according to the equi-ampere-turn law by the core Cor₂. When the flux is in the fall mode, the voltage across the winding N₂ is inverted and the current $iL_2N_1$ flows by way of $V_{s2}$—$R_s$—$N_2$—$Q_2$—$V_{s2}$ according to the equi-ampere-turn law $iL_2N_1 = N_2(|i_o|I_{oo}) \approx N_2|i_o|$ where $i_o < 0$. In this manner the voltage applied to the winding N₂ is inverted each time the core Cor₁ is saturated.

Thus, as described above, the polarity of the current $i_o$ flowing in the winding N₂ remains unchanged until the polarity of the current flowing in the winding N₁ changes, or the polarity of the current $i_o$ depends solely on the polarity of the input current iL. The composite core (the cores Cor₁ and Cor₂ in combination) is not saturated and the equi-ampere-turn law holds at every moment throughout the operation.

When the positive input current $iL_1$ flows in the winding N₁ as shown in FIG. 3, the secondary current flows by way of $V_{s1}$—$Q_1$—$N_2$—$R_s$—$V_{s1}$ according to the equi-ampere-turn law $iL_1N_1 = N_2(i_o - I_{oo}) \approx N_2i_o$ and $i_o < 0$. When the flux is in the fall mode, the secondary current flows by way of $V_{s2}$—$Q_2$ or $D_2$—$N_2$—$R_s$—$V_{s2}$ according to the equi-ampere-turn $iL_1N_1 = N_2(i_o + I_{oo}) \approx N_2i_o$ and $i_o > 0$. Thus the transormer device of the invention makes a desired current waveform and frequency available without affecting the proportional relationship between currents on the primary and secondary sides.

Figure 15A:
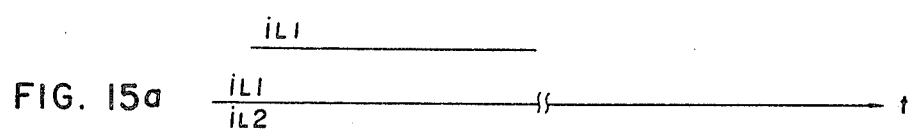
FIG. 15 is a waveform diagram for illustrating operations of the circuit shown in FIG. 3, FIGS. 16(a) to 16(d) are diagrams showing the construction of cores and windings according to the invention.
Figure 15B:
Figure 15C:
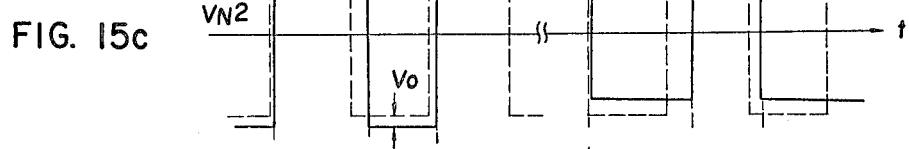
Figure 15D:
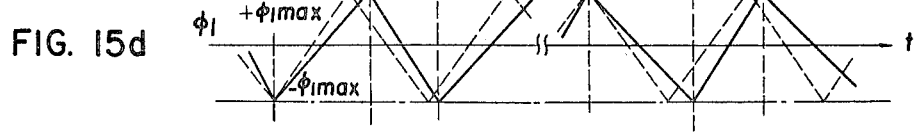
Figure 15E:
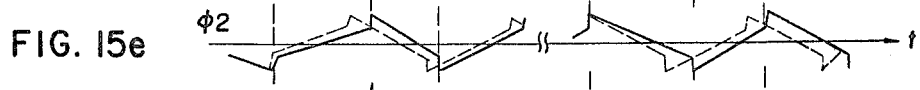
Figure 15F:
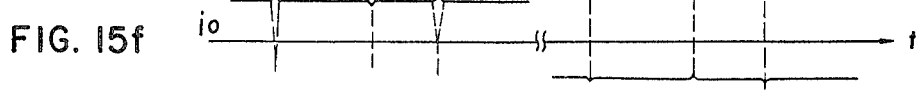
Figure 15G:
Figure 16A:
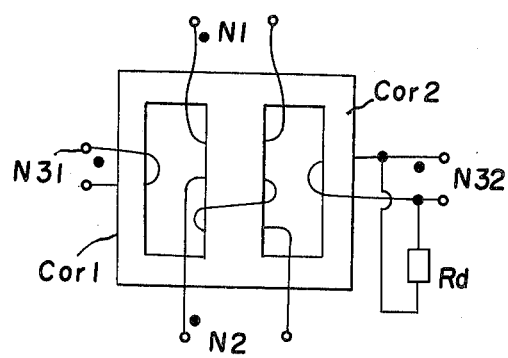
Figure 16B:
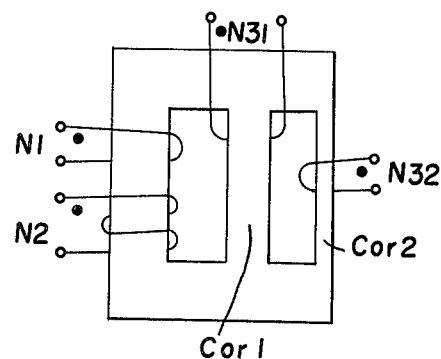
Figure 16C:
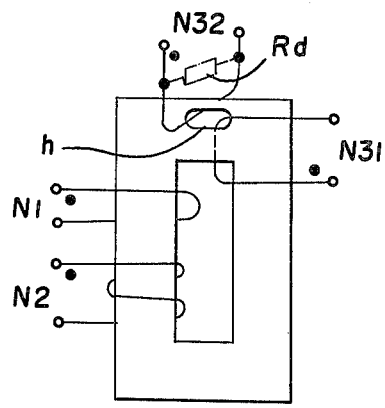
Figure 16D:
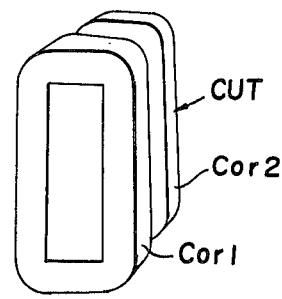

When the current $iL_1$ flows in the winding N₁, a voltage $(V_{s1} - V_o)$ or $(V_{s2} + V_o)$ is applied across the winding N₂ according as the transistor $Q_1$ or $Q_2$ is on. In other words, the transistor $Q_1$ remains 'on' long and the transistor $Q_2$ short. When the current $iL_2$ flows in the direction shown in FIG. 3, a voltage $(V_{s1} + |V_o|)$ where $V_o < 0$ is applied to winding N₂ when the transistor $Q_1$ is on, or a voltage $(V_{s2} - |V_o|)$ where $V_o < 0$ is applied thereto when the transistor $Q_2$ is on. Accordingly, the transistor $Q_1$ remains 'on' short and the transistor $Q_2$ long. This operation is illustrated in terms of waveform in FIG. 15 in which (a) indicates the current from the current source $S_I$, (b) the voltage $V_e$ oscillated by transistors $Q_1$ and $Q_2$, (c) the voltage $V_{N2}$ across the winding N₂, (d) changes in the flux $\phi_1$ of core Cor₁, (e) changes in the flux $\phi_2$ of core Cor₂, and (f) the current $i_o$ flowing in the winding N₂ and the resistor $R_s$. These waveforms are shown corresponding to the polarities indicated in FIG. 3. The waveforms indicated by the dotted lines in FIGS. 15(b) to 15(e) are those present when no current flows therein from the current source $S_I$. Because the flux of core Cor₂ changes only at times the core Cor₁ is saturated, such flux change is very small as shown in FIG. 15(e) or as depicted by a small hysteresis loop indicated by the dotted line in FIG. 4(b). This signifies the fact that the saturation value of the core Cor₂ may be small and hence the cross-sectional area thereof may be small. In other words, the function of the core Cor₂ is to maintain the equi-ampere-turn law for a very short time for which the core Cor₁ inverts its polarity each time it is saturated. Without the use of core Cor₂, the circuit will produce a ripple current indicated by the dotted line in FIG. 15(f).

The operation of the circuit shown in FIG. 3 using cores Cor₁ and Cor₂ of different characteristics as in FIGS. 5(a) and 5(b) will be described below. The core Cor₁ is of permalloy system containing molybdenum and the core Cor₂ is also of permalloy system having a rectangular hysteresis characteristic. FIG. 5(b) shows the relationship between fluxes $\phi_1$ and $\phi_2$ of the two cores. The flux behaviors of the two cores are the same as those shown in FIG. 4; the polarity of the voltage across the winding N₂ is inverted each time the core Cor₁ is saturated, and the voltage present across the winding N₂ at the polarity inversion is taken over by the core Cor₂. As opposed to the example shown in FIG. 4 in which the difference in magnetomotive force between the two cores ascribed to the difference in length between their magnetic paths is utilized, the circuit shown in FIG. 5 makes use of the difference in material between the two cores whereby saturation inversion is brought about in the core on the easily magnetizable side, and the transient voltage produced at the polarity inversion is born by the other core. FIG. 5(c) shows characteristic comparison of the two cores. In this example, the core Cor₁ is of permalloy system having a rectangular hysteresis $\phi_1$ and the core Cor₂ is of silicon steel system or soft ferrite system having a slanting hysteresis $\phi_2$. With these cores, the circuit operates in the same manner as with those illustrated in FIG. 5(b). The minor hysteresis loop which the flux of the core Cor₂ exhibits in actual operation is indicated by the dotted line in FIGS. 5(b) and 5(c).

As described above, the circuit of the invention shown in FIG. 3 can detect an externally supplied current by the use of two cores made of either the same or different material, without allowing the presence of an objectionable amount of ripple.

Figure 5B:
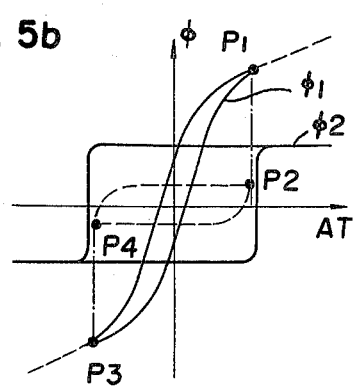
Figure 5C:
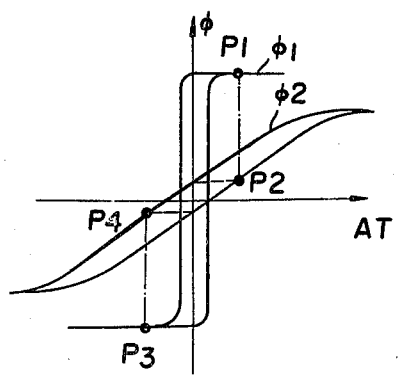
Figure 6:
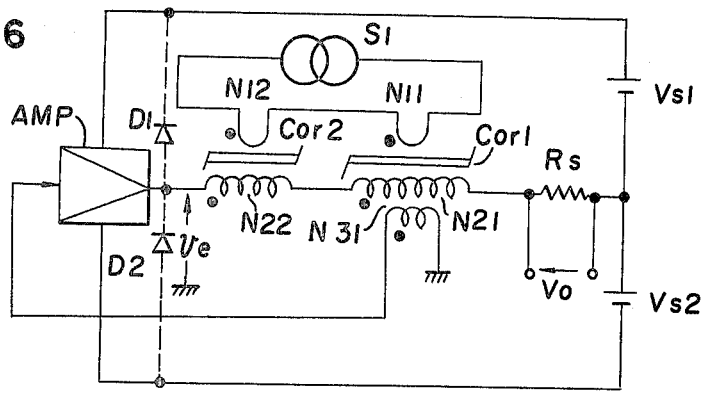

With reference to FIG. 6, another embodiment of the invention is illustrated, comprising a power amplifier AMP, cores Cor₁ and Cor₂ independent of each other, and windings N₁₁, N₁₂, N₂₁ and N₂₂ wound on the two cores respectively. The core Cor₁ is magnetizable more easily than the core Cor₂. A feedback winding N₃₁ is wound on the core $Cor_1$ for the purpose of operation as in the circuit shown in FIG. 3 in which a positive feedback is applied to the amplifier AMP for polarlity change at each saturation of the core $Cor_1$. Although the circuit shown in FIG. 6 is fundamentally the same as that shown in FIG. 3 with respect to operation, the cores $Cor_1$ and $Cor_2$ may be used in combination under three conditions indicated in Table 1 in FIG. 6. Condition 1 is such that the two cores are of the same material, and the magnetic path is short on the side of $Cor_1$ and is long on the side of $Cor_2$ and thus the output voltage from the amplifier AMP is born nearly fully by the winding $N_{21}$ on the side of $Cor_1$. As a result, flux saturation and inversion are done only in the core $Cor_1$, and the core $Cor_2$ is responsible for the period from the flux saturation in the core $Cor_1$ to the application of an opposite voltage thereto. Therefore the circuit generates an output according to the equi-ampere-turn law. In other words, the fluxes $\phi_1$ and $\phi_2$ of the two cores exhibit the same characteristics as in FIG. 4(b). In the circuit shown in FIG. 6, the current in the winding $N_{22}$ on the side of $Cor_2$ is coincident with that in the winding $N_{21}$ and hence the current in the winding $N_{12}$ must be made coincident with that in the winding $N_{11}$ on the primary side, to cancel the product of ampere-turns between the windings $N_{22}$ and $N_{12}$. According to condition 2 in Table 1, the two cores are of different materials having characteristics as shown in FIG. 5(b) or 5(c) to perform the same functions as in FIGS. 3 and 4. Condition 3 is for operations adapted to the circuit shown in FIG. 6. The two cores are of the same material having the same magnetic path. The ratio of the number of turns of primary and secondary is the same on the two cores but the number of turns of exciting winding is larger on the side of $Cor_1$ then on the side of $Cor_2$. Because the windings $N_{21}$ and $N_{22}$ are in series to each other, the same exciting current flows therein, with the result that the magnetomotive force is proportional to the number of turns or, in other words, the magnetomotive force is larger in the winding $N_{21}$ than in the winding $N_{22}$ and only the core $Cor_1$ is excited. In this state, therefore, the flux is stationary in the core $Cor_2$, and only the winding $N_{21}$ is excited by ac current through the winding $N_{31}$. Thus the winding $N_{22}$ on the side of core $Cor_2$ takes over the voltage but only for the period from the flux saturation to the polarity inversion, and a current proportional to the current from the current source $S_I$ (i.e., the primary current) is induced in the winding $N_{22}$. This flux behavior approximately corresponds to that shown in FIG. 4(b). The circuit using the two cores of condition 3 operates in the same manner as that shown in FIG. 3.

Figure 7:
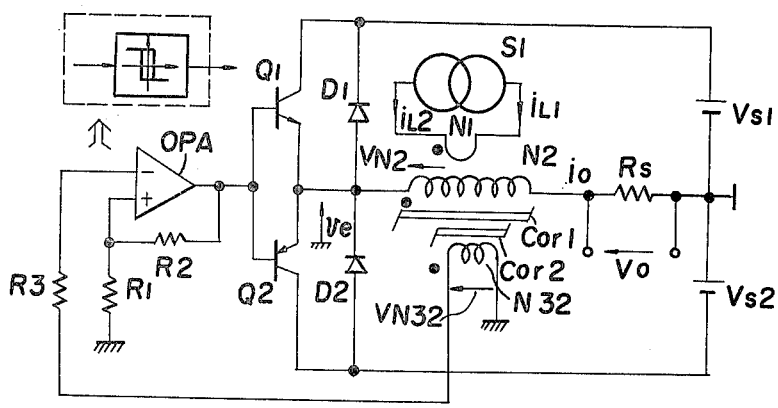
Figure 8:
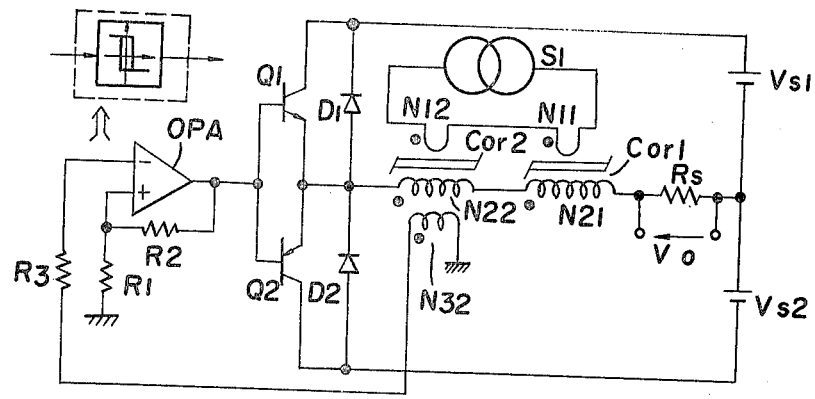

Two examples of the circuit of the invention have been described, in which the winding $N_{31}$ for effecting a feedback to the amplifier AMP is wound on the core which repeats flux saturation and inversion, to cause the core to operate in a positive feedback mode. This operation can be done by winding the feedback winding on the other core which is to operate only for the period from the flux saturation to the flux inversion in the former. Assume the circuit in FIG. 3 is operated with the core construction shown in FIG. 4. When a winding $N_{32}$ is wound on the core $Cor_2$ of FIG. 4(a), a voltage $V_{N32}$ is obtained in a waveform shown in FIG. 15(g). This voltage is induced in response to variations in fluxes $\phi_1$ and $\phi_2$ which occur at saturation. The polarity of the voltage applied can be inverted by the use of the voltage $V_{N32}$. FIGS. 7 and 8 show circuits for this operation; FIG. 7 corresponds to FIG. 3, and FIG. 8 to FIG. 6. As opposed to the foregoing examples, the circuits shown in FIGS. 7 and 8 are characterized in that the output voltage of the winding $N_{32}$ wound on the core $Cor_2$ which is not easily magnetizable is negatively fed back to an amplifier OPA whereby the polarity of the exciting current is inverted. The amplifier OPA is of a type having a hysteresis characteristic, a memory function, an internal positive feedback function or the like. The amplifier OPA inverts the output voltage of the winding $N_{32}$ when this voltage exceeds a threshold voltage dependent on resistances of resistors $R_1$ and $R_2$. The amplifier maintains the inverted polarity until the inverted voltage exceeds a threshold value dependent on resistances of resistors $R_1$ and $R_2$, thereby causing the winding $N_{32}$ to be excited in alternate directions. In FIG. 7, when the two cores are of the same material and different in the length of magnetic path, the winding $N_{32}$ on the core $Cor_2$ indicated by the dotted line in FIG. 4(a) corresponds to the winding $N_{32}$ on the core $Cor_2$ indicated by the dotted line in FIG. 5(a), having flux characteristics shown in FIG. 4(b), 5(b) or 5(c).

Figure 9:
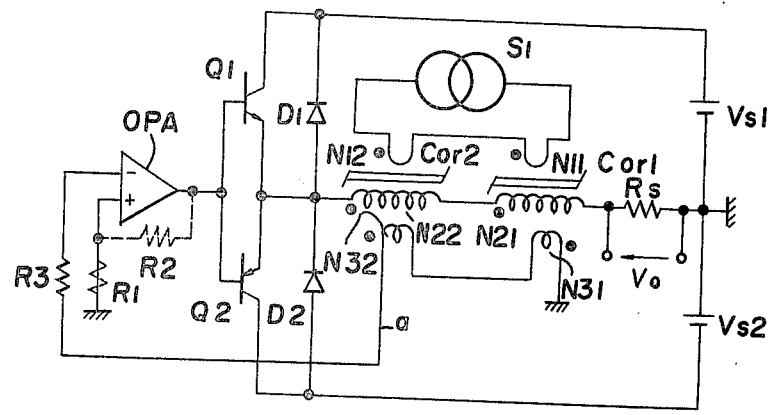

FIG. 9 is a circuit diagram showing another embodiment of the invention operably the same as those shown in FIGS. 6 and 8. According to this embodiment, the voltages across the windings $N_{31}$ and $N_{32}$ are differentially fed back to the amplifier. Assume the transistor $Q_1$ is on. Then, at a flux level on the side of easily magnetizable core $Cor_1$, the voltage is higher across the winding $N_{31}$ than across the winding $N_{32}$ and hence the transistor $Q_1$ remains on. When flux change at the core $Cor_2$ becomes large with rise in the flux level at the core $Cor_1$, the voltage across the winding $N_{32}$ becomes higher than that across the winding $N_{31}$, causing the transistor $Q_1$ to turn off, and the transistor $Q_2$ to turn on.

Figure 10:
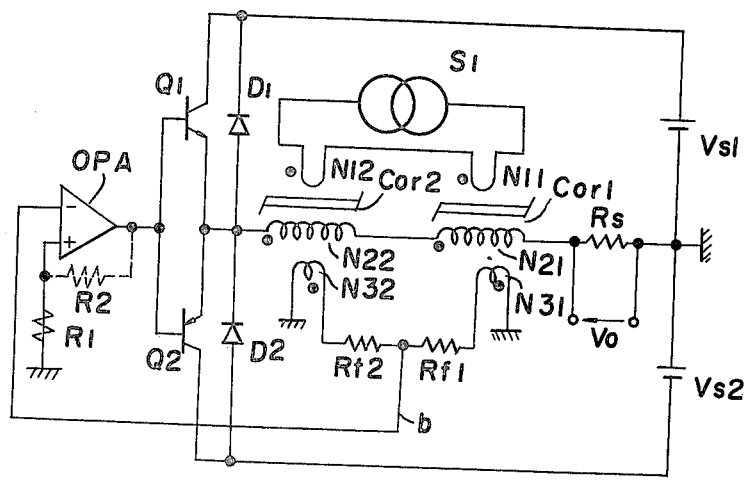

FIG. 10 shows another circuit arrangement of the invention, which is operably the same as the one shown in FIG. 9. In FIG. 10, a differential shunt point (or voltage dividing point) b on resistors $R_{f1}$ and $R_{f2}$ is connected to an input of the amplifier OPA.

In FIGS. 9 and 10, the amplifier OPA may be operated as an oscillation circuit having a hysteresis characteristic by connecting positive feedback elements indicated by the dotted lines.

FIG. 11 shows another circuit arrangement of the invention, which is operably the same as those shown in FIGS. 3 and 7. According to this embodiment, the voltages across the windings $N_{31}$ and $N_{32}$ wound on the cores $Cor_1$ and $Cor_2$ respectively are differentially fed back to the amplifier OPA whereby the polarity of the voltage applied is inverted to bring about self-oscillation. The windings $N_{31}$ and $N_{32}$ correspond to those shown in FIG. 4(a) and 5(a).

FIG. 12 shows another embodiment of the invention in which one power source $V_s$ is used instead of the two power sources $V_{s1}$ and $V_{s2}$. Windings $N_1$, $N_{21}$ and $N_{22}$ are wound on both the easily magnetizable core $Cor_1$ and the noneasily magnetizable core $Cor_2$. Windings $N_{311}$ and $N_{312}$ are wound on the core $Cor_1$ only. The circuit construction is similar to the one shown in FIG. 4(a) or 5(a). According to this embodiment, a magnetic multivibrator is formed of the windings $N_{21}$, $N_{22}$ and $N_{311}$, $N_{312}$ to bring about self-oscillation. Switching transistors $Q_3$ and $Q_4$ (or field effect transistors shown in FIG. 12) are switched into the on state through windings $N_{311}$ and $N_{312}$ to drive transistors $Q_1$ and $Q_2$ directly from the power source $V_s$. The base drive current passing through the windings $N_{311}$ and $N_{312}$ causes the flow of current in the windings $N_{21}$ and $N_{22}$ and in the current measuring resistors $R_{s1}$ and $R_{s2}$. In this circuit, the current flowing in these resistors is minimal and thus influence ascribed on the base drive operation is precluded. The transistors $Q_1$ and $Q_2$ turn on alternately, causing a secondary current to flow in the windings $N_{21}$ and $N_{22}$ alternately in response to the flow of a current on the primary side. This secondary current flows in the resistors $R_{s1}$ and $R_{s2}$ alternately. Accordingly, the sum of the voltage drops across the two resistors is the output $V_o$. The polarity of the current flowing in the two resistors is inverted with the polarity of the current being detected. Therefore the polatity of the output $V_o$ can be identified as in the embodiment shown in FIG. 3.

FIG. 13 shows another embodiment of the invention in which one power source is used instead of two as in FIG. 9. Voltage feedback windings $N_{311}$ and $N_{312}$ wound on the core $Cor_1$ are used in relation to voltage feedback windings $N_{221}$ and $N_{222}$ whereby transistors $Q_1$ and $Q_2$ are turned on alternately to bring about self-oscillation. Current detecting resistors $R_{s1}$ and $R_{s2}$ are connected on the side of emitter of two transistors $Q_1$ and $Q_2$. The sum of the voltage drops across the two resistors serves as the output of the circuit. A differential amplifier DF is operated from the power source $V_s$ or a negative voltage source (not shown) to provide an output proportional to the current flowing in the primary windings $N_{11}$ and $N_{12}$. In this circuit the core $Cor_1$ repeats flux saturation and inversion, and the core $Cor_2$ takes over the transient from saturation to inversion of flux at the core $Cor_1$ as in the foregoing embodiments.

Figure 14:
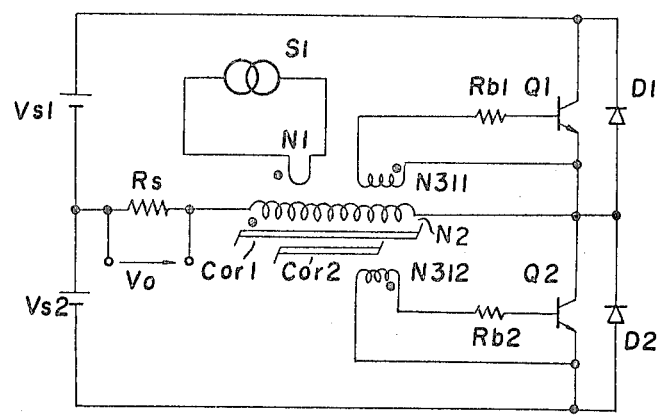

FIG. 14 shows another embodiment of the invention in which no preamplifier is used and windings $N_{311}$ and $N_{312}$ are wound on the saturable core $Cor_1$ to cause transistors $Q_1$ and $Q_2$ to be turned on alternately and thus to effect self-oscillation. In this circuit a current flows in the winding $N_2$ in response to the base drive current by way of the resistor $R_s$, resulting in an error. Nevertheless this circuit is useful when a relatively large current is passed through the primary side for detection on the secondary side using transistors having a high current amplification factor or Darlington transistors. This advantage is available also with the embodiment shown in FIG. 13.

FIG. 16 shows constructional features of cores and windings suited for use in the foregoing circuits of the invention; FIG. 16(a) shows an arrangement in which a three-leg core is used, windings $N_1$ and $N_2$ are wound in common on the center leg, the side legs are used as cores $Cor_1$ and $Cor_2$, a damping impedance such as a resistor $R_d$ is connected across the winding $N_{32}$ on the side of core $Cor_2$ and thus the necessary magnetizing force is equivalently increased. FIG. 16(b) shows another arrangement in which an asymmetrical three-leg core is used, the leg nearer the leg on which windings $N_1$ and $N_2$ are wound is used as the easily magnetizable core $Cor_1$, and the leg next the core $Cor_1$ is used as the noneasily magnetizable core $Cor_2$. FIG. 16(c) shows another arrangement in which a small opening h is provided on the main magnetic path to function equivalently as the one shown in FIG. 16(b). FIG. 16(d) shows another arrangement in which a noncut core $Cor_1$ and a cut core $Cor_2$ are used in combination or a core $Cor_1$ having a precisely finished cut plane and a core $Cor_2$ having a coarsely finished out plane are used in combination whereby the gap difference between the two cores is utilized. Windings (not shown) on these cores are the same as those shown in FIG. 5(a).

Figure 5A:
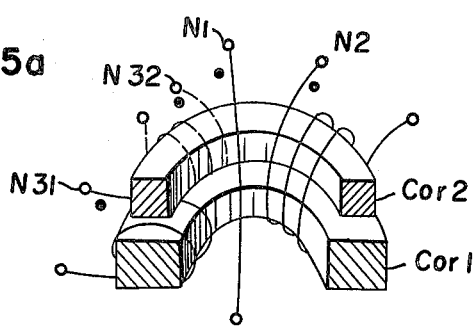

The construction of core with a damping winding (or shading coil) or a damping impedance may be employed in the circuits shown in FIGS. 4(a), 5(a) and 6. To this effect, in the embodiments shown in FIGS. 3 and 6 to 14, a given impedance loop is formed in a winding such as $N_{22}$ or $N_{32}$ on the second core (or second magnetic path).

In the foregoing embodiments, the composite core (cores $Cor_1$ and $Cor_2$ combined) seen by the exciting coil $N_2$ is not saturated. Even in the core $Cor_1$, the flux does not reach a heavy saturation region. In other words, the core $Cor_1$ becomes nearly saturated relative to the core $Cor_2$. The core $Cor_1$ may be considered nonsaturated if magnetization curves are brought nearer than those shown in FIG. 4(b), 5(b) or 5(c) in which the flux inversion points $P_1$ and $P_3$ are indicated close to the flux saturation point of the core $Cor_1$ for, when sake of illustration. In this sense, the exciting voltage maintains its polarity as long as the change in the flux of core $Cor_1$ is large relative to that of core $Cor_2$. While, when $d\phi_1/dt$ of core $Cor_1$ is reduced, an electromotive force across the winding $N_{31}$ becomes insufficient to maintain the exciting voltage (that is, the positive feedback loop gain becomes lower than 1), causing the exciting voltage to be inverted.

In the embodiments in FIGS. 7 and 8, the exciting voltage is inverted when the flux change $d\phi_2/dt$ of core $Cor_2$ rises to a given value. The magnetic level at core $Cor_1$ in relation to core $Cor_2$ can be arbitrarily determined by suitably determining how close the magnetization curves are located to each other and the gain level at which the current is detected.

Figure 17:
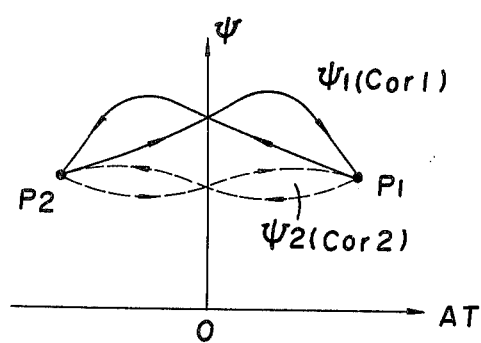
FIG. 17 is a diagram showing characteristics of cores in relation to magentomotive force.

In the embodiments shown in FIGS. 9 to 11, the flux inversion point can be arbitrarily determined by suitably determining the ratio of $d\phi_1/d(AT)$ to $d\phi_2/d(AT)$ (where AT is a magnetomotive force), the coupling coefficient (e.g., the ratio of $R_{f1}$ to $R_{f2}$) for the amplifier, and the turn ratio of $N_{31}$ to $N_{32}$. FIG. 17 is a graphic view showing the relationship between inputs $\psi_1$ and $\psi_2$ to the amplifier (or comparator having substantially an infinite gain) and the magnetomotive force at cores $Cor_1$ and $Cor_2$. These characteristic curves are analogous to $\mu$-H curves ($\mu$: permeability, and H: magnetizing force). In FIG. 17, the arrow marks on the curves indicate the direction and path of the hysteresis characteristics. The flux of core $Cor_2$ forms an extreme minor loop as indicated by the dotted line. The flux of core $Cor_1$ falls lower as it approaches its saturation points $P_1$ and $P_2$. When the flux of core $Cor_1$ reaches points $P_1$ and $P_2$, the comparator (amplifier) operates to invert the flux.

Even when the two cores are of the same characteristic, there still is an operating unbalance where the core whose permeability is larger than that of the other serves as the first core $Cor_1$. In the embodiments in FIGS. 9 to 11, if the permeability is larger in the core $Cor_2$ than in the other, no oscillation will occur. To effect an oscillation, therefore, the polarities of the windings $N_{31}$ and $N_{32}$ should be inverted with respect to the input of the amplifier. After all, an oscillation is available even if the characteristic difference between the two cores is slightest. The smaller the characteristic difference, the smaller the amplitude of the oscillated flux. Here the cores operate in the flux region of low saturation. This signifies the fact that there is no need for providing a difference in magnetization characteristic between the two cores.

According to the invention, as described above, the cores are not substantially saturated or necessarily saturated. Therefore the cores used for the purpose of the invention may not be necessarily of saturable type and hence may be inexpensive ones.

Figure 18:
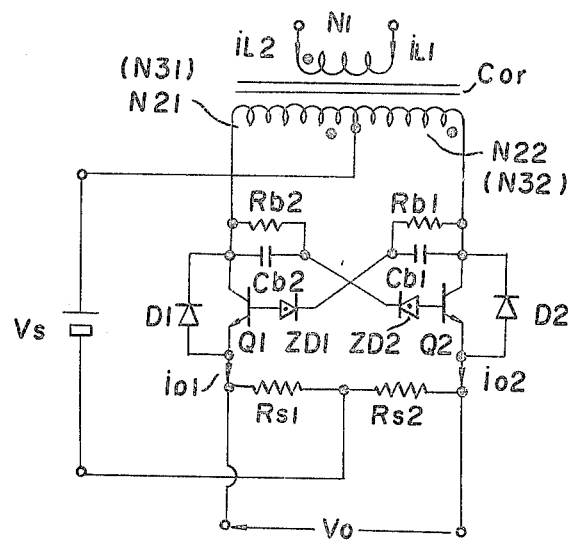
FIGS. 18 and 19(a) are circuit diagrams showing transformer devices operably analogous to each other.

The invention will be further described in reference to examples of operation with the core $Cor_2$ omitted in FIGS. 3 to 6 and 9 to 14. In such case, as described, the output current $i_o$ accompanies a ripple as indicated by the dotted line in FIG. 15(f). FIG. 18 shows another example with the core $Cor_2$ omitted, in which two excitation windings $N_{21}$ and $N_{22}$ are used, the core is excited by transistors $Q_1$ and $Q_2$ in push-pull mode, the collectors of these transistors are connected to their bases by way of resistors $R_{b1}$, $R_{b2}$, capacitors $C_{b1}$, $C_{b2}$, zener diodes $Z_{D1}$ and $Z_{D2}$, thereby forming a magnetic multivibrator. The zener diodes are used for canceling voltage drops across the resistors $R_{s1}$ and $R_{s2}$ connected to the emitters of the transistors. Unlike the circuit shown in FIG. 12, this circuit generates a ripple voltage when magnetic switching is performed. This embodiment is characterized in that self-oscillation is brought about by the use of potential changes at the collectors of the transistors instead of using the voltage across the feedback winding $N_3$.

Figure 19A:
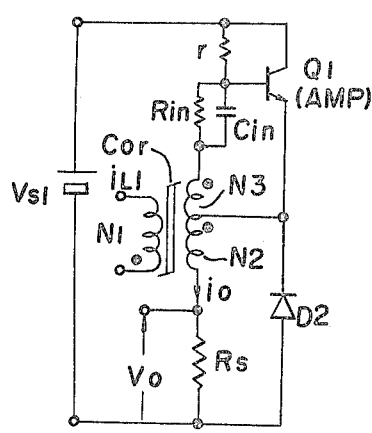
Figure 19B:
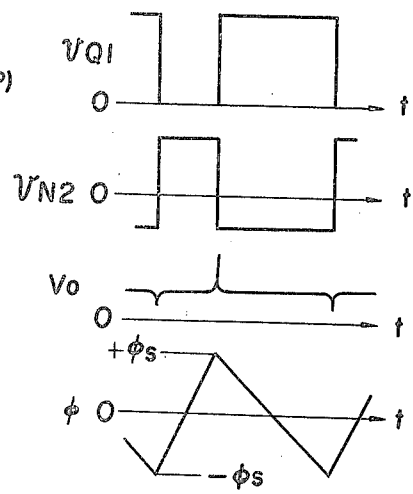
FIG. 19(b) is a waveform diagram for illustrating operations of the circuit shown in FIG. 19(a), FIGS. 20 to 23 and 27 are circuit diagrams showing transformer devices embodying the invention.

FIG. 19 shows another embodiment of the invention with the core $Cor_2$ omitted, in which a unipolar input current is applied. As described in reference to FIG. 3, when a positive input $i_{L1}$ (a unipolar input) is applied, the transistor $Q_1$ turns on during flux rise and turns off and the diode $D_2$ turns on during flux fall. While, in the circuit in FIG. 19(a), the transistor $Q_1$ turns on during rise of flux $\phi$ and maintains this state by the base current supplied through the current detection winding $N_3$. When the core is saturated, the transistor $Q_1$ turns off and the flux falls. At the same time, the excitation winding current $i_o$ flows by way of $N_2$-$R_s$-$D_2$-$N_2$, causing a negative voltage $V_o$ to be produced across the load resistor $R_s$. Thus a magnetomotive force which leads to flux fall is provided by the input current $i_{L1}$ itself. By the voltage induced across the winding $N_3$ due to the negative voltage $V_o$, the transistor $Q_1$ is held off. When the core flux reaches its negative saturation, the transistor $Q_1$ turns on again. For smooth flux inversion at the saturation point, the circuit may include a capacitor $C_{in}$ and a bias resistor $r$.

Thus, in this circuit, the core flux moves back and forth in the nonsaturation region for all the period excepting transients of flux switching whereby an output current proportional to the input current $i_{L1}$ is obtained. According to the invention, therefore, a simplified dc current transformer device can be obtained by the use of a single core. This principle is readily applicable to voltage transformer devices.

According to the foregoing embodiments of the invention, the core is excited by a dc power source through a power amplifier or a semiconductor switch, and the flux change with time is fed back to bring about self-oscillation. The circuit of the invention is useful particularly for industrial control applications where dc sources are frequently used. Furthermore, the polarity of the output corresponds to that of the input current because the circuit of the invention has an exiting circuit operable at both polarities. This makes it possible to realize a bipolar dc current transformer or a current transformer operable on various current waveforms and frequencies. Still further, because the circuit of the invention has a core with at least two magnetic paths whose magnetization conditions differ from each other, the composite core can be maintained substantially unsaturable. This signifies the fact that the equi-ampere-turn law holds at every moment during flux movement, enabling a highly efficient transformer device covering dc to MHz frequencies to be realized. The device of the invention can be used as a voltage transformer when the number of turns of input winding is increased to make it operable with a small current input. Furthermore, various kinds of electrical quantity can be efficiently transformed into other values with the device of the invention by utilizing its bipolar characteristic.

Although the device of the invention has been described in reference to operations using the equi-ampere-turn law between the excitation winding $N_2$ and the input winding $N_1$, the output of the device may be obtained as a time-ratio-modulated signal through pulse-width-modulation (time-ratio-modulation) available in terms of on-off ratio in the semiconductor switch used or the ratio of interval of one polarity to interval of the other polarity of the voltage applied across the excitation winding.

Another embodiment of the invention will be described by referring to FIG. 20, in which the references $V_{s1}$ and $V_{s2}$ denote dc power sources, and AMP an amplifier operated from the dc power source $V_{s1}$ or $V_{s2}$. The amplifier, when given a positive input at its input terminal IN, generates a positive output at its output terminal O. When given a negative input, the amplifier generates a negative output. The reference $R_s$ indicates a load resistor which passes a current $i_o$ to be detected. The voltage $V_o$ across the resistor $R_s$ or the current $i_o$ itself is the output of the device. There is provided a saturable core T on which a winding $N_1$ is wound. The winding $N_1$ carries current $i_{L1}$ or $i_{L2}$ which is detected or measured. When the core T is of annular construction, the winding $N_1$ is wound through the opening, the number of turns being one to several. In a voltage transformer with a small input current, the number of turns of $N_1$ is increased. There is provided another winding $N_2$ for deriving an output current $i_o$ proportional to the current to be measured. Also provided is a control winding $N_3$ with one end connected to the input of the amplifier AMP. The number of turns of $N_1$ is determined to be smaller than that of $N_2$ and the core T is operated in a magnetization state dependent upon the impedance on the side of $N_1$ and on the side of $N_2$. The reference L denotes a reactor.

Figure 20:
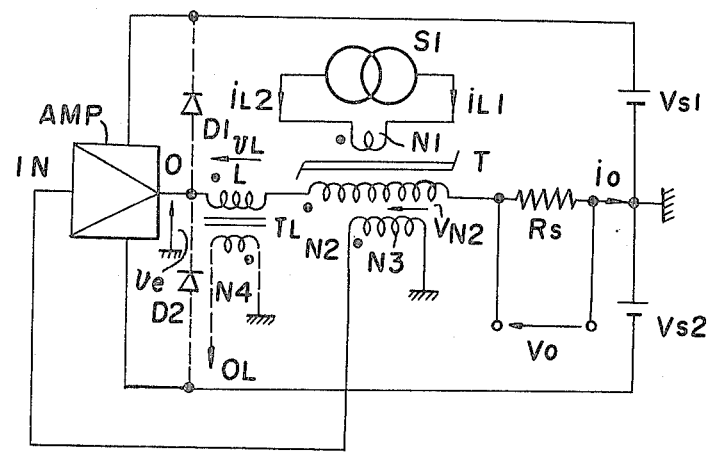

In FIG. 20, assume no input current is supplied from the power source $S_I$, the core T is in the nonsaturation region, and the amplifier AMP generates a positively saturated output. (The starting ends of the individual windings on the core T are indicated by dots.) In this state, a voltage is applied across the winding $N_2$ with its positive polarity to come on the side indicated by the dot mark whereby a voltage is induced across the winding $N_3$ with its positive polarity to come on the side indicated by the dot mark. This voltage is positively fed back to the amplifier, causing the amplifier output to be held positive. In this state, the current for exciting the core T is supplied from the power source $V_{s1}$ via the reactor L, winding $N_2$ and resistor $R_s$. When the core flux reaches its saturation $+\phi_s$, the impedance of the winding $N_2$ rapidly decreases, the output voltage induced across the winding $N_3$ vanishes, and the amplifier output $V_e$ becomes absent accordingly. Concurrently, an opposite voltage is induced across the winding $N_2$ as the result of energy release by the reactance component of the winding $N_2$. An opposite voltage is also induced across the winding $N_3$. This voltage is positively fed back to the amplifier AMP, causing the amplifier output to be inverted where $V_e$ is nearly equal to $V_{s2}$. As a result, an opposite voltage is applied across the winding $N_2$, and core flux moves toward $-\phi_s$ from $+\phi_s$. The core exciting current flows by way of $V_{s2}$-$R_s$-$N_2$-L-AMP-$V_{s2}$. When the flux reaches its negative saturation $-\phi_s$, the flux is inverted toward $+\phi_s$. Thus self-oscillation is brought about in waveforms indicated by the dotted lines in FIGS. 24(b) to 24(e) by the function of amplifier AMP, core T and windings in combination. The reactor L is used to limit the excess exciting current which flows in the winding $N_2$ for a short time extending from the saturation of core T to the inversion of excitation polarity due to inverted amplifier output. Without the reactor L, a considerable amount of current is allowed to flow in the resistor $R_s$ as the result of saturation in the core and a large output is produced across the resistor $R_s$ though momentarily. This means that an output is present despite there is no current $i_{L1}$ or $i_{L2}$ to be detected. This output, i.e., ripple, is removed by the reactor L.

Assume the reactor L is provided with a winding $N_4$ coupled to its main winding. When the core T is saturated, a high voltage is applied across the reactor as opposed to the fact that nearly no voltage is applied across the reactor when the core T is not saturated. This high voltage causes the winding $N_4$ to produce a high voltage $O_L$, which is applied to a comparator of hysteresis type composed essentially of an amplifier OP (FIG. 26) or to a flip-flop circuit. The resultant output is negatively fed back to the amplifier to effect its polarity inversion whereby the core flux is repeatedly inverted and thus self-quenching oscillation is obtained as with polarity inversion by positive feedback through the winding $N_3$ of the core T.

In FIG. 26, the output is not inverted while the input voltage $O_L$ is low. When the input voltage is either positively or negatively larger than a threshold value dependent upon resistors $R_1$ and $R_2$, the output is inverted in the negative or positive direction. Therefore the output is inverted again an input given differentially, and this output state is maintained until an input of opposite polarity is supplied in a differential form.

As described above, a self-quenching oscillation is obtained according to the invention by applying a negative feedback to the amplifier AMP through the winding $N_4$ of the reactor L via the circuit shown in FIG. 26, instead of applying a positive feedback to the amplifier AMP through the winding $N_3$ of the core T.

The invention will be described further in reference to operations using the winding $N_3$. Assume a current $i_{L1}$ flows from power source $S_f$ in the circuit shown in FIG. 20. At the instant the amplifier output is inverted from negative to positive, the flux $\phi$ of core T starts moving toward its positive saturation value $+\phi_s$ from its negative saturation value $-\phi_s$. In this state the core T is not saturated and hence a current induced in the secondary winding $N_2$ flows so that the magnetomotive force produced by the current $i_{L1}$ in the winding $N_1$ is canceled. Since the current $i_{L1}$ flows therein from the end of the winding, the current $i_o$ induced in the winding $N_2$ flows out of its end. There is the relationship $i_{L1} \times N_1 = i_o \times N_2$ conforming to the equi-ampere-turn law, or a current proportional to the current $i_{L1}$ flows in the winding $N_2$. In this state a voltage $V_e - V_o = V_{s1} - V_o$ ($= R_s \cdot i_o$) is applied across the winding $N_2$. This voltage is lower than in the case of no current in the winding $N_1$ and therefore the time taken for the core to be saturated is prolonged. When the core flux reaches $+\phi_s$, the amplifier output is inverted into negative by a positive feedback through the winding $N_3$, causing the flux to move toward $-\phi_s$ from $+\phi_s$ whereby the core T remains nonsaturated. Therefore a current the same in polarity and nearly equal in value to the foregoing current $i_o$ flows in the winding $N_2$ by way of $V_{s2}$-AMP-L-$N_2$-$R_s$-$V_{s2}$. This current flows reversely in the output stage of the amplifier. When the amplifier output stage is formed, for example, of NPN transistors, the current flows by way of emitter-base-collector.

If the reverse current is under an allowable limit, a diode $D_2$ is inserted in the amplifier output circuit as indicated be the dotted line in FIG. 20 to pass this current through the diode.

The voltage applied across the winding $N_2$ becomes $V_{s2} + V_o$ ($= R_s \cdot i_o$) whereby the time taken for the core T to be saturated is reduced because this voltage is higher than when the current $i_{L1}$ is absent.

Thus, by inverting the amplifier output alternately, an output voltage proportional to the primary current is obtained across the resistor $R_s$. FIG. 24 shows waveforms for illustrating the above operations; (a) indicates the load current $i_{L1}$ in the winding $N_1$, (b) the amplifier output voltage $V_e$, and (c) the voltage applied across the winding $N_2$. Also, (d) is the voltage across the reactor L, (e) the change in the flux $\phi$ of the core T, and (f) the output voltage (or current $i_o$) across the resistor $R_s$. These waveforms are plotted against time as the parameter according to polarities indicated in FIG. 20. Waveforms appearing when the load current $i_{L1}$ is absent are indicated by the dotted lines in FIGS. 24(b) to 24(e). Waveforms a and a' indicated by the dotted lines in FIG. 24(f) correspond to the output $i_o$ in the circuit having no reactor L; the waveform a appears where $i_{L1}$ is present, and the waveform a' appears where $i_{L1}$ is absent.

Assume the polarity of the current flowing in the winding $N_1$ is inverted. Then the current induced in the winding $N_2$ is inverted accordingly. As a result, the current flowing in the resistor $R_s$ is inverted. In other words, the polarity of the primary current can be identified according to the output $V_o$. In FIG. 20, a diode $D_1$ functions as the foregoing diode $D_2$ operated when the current $i_o$ is inverted. FIG. 25 shows waveforms for illustrating the above operations. The waveforms shown on the left half correspond to the operation in which the primary current flows in the winding $N_1$ from its terminating end, and those shown on the right half correspond to the operation in which the primary current flows therein from its starting end. FIG. 25(b) shows the voltage $N_{N2}$ without taking into consideration the transient saturation period for which the flux polarity is inverted.

The invention has been described in reference to operations of circuits without relating to the exciting current, which in practice is negligibly small relative to the current $i_o$ derived from the load current flowing in the winding $N_1$. Further, by the use of an amplifier AMP whose input impedance is high enough, the current induced in the winding $N_2$ due to the current flowing in the winding $N_3$ is small enough and substantially negligible.

In FIG. 25, the ripple in the output $i_o$ present during the period $\delta t$ for which the flux is inverted is minimized to $\Delta i_o$ in the following manner. The value of the reactor L which is to limit the ripple is theoretically $V_e' \times \delta t / \Delta i_o$ (where $V_e'$ denotes the exciting voltage which depends on the voltage drop across the resistor $R_s$, i.e., the load current). When $V_{s1} = V_{s2} = V_s$, the mean value of $V_e'$ is approximately equal to $V_s$. In other words, the use of the reactor L serves to limit the ripple to a substantially negligible level.

As described above, the transformer device shown in FIG. 20 is capable of identifying the polarity of the load current as compared with the conventional dc current transformer device which cannot identify the polarity of the load current. The circuit of the invention may, of course, be used for detecting the load ac current. Furthermore, as opposed to the conventional device which needs the use of a pair of cores and windings, the device of the invention needs only one core and windings, which serves to simplify the construction of the device. Still further, as opposed to the prior art device which needs an isolated ac power source for exciting the core when the dc current transformer output is generated as a dc voltage supplied to the control circuit, the device of the invention needs only the control dc power source for exciting the core, which serves to simplify the construction of the device. Still further, the device of the invention obviates the need for a rectifier means used in the prior art device for deriving a dc output from the ac output. In addition, the use of a reactor according to the invention serves to reduce the ripple in the output to a minimum.

Although the invention has been described in reference to operations using dc current transformers, the invention may readily be applied to dc voltage transformers in such manner that the number of turns of the primary winding $N_1$ is increased and a high impedance element such as reactor or series resistors is inserted in the load circuit and thus the primary current is stabilized. This approach will simplify the construction of the dc voltage transformer.

Figure 21A:
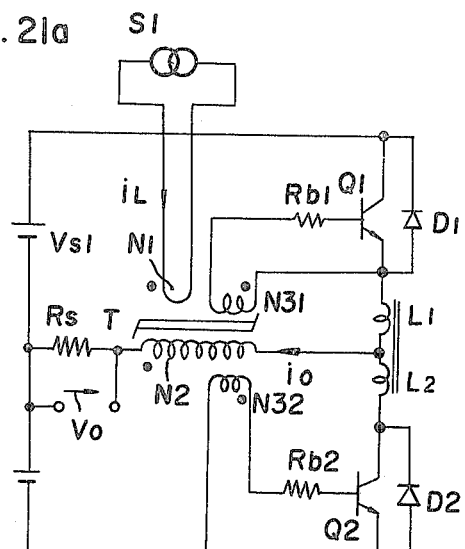
Figure 21B:
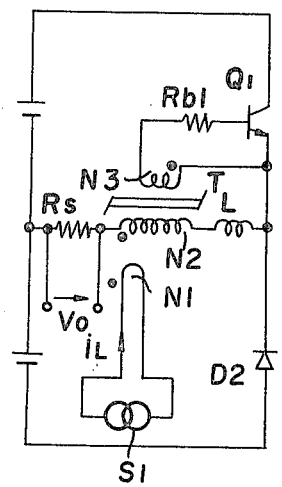
Figure 22:
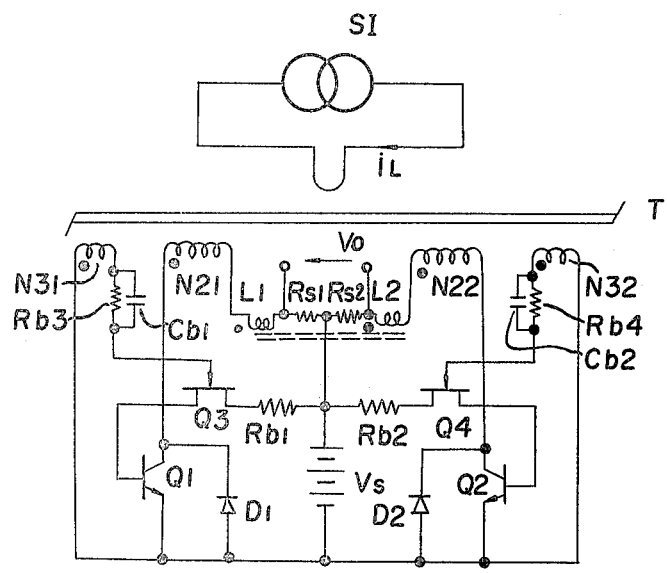
Figure 23:
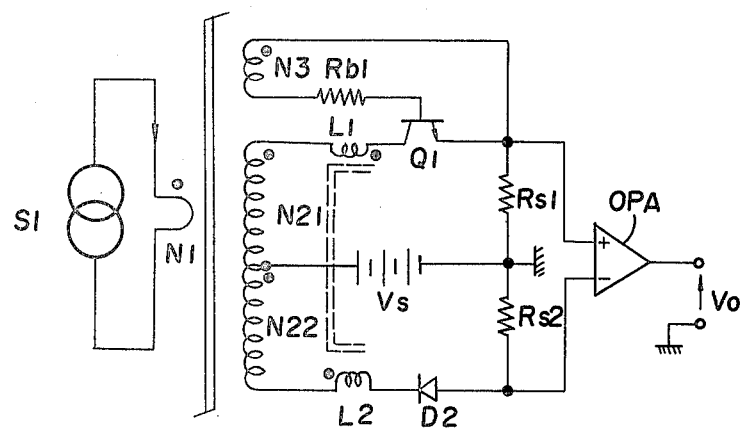

With reference to FIGS. 21 to 23, there are shown circuit diagrams for illustrating other embodiments of the invention; FIG. 21(a) shows a bidirectional output detecting type, and FIG. 21(b) a polarity detecting type. In FIG. 21(a), windings $N_{31}$ and $N_{32}$ are excited by current detecting winding $N_2$ wound on core T, causing transistors $Q_1$ and $Q_2$ to be alternately turned on each time the core is saturated whereby self-quenching oscillation is generated. At flux inversion at the saturation points, the current $i_o$ is limited by reactors $L_1$ and $L_2$ to minimize the output ripple. Another function of reactors $L_1$ and $L_2$ is to limit the current flowing while the two transistors are short-circuited due to the time difference between turn-on and turn-off switching in the two transistors. These reactors may be connected in series to the winding $N_2$ as shown in FIG. 20. The circuit in FIG. 21(a) is operably the same as the one shown in FIG. 20. In the circuit shown in FIG. 21(a), the current flowing in the resistor $R_s$ via the winding $N_2$ due to the base current for exciting the transistors $Q_1$ and $Q_2$ serves as an error component, which is added to the output $V_o$. This error can be neglected when the circuit handles a relatively large current. According to this embodiment, the circuit can be simplified.

FIG. 21(b) shows a simplified circuit of polarity detecting type. Assume the polarity of the current flowing from the current source $S_I$ is constant. In FIG. 21(a), when the primary current $i_L$ flows in the winding $N_1$ from its starting end, the detected current $i_o$ flows out of the winding $N_2$ from its starting end. This polarity remains unchanged even if the polarity of the voltage across the winding $N_2$ changes. In this state, the current flowing in the transistor $Q_1$ is diverted to the transistor $Q_2$ in the emitter-collector direction or to the diode $D_2$ when the transistor $Q_1$ turns off and the transistor $Q_2$ turns on. This signifies that the transistor $Q_2$ is not always needed. Therefore, when the polarity of the load current is constant, one of the transistors $Q_1$ and $Q_2$ and one of the diodes $D_1$ and $D_2$ may be omitted, an example of the circuit being shown in FIG. 21(b).

FIG. 22 shows a circuit arrangement comprising a saturable core T used to form a Royer oscillator for self-quenching oscillation. The circuit comprises also resistors $R_{61}$ and $R_{62}$ and switching elements (e.g., field effect transistors $Q_3$ and $Q_4$) to enable the power source $V_s$ to supply base current directly to transistors $Q_1$ and $Q_2$. In this circuit, the current flowing in the base drive windings $N_{31}$ and $N_{32}$ is very small and hence the base drive current flowing in the windings $N_{21}$ and $N_{22}$ can be reduced to a negligibly small value. The current to be measured flows through the windings $N_{21}$ and $N_{22}$ and through the resistors $R_{s1}$ and $R_{s2}$. The voltage drops across these resistors are combined into an output $V_o$. This output is coincident with the primary current with respect to polarity and proportional in value to the primary current as in the circuit shown in FIG. 20. The current flowing at flux inversion is limited by the reactors $L_1$ and $L_2$ which are closely coupled to each other whereby the ripple in the output is reduced to a substantially negligible value.

FIG. 23 shows a simplified circuit arrangement similar to the one shown in FIG. 22. The reactors and resistors $R_{s1}$ and $R_{s2}$ are positionally different from those in FIG. 22 to simplify the circuit. The output of the circuit is derived from a differential amplifier OPA and thus the output can be made equal to the power source voltage $V_s$. There is provided a negative power source (not shown) for driving the amplifier OPA, of which the ground potential is the same as the power source $V_s$.

FIG. 27 shows another embodiment of the invention in which two cores are used; the main core $T_1$ is excited through windings $N_{21}$ and $N_{22}$ by transistors $Q_1$ and $Q_2$. The voltage induced across another winding $N_3$ is led to the winding $N_4$ wound on the auxiliary winding $T_2$. Self-quenching oscillation is brought about through the saturable core $T_2$ whose saturation time is shorter than that of the core $T_1$. A reactor L is connected in series to the power source $V_s$ to limit the current which flows through current detecting resistors $R_{s1}$ and $R_{s2}$ at flux inversion in the core $T_2$ and thereby to reduce ripple in the output $V_o$. This circuit is operably the same as those shown in FIGS. 20, 21 and 22. In this embodiment, a reactor L' may be connected between the windings $N_3$ and $N_4$. This arrangement will further limit the ripple current ascribed to flux saturation in the core $T_2$.

According to this embodiment, as described above, a self-oscillator is formed of a saturable core and its windings, and a winding for passing the current to be detected is provided whereby an output proportional to the detected current is obtained on the side of driver for the oscillation. Furthermore, the reactor L is used to limit the ripple in the output. If necessary, the driving of the self-oscillator can be controlled by the use of the reactor.

Briefly, according to the invention, the circuit can detects the polarity of the primary current, as well as the value of the primary ac current or voltage by a simple circuit arrangement.

Figure 28:
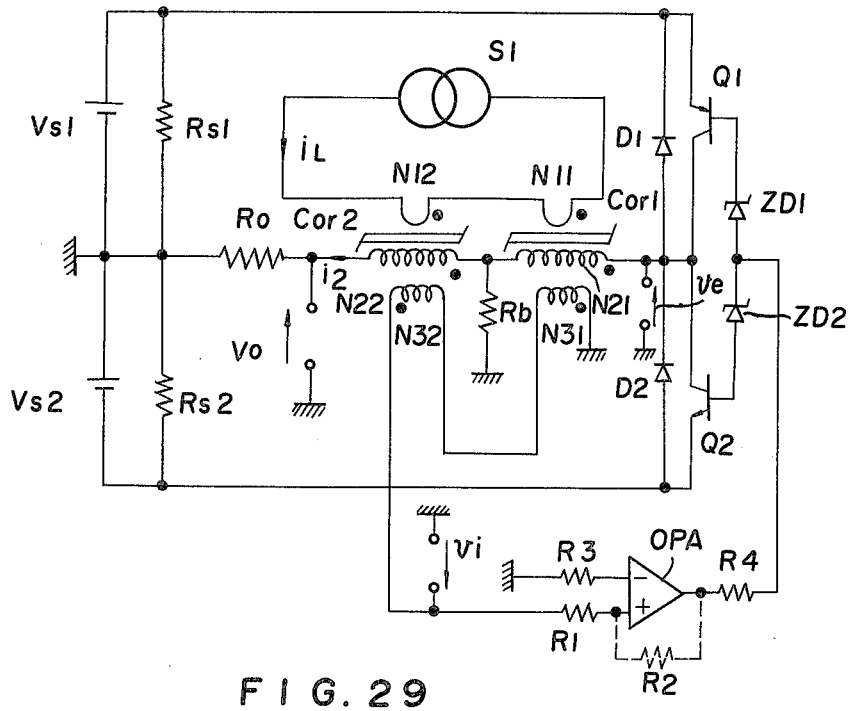

Another embodiment of the invention is illustrated in FIG. 28 in which the references $V_{s1}$ and $V_{s2}$ denote dc power sources, $Q_1$ and $Q_2$ transistors, $D_1$ and $D_2$ diodes, $ZD_1$ and $ZD_2$ zener diodes, $Cor_1$ and $Cor_2$ cores having the same rectangular magnetization characteristic, and $N_{11}$, $N_{21}$, $N_{31}$, and $N_{12}$, $N_{22}$, $N_{32}$ windings wound on the cores $Cor_1$ and $Cor_2$ respectively, with dots indicating their starting ends. The windings $N_{11}$ and $N_{12}$ are serially connected to a current source $S_I$ whose current $i_L$ is to be detected. The circuit comprises resistors $R_{s1}$ and $R_{s2}$, and a load impedance $R_o$ across which an output proportional to the primary current is obtained. There is provided an amplifier OPA whose gain is high enough. The amplifier OPA has one input connected to the windings $N_{31}$ and $N_{32}$ which are reversely serially connected to each other. The amplifier has the other input connected to a ground potential through a resistor $R_3$. The reference $R_b$ denotes a bias resistor.

Figure 30:
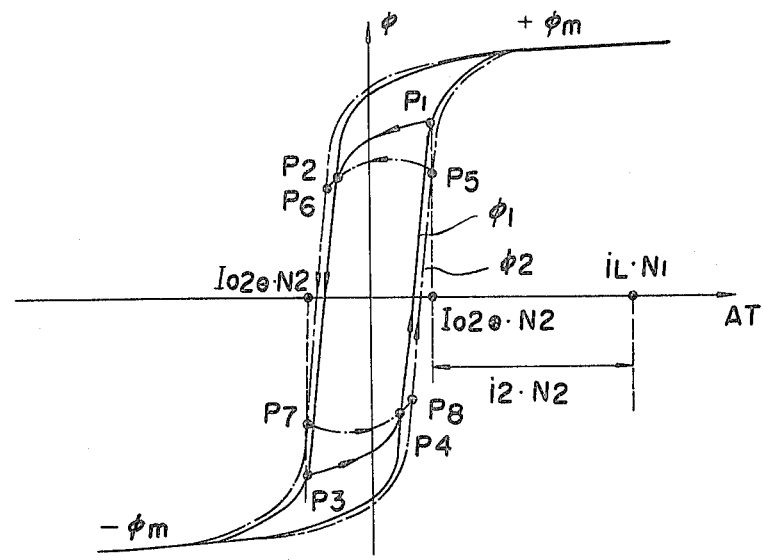
FIGS. 30 to 32 and 38 are diagrams showing the relationship between flux $\phi$ and magnetomotive force AT for illustrating the behavior of core flux.

In FIG. 28, assume that the transistor $Q_1$ is on, the transistor $Q_2$ is off and the current to be detected is absent. In this state, further assume that the flux $\phi_1$ of the core $Cor_1$ is in the vicinity of zero, the flux $\phi_2$ of the core $Cor_2$ is slightly negative, and the common collector potential $V_e$ of the transistors $Q_1$ and $Q_2$ is positive. Then the fluxes $\phi_1$ and $\phi_2$ both rise. When the value of the resistor $R_o$ is small, a voltage approximately equal to $V_{a1}$ is applied across the windings $N_{21}$ and $N_{22}$ in response to turn-on of the transistor $Q_1$. There is a relationship between the voltage applied, the fluxes and the number of turns of the winding, which may be expressed as $V_{s1} \approx N_2(d\phi_1/at + d\phi_2/at)$. This voltage induces voltages across the windings $H_{31}$ and $H_{32}$. The difference between the two voltages induced is applied to the positive input of the amplifier OPA. This amplifier operates as a hysteresis amplifier by resistors $R_1$, $R_2$ and $R_3$. When the difference voltage is low, the hysteresis curve is not inverted and the amplifier output remains negative. This amplifier output is supplied to the base of the transistor $Q_1$ through the resistor $R_4$ and zener diode $ZD_1$ whereby the transistor $Q_1$ remains in the on state. In this state, currents $i_{01}$ and $i_{02}$ for exciting the cores $Cor_1$ and $Cor_2$ flow in the windings $N_{21}$ and $N_{22}$. The current $i_{01}$ is larger than the current $i_{02}$ due to the bias resistor $R_b$. Accordingly, the hysteresis characteristic differs between the two cores as shown in FIG. 30 in which the reference AT denotes an ampere-turn and $\phi_1$ (solid line) and $\phi_2$ (dotted line) indicate characteristics of the cores $Cor_1$ and $Cor_2$ respectively. As seen by the same ampere-turn, the flux of $Cor_2$ moves as if being behind that of $Cor_1$. The abscissa represents ampere-turn AT for the core $Cor_1$ in comprison with the core $Cor_2$ with respect to hysteresis characteristic, indicating the fact that the exciting current for the core $Cor_2$ is always smaller than that for the core $Cor_1$ by an amount equal to part of the exciting current for $Cor_1$ which is bypassed through the bias resistor $R_b$. (Note: This exciting current is grounded through the bias resistor $R_b$ and not through the resistor $R_o$.) In other words, the characteristic of $\phi_2$ follows that of $\phi_1$ with a certain time lag.

The flux $\phi_1$ rises while the transistor $Q_1$ is in the on state, and flux $\phi_2$ follows the flux $\phi_1$. The permeability of $Cor_1$ decreases as the flux $\phi_1$ rises because the relationship between the characteristics of the two fluxes is as shown in FIG. 30. When the flux $\phi_2$ comes in the region where its permeability is larger than the other, the condition $d\phi_2/at > d\phi_1/at$ is established. This means that the voltage across the winding $N_{22}$ is higher than that across the winding $N_{21}$. When the difference between the two voltages exceeds a given value, the difference between the voltages induced across the windings $N_{32}$ and $N_{31}$ exceeds the threshold of the hysteresis amplifier OPA, causing the amplifier output to be inverted from negative to positive in a positive feedback mode. This inverting point is indicated by $P_1$ for the flux $\phi_1$ and by $P_5$ for the flux $\phi_2$ where the ampere-turn of $Cor_1$ is $I_{o2} \oplus \times N_2$. At this moment the voltage $V_e$ is inverted into negative and the hysteresis moves from $P_1$ to $P_2$. The hysteresis at $P_5$ moves into the second quadrant as in the case of $\phi_1$. When $\phi_1$ curve is at $P_2$, $\phi_2$ curve exhibits slightest or no change whereby nearly all the voltage $V_{a2}$ comes on the side of winding $N_{21}$. When the flux $\phi_1$ moves toward $-\phi_m$, the flux $\phi_2$ reaches $P_6$ and falls after the flux $\phi_1$. When the flux $\phi_1$ comes to $P_3$ and $\phi_2$ to $P_7$ where the ampere-turn of the winding $N_{21}$ is $I_{o2} \ominus \times N_2$, the amplifier output is inverted and the flux $\phi_1$ reaches $P_4$ and the flux $\phi_2$ reaches $P_8$ with a small lag. These operations are repeated to cause the transistors $Q_1$ and $Q_2$ to be turned on alternately whereby the circuit (FIG. 28) maintains self-quenching oscillation. FIG. 34 shows waveforms, indicated by the dotted lines, for illustrating operations of the circuit shown in FIG. 28; the abscissa represents time in reference to polarities shown in FIG. 28. FIG. 34(b) is the voltage $V_e$, (c) and (d) fluxes $\phi_1$ and $\phi_2$, (e) the positive input signal to the amplifier OPA, and (f) the voltage drop across the resistor $R_o$. Because the voltage drop $V_o$ is due to the current for exciting the core $Cor_2$, this voltage is zero in terms of dc, which means that the output current $i_L$ of the current source is zero. The voltage $V_o$ is very small in value in terms of ac.

Figure 31:
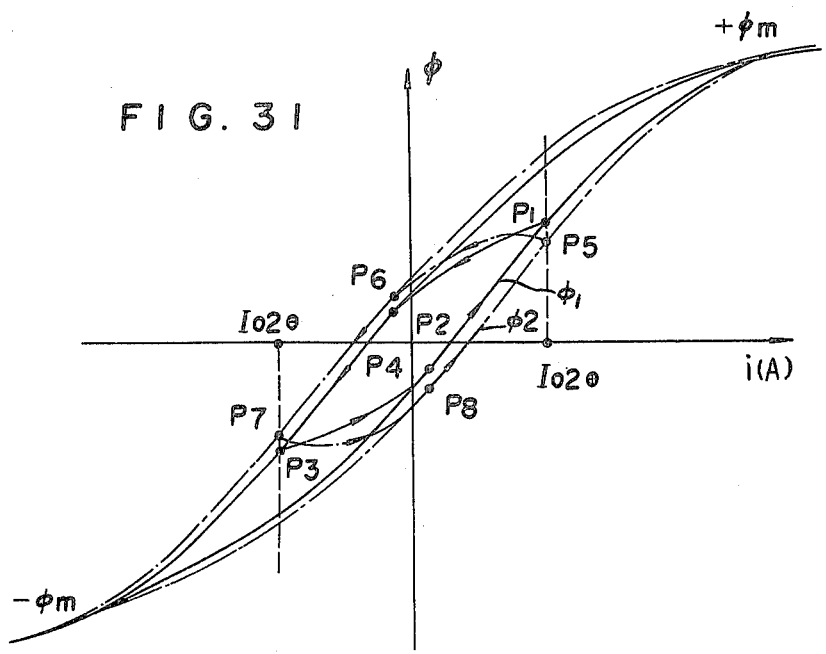
Figure 32:
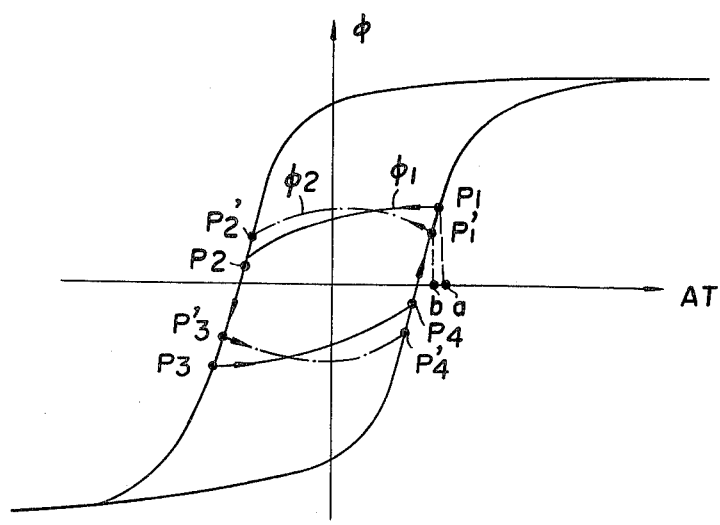
Figure 33:
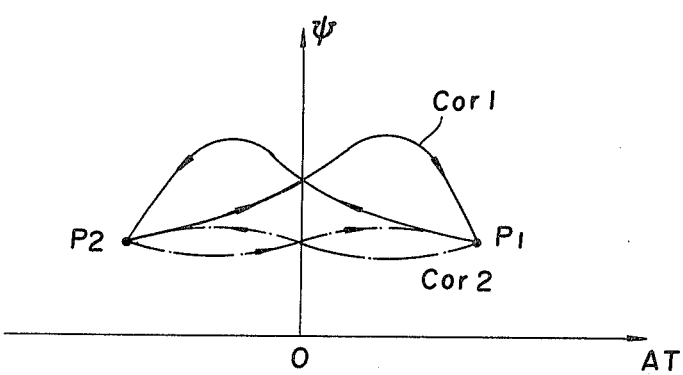
FIG. 33 is a diagram showing an input to an amplifier oscillated in self-quenching mode.

As described above, both the cores operate in a non-saturation state, with the result that ripples due to saturation in the core are eliminated as shown in FIG. 34(f). The invention has been described in reference to operations using cores of rectangular hysteresis. Instead of this type of core, a core which needs a relatively large magnetomotive force or a soft ferrite core may be used. FIG. 31 shows hysteresis characteristics of such cores, which are fundamentally the same as those shown in FIG. 30. FIG. 32 shows another example of core hysteresis in which the flux $\phi_2$ moves slightly behind the flux $\phi_1$. More specifically, the fluxes $\phi_1$ and $\phi_2$ immediately before inversion are present at points $P_1$ and $P_1$, respectively, where the ampere-turns for the fluxes lie at points a and b. The hysteresis behaviors in FIG. 32 are fundamentally the same as those shown in FIGS. 30 and 31.

In FIG. 28, assume the current $i_L$ flows in the direction as indicated, and the voltage $V_e$ is positive. There is the equi-ampere-turn law between the windings $N_{11}$, $N_{12}$ and the windings $N_{21}$, $N_{22}$ because the cores $Cor_1$ and $Cor_2$ are both nonsaturated. Thus a current $i_2$ which satisfies the condition $i_L \times N_1 \approx i_2 \times N_2$ flows in the windings $N_{21}$ and $N_{22}$ in the direction indicated in FIG. 28. By this current, a positive voltage $V_o$ is induced across the resistor $R_o$, in proportion to the current $i_L$. When the current $i_L$ is inverted, the current $i_2$ is also inverted, causing the voltage $V_o$ to become negative. Here the voltage $V_o$ is also proportional to the current $i_L$. The circuit shown in FIG. 28 maintains self-quenching oscillation dependent on the exciting current regardless of whether the current $i_L$ is absent or not. The oscillation cycle with respect to the voltage $V_e$ is 50% duty (positive/negative) when $i_L=0$. While, when $i_L \neq 0$, the duty ratio is off 50% either positively or negatively according to the direction of the current $i_L$ for the following reason. When, in FIG. 28, the current $i_L$ is in the direction indicated, the current $i_2$ flows also in the direction indicated. The voltage drop $R_o, i_2$ serves to lower the positive voltage applied across the windings $N_{21}$ and $N_{22}$, thereby causing the voltage $V_e$ to maintain positive for a prolonged period. While, for the period the voltage $V_e$ is negative, the negative voltage applied across the windings $N_{21}$ and $N_{22}$ serves as if high and the negative voltage period serves as if short. When the current $i_L$ is reversed, the unbalance in the duty ratio is also reversed.

Operations in relation to the polarity of $i_L$ indicated in FIG. 28 are illustrated by using waveforms indicated by the solid lines in FIG. 34; the waveforms shown in the left half correspond to the polarity indicated, and those shown in the right half of the reverse polarity. As shown in FIG. 34, the polarity of the output $V_o$ is inverted according to the polarity of the current $i_L$, and the ripple present is ascribed only to the exciting current component. The spike on the waveform $V_i$ is due to the leakage inductance of the winding. This spike is negligibly small against the output on the side of resistor $R_o$.

As described, the purpose of the bias resistor $R_b$ (FIG. 28) is to delay the flux $\phi_2$ relative to the flux $\phi_1$ on the hysteresis curve. To this effect, a capacitor $C_b$ may be used in series to the resistor $R_b$. In this case, part of the increment in the current for exciting the core $Cor_1$ is bypassed into the capacitor $C_b$ to charge or discharge the capacitor whereby the flux change on the side of $\phi_2$ becomes delayed behind that on the side of $\phi_1$. This means that on the same hysteresis curve the flux $\phi_1$ moves ahead of the flux $\phi_2$ as in the circuit using the resistor $R_b$ only. In practice, however, the use of the capacitor $C_b$ with the resistor $R_b$ is advantageous in view of limiting the ripple in the output $V_o$ which is ascribed to the leakage inductance. More specifically, the spike on the side of core $Cor_1$ is absorbed by the capacitor. Furthermore, by suitably determining the value of capacitor $C_b$ in relation to that of resistor $R_b$, the flux change can be reduced for both $\phi_1$ and $\phi_2$ although the operating frequency increases. In other words, the excitation ripple can be reduced and the output ripple can also be reduced even if cores whose magnetizing force is large are used. The most important reason why the capacitor $C_b$ is used is because the use of resistor $R_b$ only will cause the core $Cor_1$ to be dc-biased when the voltage drop ($R_o \cdot i_2$) is large (i.e., the current $i_L$ is large), with the result that the flux of $Cor_1$ is biased and hence the excitation ripple increases. Whereas the use of capacitor $C_b$ enables the core $Cor_1$ to be excited with only the ac component. In FIG. 34, the aim of this embodiment is to bring the operating curves of $\phi_1$ and $\phi_2$ (indicated by the dotted lines) to be coincident when the current $i_L$ is absent and thereby to maintain the ripple substantially constant irrespective of the value of the current $i_L$.

In FIG. 28, the diodes $D_1$ and $D_2$ function as follows. Assume the current $i_L$ is at the polarity indicated and the current $i_2$ is induced in the windings $N_{21}$ and $N_{22}$ at the polarity indicated. When the transistor $O_2$ is in the on state, the current $i_2$ flows in this transistor from the emitter to the collector. If the current amplification factor in the reverse direction is insufficient in the transistor $O_2$, the current $i_2$ flows in the diode $D_2$. In this state, the current $i_2$ flows from the positive to the negative in the power source $V_{s2}$. When the power source $V_{s2}$ is of one blocked by the diode, the current $i_2$ flows through the resistor $R_{s2}$. The diode $D_1$ and the resistor $R_{s1}$ operate in the same manner as $D_2$ and $R_{s2}$ when the current $i_2$ is inverted.

Figure 29:
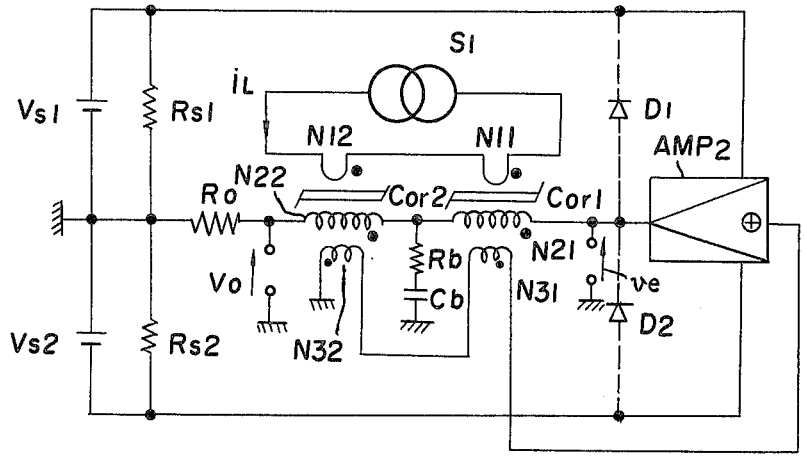

Another embodiment of the invention is shown in FIG. 29 in which the reference AMP denotes a power amplifier comprising transistors $Q_1$ and $Q_2$ and an amplifier OPA shown in FIG. 28. Provided in an IC form, this power amplifier is of push-pull type. The input and output of the amplifier are in phase. The circuit shown in FIG. 29 is operably the same as the one shown in FIG. 28, although the former uses a series of capacitor $C_b$ and resistor $R_b$ instead of the bias resistor $R_b$ used in the latter.

Figure 35:
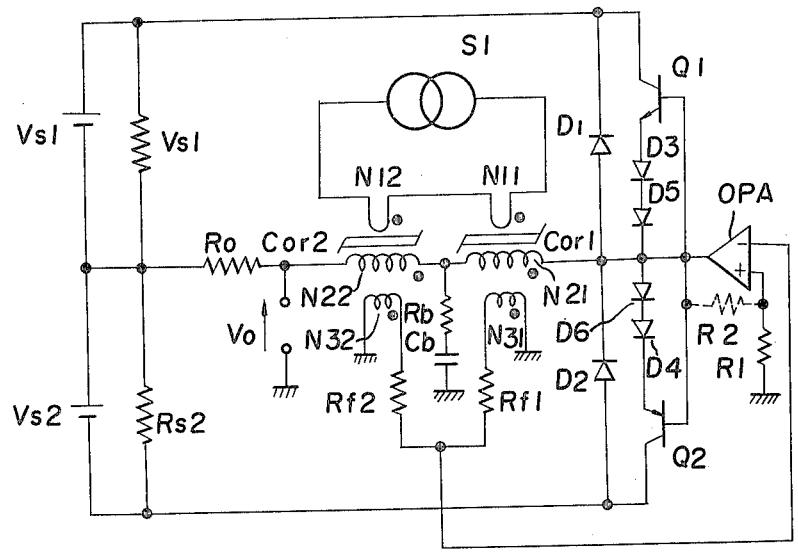

Another embodiment of the invention is shown in FIG. 35 in which the outputs of the windings $N_{31}$ and $N_{32}$ are subtracted from each other through resistors $R_{f1}$ and $R_{f2}$ and then applied to the negative input of the amplifier OPA. The transistors $Q_1$ and $Q_2$ have their bases in common, which is driven directly by the output of the amplifier. Diodes $D_3$ to $D_6$ are used to prevent the transistor $Q_2$ (or $Q_1$) from being turned on when the diode $D_1$ (or $D_2$) turns on while the transistor $Q_1$ (or $Q_2$) is in the state. This circuit is fundamentally the same as those shown in FIGS. 28 and 29 with respect to operation.

Figure 36:
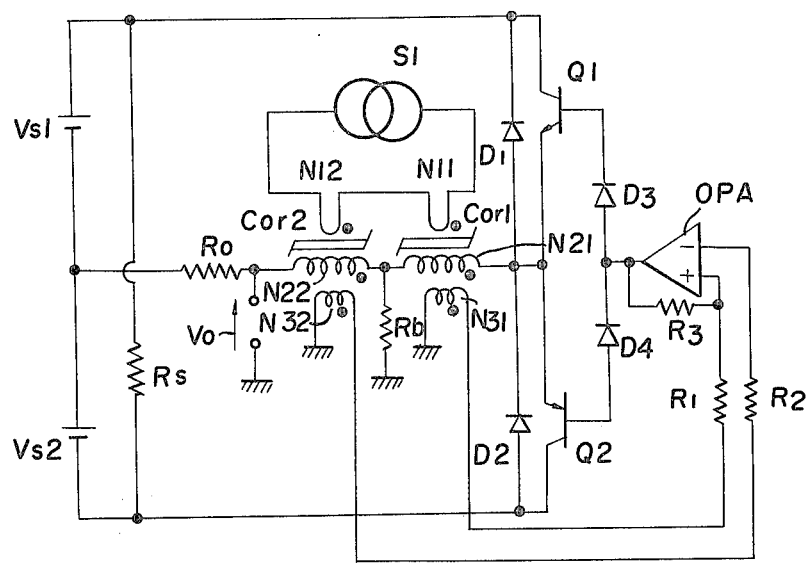

Another embodiment of the invention is shown in FIG. 36 in which the outputs of the windings $N_{31}$ and $N_{32}$ of cores $Cor_1$ and $Cor_2$ are fed back independently to the amplifier OPA, and a resistor $R_s$ is used instead of the foregoing resistors $R_{s1}$ and $R_{s2}$. Also, diodes $D_3$ to $D_6$ (FIG. 35) are used on the side of base of transistors $Q_1$ and $Q_2$. This circuit is operably the same as those shown in FIGS. 28, 29 and 35.

Figure 37:
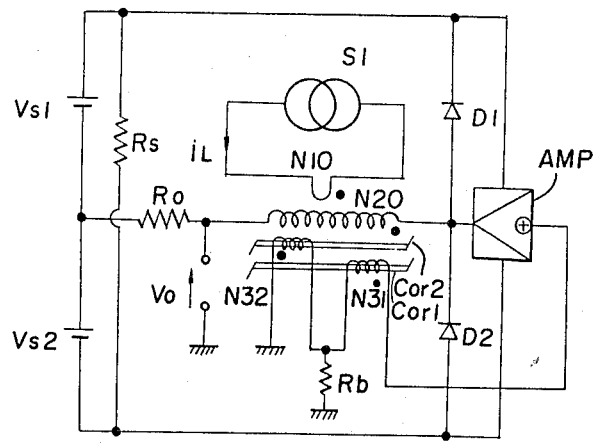

Another embodiment of the invention is shown in FIG. 37 in which a secondary winding $N_{20}$ is wound on the cores $Cor_1$ and $Cor_2$. Control windings $N_{31}$ and $N_{32}$ are reversely serially connected to each other and the output of these windings is fed back to the positive input of the amplifier of hysteresis type to produce self-quenching oscillation. The current $i_L$ from the current source $S_I$ flows in the primary winding $N_{10}$, and the secondary output is induced as a voltage drop across the resistor $R_o$. The resistor $R_b$ serves as a load for the winding $N_{32}$ of $Cor_2$. When a small amount of load current flows due to the voltage induced across the winding $N_{32}$, all the exciting current flowing in the winding $N_{20}$ excites the core $Cor_1$ but the current for exciting the core $Cor_2$ is slightly smaller than that for exciting the core $Cor_1$ by an amount ascribed to the resistor $R_b$ as shown in FIGS. 30 and 31 (or 32). This circuit is operably the same as the one shown in FIG. 28. According to this embodiment, a series of capacitor $C_b$ and resistor $R_b$ may be used instead of the resistor $R_b$.

Figure 38:
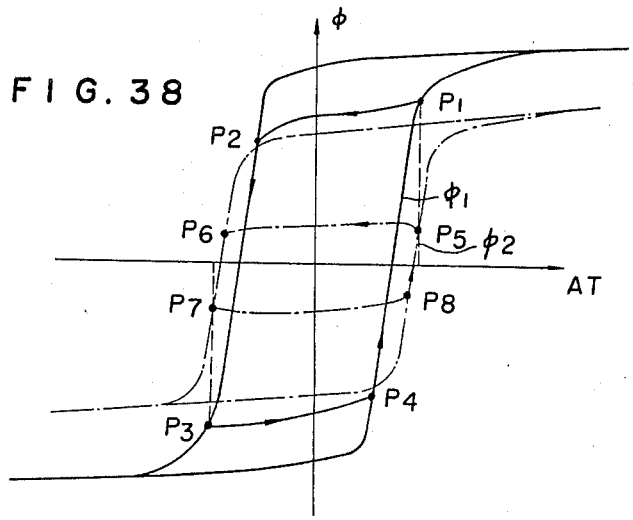

In the above embodiments, the two cores $Cor_1$ and $Cor_2$ are of the same specification. Instead, the two cores may be different in specification as long as the two cores can operate in a nonsauration region as shown in FIGS. 30 to 32 by using a bias resistor $R_b$ or a series of capacitor $C_b$ and resistor $R_b$; the relationship between the magnetomotive force and the fluxes is shown in FIG. 38 in comparison with FIG. 30.

Figure 39:
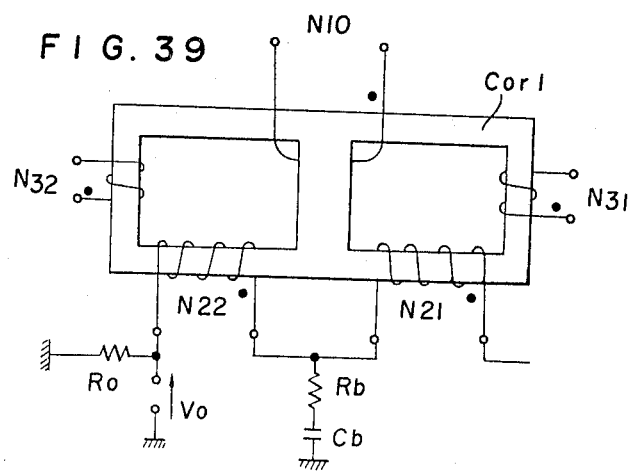

Several embodiments of the invention have been described by using two cores. The invention will be further described by using one core. Referring to FIG. 39, a magnetic circuit comprising one core on which a winding $N_{10}$ carrying the primary current is wound. The core shown therein is composed substantially of two cores symmetrical with respect to the center, which operate as in FIG. 28.

According to the invention, as has been described hereinbefore, an output proportional to the input current can be obtained at a polarity corresponding to the polarity of the input current of either dc or ac. The output obtained accompanies a minimum of ripple as opposed to a considerable amount of ripple component attendant on a prior art dc current transformer device. Furthermore, the operating range of flux can be arbitrarily determined even if the core used sets up a large magnetomotive force when it is excited. This permits the core to be formed of an inexpensive material and, at the same time, the ripple is minimized. The invention has been described in reference to operations of current transformer with the primary winding supplied with current from a current source $S_I$. It is apparent that the invention is applicable to voltage transformers when the number of primary winding is increased and a closed loop is formed between the primary voltage source and the primary winding through a high impedance. Because the transformer device of the invention is operated only from a control dc source, the need for an ac power source is obviated and hence the circuit can be simplified and the cost of the device can be lowered. Furthermore, the main circuit incorporates a preamplifier to enable the feedback voltage or current from the winding $N_3$ to be minimized, with the result that the error is minimized.

Further, the transformer device of the invention can operate at both polarities and hence can be used as a wide band transformer for detecting dc to ac. According to the invention, a plurality of primary current windings may be installed and an output corresponding to the algebraic sum of the primary currents may be detected on principles described hereinbefore.

Figure 40:
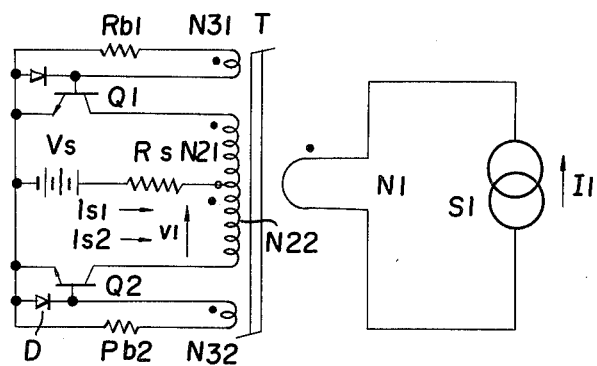

With reference to FIG. 40, there is shown a circuit diagram for illustrating another embodiment of the invention in which the reference $V_s$ denotes a dc source, $Q_1$ and $Q_2$ transistors, $R_{b1}$ and $R_{b2}$ resistors for limiting the base currents of the two transistors, and $R_s$ a resistor connected in series to the dc source $V_s$. The series circuit of dc source $V_s$ and resistor $R_s$ is used as a power source for a saturable reactor (or saturable transformer) which constitutes a self-feedback type oscillator, i.e., the known Royer oscillator. An unknown current $I_1$ is supplied to a load winding $N_1$ (the number of turns: $N_1$) for the oscillator. When the saturable core of the oscillator is of annular construction, the winding $N_1$ is wound on the core through its opening. In this circuit, the numbers of turns of individual windings are determined as $N_{21} = N_{22} >> N_1$, for example, $N_{21} = N_{22} \geq 100 N_1$.

Figure 41:
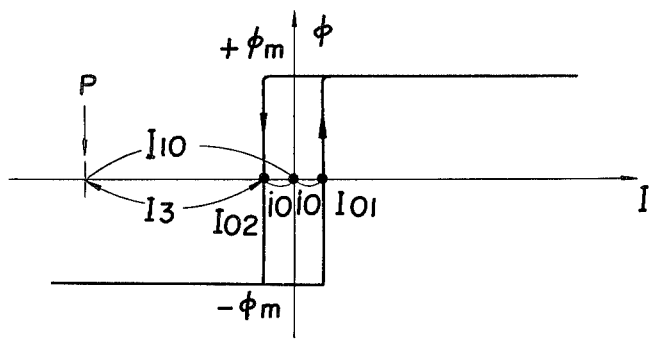
FIGS. 41 and 42 are diagrams for illustrating operations of the circuit shown in FIG. 40.
Figure 42:
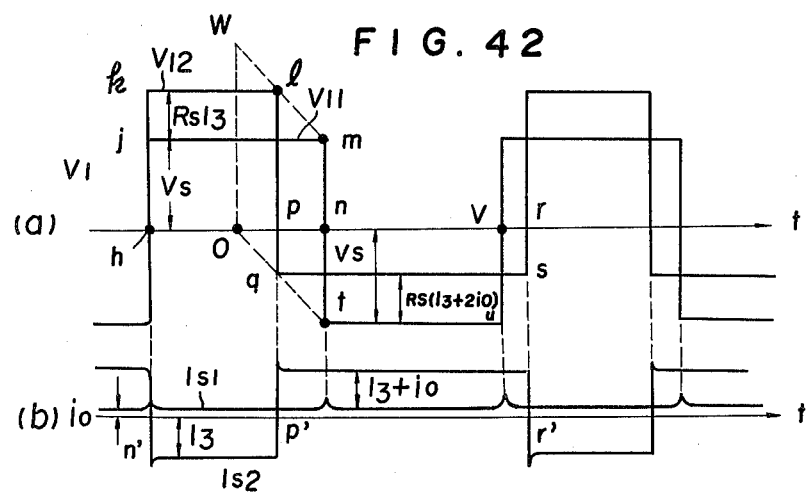

Assume the current $I_1$ is absent. Then the core flux $\phi$ repeats self-feedback, reciprocating between $+\phi_m$ and $-\phi_m$ because the Royer oscillator oscillates without load. FIG. 42 shows waveforms of voltage and current applied to the core; (a) indicates the voltage $V_{11}$ and (b), the current $I_{s1}$ flowing in the resistor $R_s$. As shown, the exciting current $I_{s1}$ increases in a triangular form each time the flux polarity is inverted at saturation points. Such triangular waveform appears because the exciting current rises to its peak at the instant the two transistors turn on concurrently in response to flux polarity inversion, and the peak accompanies slopes on both sides due to increase in the exciting current in response to saturation in the core. FIG. 42 shows waveforms of voltage and current appearing when the current $I_1$ flows in the winding $N_1$; (a) indicates the voltage $V_{12}$ applied to the core, and (b) the current $I_{s2}$ flowing in the resistor $R_s$. As shown, the current and the voltage are in phase although the waveforms are asymmetrical, as opposed to symmetrical waveforms generated in the prior art two-core type dc current transformer device. According to the invention, the output obtained is proportional to the primary current as in the foregoing embodiments. The circuit shown in FIG. 40 operates in the following manner. Assume the current $I_1$ flows from the current source $S_I$ in the direction indicated therein. In this state, the transistor $Q_1$ terminates its conduction, and the transistor $Q_2$ starts conducting. The two transistors are operated in a saturated state or used as a switch as in a Royer oscillator. In this state, the flux $\phi$ moves toward $-\phi_m$ from $+\phi_m$. The transformer T operates in such manner that a voltage is applied across the winding from its starting end indicated by the dot whereby the flux moves downward. When the current $I_1$ flows in the winding $N_1$ at the instant the transistor $Q_2$ starts conducting, a current is induced on the secondary side in order to compensate for the flux change caused by the current $I_1$. This secondary current flows in value satisfying the condition that the product of ampere-turns is equal on the primary and secondary sides of the transformer and through the resistor $R_s$ in the direction toward the power source $V_s$. In the transistor $Q_2$ the current flows from the base and the emitter to the collector. A diode is connected between the base and emitter of the transistor to allow current flow from the emitter to the base. This diode limits the reverse voltage across the base and emitter to a value within the order of diode drop. The secondary current for compensating for the primary current passes through the transistor from the emitter to the collector. In FIG. 41 the secondary current $I_{10}$ ($=N_1/N_{22}I_1$) is shown at point P. Current $I_3$ being the difference between the current $I_{10}$ and the current $i_o$ which excites the core flows as current $I_{s2}$ in the resistor $R_s$ opposite to the direction indicated by the arrow mark in FIG. 40. FIG. 42(b) shows the waveform of the current $I_{s2}$ for the period from h' to p'. In this state, the voltage $V_{12}$ which is the sum of the power source voltage $V_s$ and the voltage drop across the resistor $R_s$ is applied across the winding $N_{22}$. The core flux change from $+\phi_m$ to $-\phi_m$ is constant whether the current $I_1$ is present or absent in the winding $N_1$. In this operation, the area h-k-l-p is equal to the area h-j-m-n with reference to the voltages $V_{12}$ and $V_{11}$ as shown in FIG. 42(a). As apparent from FIG. 42(a), the voltage applied to the winding $N_{22}$ is high and the time taken for the flux to reach $-\phi_m$ from $+\phi_m$ is short while the current $I_1$ is present in the winding $N_1$.

When the flux reaches $-\phi_m$, the core is saturated and the hysteresis curve is directed to the $\phi$ axis or the inductance component changes rapidly with time, causing a reverse voltage to be induced across the winding $N_{31}$. As a result, the transistor $Q_1$ starts conducting, the base current in the transistor $Q_2$ becomes absent, the transistor $Q_1$ turns on, and the transistor $Q_2$ turns off. When the transistor $Q_1$ turns on, the secondary current flows in the transistor $Q_1$ from the collector to the emitter through the winding $N_{21}$ (the number of turns: $N_{21} = N_{22}$) by way of the power source and the resistor $R_2$. In other words, the direction of the secondary current is reversed. The value of the current $I_{10}$ (FIG. 41) remains the same as long as the primary current in the winding $N_1$ is constant. Thus $I_{10}=I_3+i_o$. In this state, because the current exciting the core is inverted, the current $I_{10}+i_o$ flows in the resistor $R_s$ in the direction the same as the current $I_{s2}$ (FIG. 40). The waveform in this operation mode is shown in FIG. 42(b), for the period p'-r'. In this state, the voltage applied across the winding $N_{21}$ has its positive side at the terminating end of the winding and is opposite to the h-p direction. This voltage is the difference between the power source voltage $V_s$ and the voltage drop across the resistor $R_s$. Accordingly, a voltage lower than under no load is applied across the winding $N_{21}$ for a longer period. This operating state conforms to the foregoing principle that the area p-q-s-r is equal to the area n-t-u-v (=h-j-m-n) or the product of voltage and time is constant regardless of the polarity of the voltage applied across the winding $N_{21}$. In this state, $|V_{12}|=|V_s-R_s(I_3+2i_o)|$. Then the flux $\phi$ moves to $+\phi_m$, causing the transistor $O_2$ to turn on and the transistor $Q_1$ to turn off. The circuit repeats a series of the above operations.

As described above, the product of voltage and time is constant regardless of whether the primary current (load) is present or not. Therefore, as shown in FIG. 42, the point l moves along the line between points w and m when seen by the point h where the rises of the two voltages are coincident with each other, and the movement of the point l follows changes in the primary current. At the same time, the flux $\phi$ moves along the line between the points o and t. Waveforms in FIG. 42 are plotted with the exciting current component neglected; the point o is located at the center between the points h and n, and the point w is 2 $V_s$ above the point o being perpendicular to the time axis.

As described above, the current flowing through the resistor $R_s$ is constant in absolute value conforming to the equi-amper-turn law, provided the exciting current is negligible, even when the voltages on the two secondary sides become quantitatively asymmetrical with each other and the frequency changes as a result of load change from the state $I_1=0$ to the state $I_1\neq 0$. Thus, by measuring the voltage across the resistor $R_s$, the current flowing in the winding $N_1$ can be measured. For example, when the voltage across the resistor $R_s$ is rectified, a dc voltage proportional to the primary current can be obtained.

Figure 43:
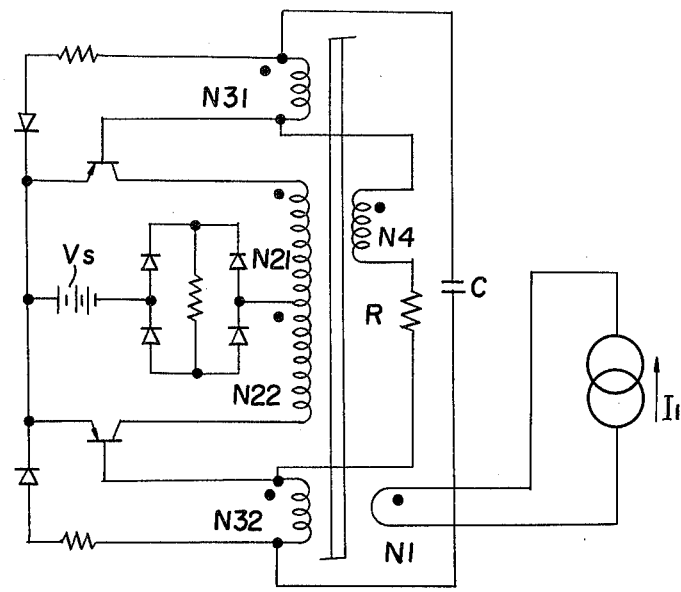

Although a transformer device using a Royer oscillator has been described, the invention is not limited to this example. Instead of the Royer oscillator, an oscillator using a self-feedback type saturable reactor may be used in which the core is kept unsaturated by automatically alternating the excitation polarity. FIG. 43 shows a transformer circuit using the known cadri oscillator instead of the Royer oscillator. In FIG. 43, a full-wave rectifier is used with the resistor $R_s$ on the negative side of the power source $V_s$. This oscillator comprises a resistor R, a capacitor C and a control winding $N_4$ and is used for an output of higher frequency than available with the Royer oscillator. When the core is saturated at a cycle lower than the frequency which depends on the constants of resistor R, capacitor C and winding $N_4$, the oscillator of FIG. 43 operates as the Royer oscillator in which the core is operated in an unsaturated state by self-feedback effect.

Figure 44:
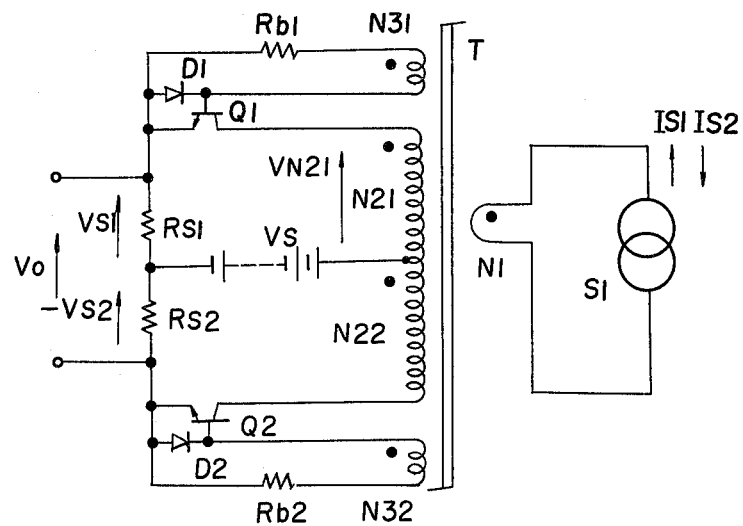

FIG. 44 shows another embodiment of the invention in which resistors $R_{s1}$ and $R_{s2}$ are used in place of the resistor $R_s$ (FIG. 43) and inserted in positive and negative secondary branch circuits. The composite voltage drop $(V_{s1}-V_{s2})$ across these resistors is the output of the device. This embodiment makes it possible to detect the value of the primary current, as well as the polarity thereof. In other words, the transformer device shown in FIG. 44 can detect the primary current of dc to ac. More specifically, when the current $I_{s1}$ flows from the current source $S_J$ in the direction indicated, this current passes through the primary winding $N_1$ from its starting end, causing a secondary current to flow out of the secondary winding from its starting end at the same ampere-turn. When the transistor $Q_1$ is in the on state, the voltage drop $V_{s1}$ across the resistor $R_{s1}$ stands at the polarity indicated. When the transistor $Q_2$ is in the on state, the voltage drop $V_{s2}$ across the resistor $R_{s2}$ stands at the polarity indicated. When the secondary current $I_{s2}$ flows in the direction indicated, this current flows in the secondary winding from its terminating end, with the result that the voltage drops across the resistors $R_{s1}$ and $R_{s2}$ are inverted. This means that the composite voltage drop $V_o$ is the sum of the two voltage drops $V_{s1}$ and $V_{s2}$ and is proportional to the primary current flowing in the winding $N_1$. FIG. 45 shows waveforms for illustrating the relationship between the primary current and voltages induced on the secondary side. (Note: The waveforms are plotted against time as parameter, with the exciting current neglected.) FIG. 45 signifies the fact that the voltage $V_o$ changes its polarity with the polarity of the primary current. In the prior art two-core dc current transformer device, the voltage across the resistor $R_s$ is rectified into a value proportional to the primary current. This circuit, however, is incapable of detecting the polarity of the primary current only by detecting the waveform of the voltage across the resistor $R_s$. Whereas, according to the embodiment of the invention shown in FIG. 44, one core is used instead of two, the need for the rectifier means is obviated, and the polarity of the primary current is identified by detecting the waveform of the voltage across the resistor $(R_{s1}+R_{s2})$. The current transformer device of the invention, therefore, can detect dc and ac as well, together with the polarity thereof.

FIG. 46 is a circuit diagram showing another embodiment of the invention capable of detecting a unipolar primary current. Referring to FIG. 43, when the primary current is of positive current $I_{s1}$ only, the current flowing in the transistor $Q_1$ and resistor $R_{s1}$ is positive, and the opposite current flows in the transistor $Q_2$ and diode $D_2$. In this circuit, therefore, the need for transistor $Q_2$, feedback winding $N_{32}$ and diode $D_2$ is obviated. In other words, the excitation of the core in the negative direction is done by the current to be measured and hence the transistor $Q_2$ can be omitted. An example of this circuit is shown in FIG. 46.

FIG. 47 shows another embodiment of the invention comprising a circuit 100 capable of differentially deriving an output from the voltage developed across resistors $R_{s1}$ and $R_{s2}$ (FIGS. 44, 45 and 48) by the use of a differential adder 200. The output is obtained in reference to a common power terminal potential against the dc source $V_s$.

FIG. 48 shows another embodiment of the invention capable of detecting a unipolar primary current. This embodiment is an improvement on the one shown in FIG. 46 which involves error ascribed to the current in the windings $H_{31}$ and $N_{32}$ for driving the base of the transistor. The circuit in FIG. 48 comprises a main semiconductor switch which is turned on and off by a small current through an amplifier whose current amplification factor is high. The amplifier may be constituted, for example, of a field effect transistor or a multi-stage transistor amplifier. In this embodiment, a field effect transistor $Q_3$ is used as the amplifier.

Series resistors $R_{s1}$ and $R_{s2}$ are connected in series to the secondary windings $N_{21}$ and $N_{22}$ to preclude error ascribed to the base current of the main semiconductor switch $Q_1$. (The error occurs if the base current is supplied not through the winding $N_{21}$ but from the dc source $V_s$ and hence the resistor $R_{s1}$ is connected to the emitter side.)

FIG. 49 shows another embodiment of the invention in which the circuit (a) is for bipolar application, and (b) for unipolar application. As described, in the circuits shown in FIGS. 40, 43, 44, 46, 47 and 48, the core is excited alternately by positive and negative windings $N_{21}$ and $N_{22}$. Whereas, according to this embodiment, one exciting coil (secondary winding) $N_2$ is used, the dc source $V_s$ is divided into two dc sources $V_{s1}$ and $V_{s2}$, two semiconductor switches are serially connected to each other, and the exciting winding $N_2$ is connected across the junction between the two semiconductor switches and the junction between the two dc sources. There are provided positive feedback windings $N_{31}$ and $N_{32}$ so that the transistor $O_1$ and diode $D_1$, and the transistor $Q_2$ and diode $D_2$ are alternately turned on and off. In this circuit, when the current $I_1$ to be measured is positive, the oscillation voltage $V_{N2}$ assumes a waveform shown in FIG. 50 (a)(i), and the two transistor currents $I_{Q1}$ and $I_{Q2}$ assume waveforms (a)(ii) and (a)(iii) respectively (where $I_{Q2}$ is negative). The current $I_o$ flowing in the secondary winding $N_2$ is the difference between the two transistor currents, i.e., $I_{Q1} - I_{Q2}$, in a dc waveform indicated by (a)(iv). There is the relationship of equi-ampere-turn between the cirrent $I_o$ and the primary current to be measured. This is equivalent to the operation in FIG. 40 in which the composite value of two currents flowing in the windings $N_{21}$ and $N_{22}$ flows in one exciting winding $N_2$. While, when the primary current $I_1$ is negative, the oscillation voltage $V_{N2}$ and transistor currents $I_{Q1}$ and $I_{Q2}$ and the current $I_o$ in the exciting winding $N_2$ assume waveforms shown in FIG. 50(b). As shown in FIG. 50, the exciting dc current $I_o$ flows opposite to the dc field produced by the primary current $I_1$. The dc voltage needed to allow the dc current $I_o$ to flow depends upon variations in the turn-on time ratio of the two transistor switches.

This embodiment is readily applicable to a dc-ac converter circuit using semiconductor switches in which, for example, a saturable transformer is installed in the ac circuit, and the semiconductor switch comprised in the dc-ac converter circuit is driven by the voltage from the saturable transformer, thus forming a self-oscillator (or self-quenching inverter) whereby the saturable transformer core is magnetized by the primary current. The resultant secondary current is detected by a suitable means and thereby the primary current is measured.

Figure 51:
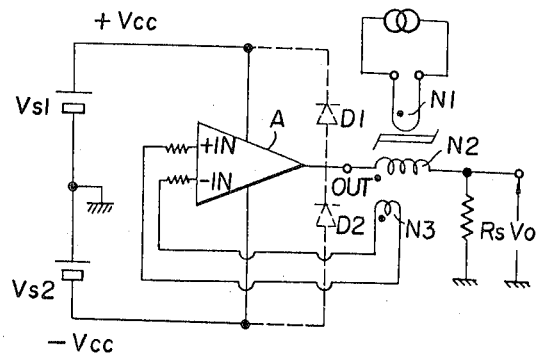

According to this embodiment, a power amplifier may be used and a saturable transformer is installed in the output circuit of the amplifier. The output of the transformer is positively fed back to the amplifier whereby a self-quenching oscillator is formed. Thereafter the primary current is detected in the same manner as described above. The power amplifier may be constituted, for example, of an IC amplifier, e.g., a power IC for audio-amplifier. An example of this circuit is shown in FIG. 51 in which a direct-coupling type audio-amplifier may be used. The semiconductor switch circuit used in this embodiment is the same as the one shown in FIG. 49. Generally the individual semiconductor switch has a reverse-polarity direct-coupling driver circuit, called phase inverter, and a preamplifier. Thus, by connecting the feedback winding $N_3$ of the saturable transformer to the input of the amplifier, the circuit of this embodiment operates in the same manner as the one shown in FIG. 49. In FIG. 51, when the peak reverse current value of the semiconductor switch (i.e., semiconductor power amplifier element) of the power amplifier A is insufficient, it is necessary to use external diodes $D_1$ and $D_2$ as indicated by the dotted line.

Figure 52:
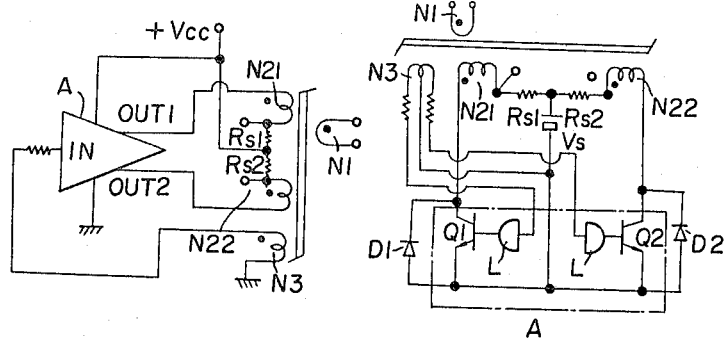

FIG. 52 shows another embodiment of the invention comprising an IC push-pull semiconductor switch circuit corresponding to the one shown FIG. 44. FIG. 52(a) shows a circuit comprising an IC push-pull audio-amplifier connected to an output transformer. FIG. 52(b) shows a circuit comprising an IC with logic elements L (e.g., AND, NAND, OR and NOR gate) and transistors.

Figure 53:
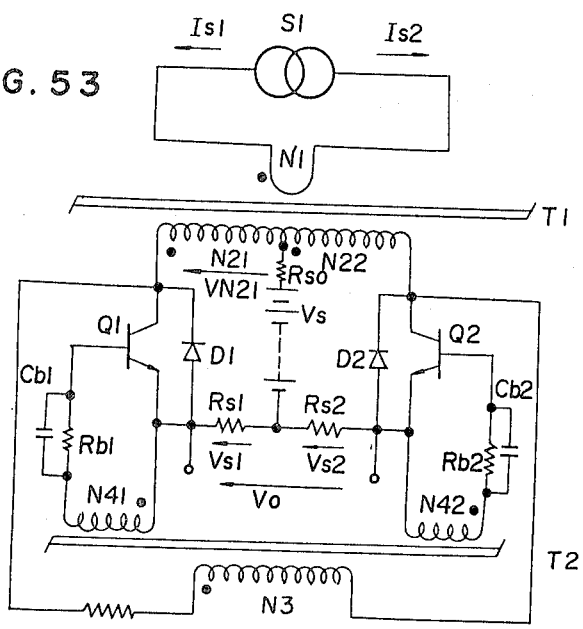

FIG. 53 shows another embodiment of the invention in which the reference $V_s$ denotes a dc power source, $Q_1$ and $Q_2$ NPH transistors, $T_1$ and $T_2$ saturable cores of rectangular hysteresis type, $R_{s1}$ and $R_{s2}$ resistors for obtaining an output proportional to the current to be detected, $D_1$ and $D_2$ diodes, $C_{b1}$ and $C_{b2}$ capacitors, $R_{b1}$ and $R_{b2}$ resistors for limiting the base current of the transistors, $N_{21}$ and $N_{22}$ secondary windings wound on the core 1, the numbers of turns being $N_{21}$ and $N_{22}$ respectively where $N_{21}=N_{22}$, and $N_{41}$ and $N_{42}$ secondary windings for driving the transistors $Q_1$ and $Q_2$, the number of turns being normally smaller than that of the primary winding $N_3$ of the core $T_2$. The reference $R_{so}$ indicates a resistor connected in series to the power source $V_s$, $Z_1$ a resistor connected in series to the primary winding $N_3$, and $N_1$ a primary winding which corresponds to the load winding for the dc current transformer device of this embodiment. When the core $T_1$ is of annular construction, the winding $N_1$ is wound on the core through the core opening several turns. This circuit, with resistors $R_{s0}$, $R_{s1}$ and $R_{s2}$ removed, operates as the known 2-core type self-feedback self-exciting inverter. The output of this device is available across the resistors $R_{s1}$ and $R_{s2}$ or across the resistor $R_{s0}$.

Figure 53A:
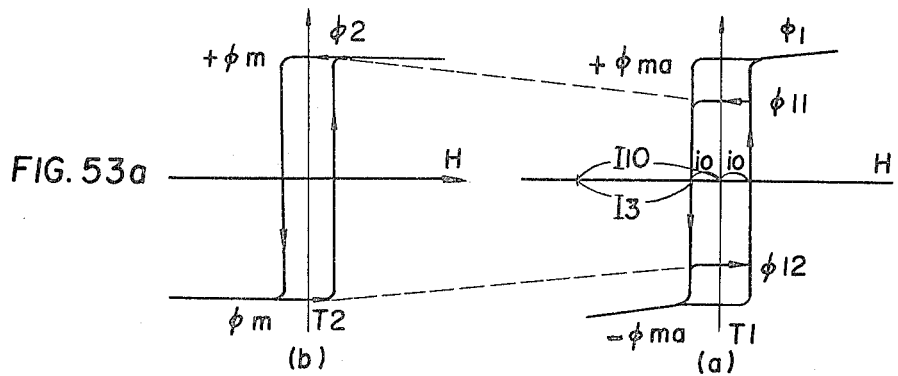
FIG. 53(a) is a diagram showing magnetization characteristics of cores.

In this circuit, assume that the resistor $R_{sO}$ is short-circuited. According to this embodiment, the numbers of turns of $N_{21}$ and $N_{22}$ are determined to be $N_{21}=N_{22}>>N_1$ (for example, $N_{22}=N_{22}\geq 100N_1$), and the core $T_1$ is used in a state of locked magnetization as in the known dc current transformer device. When neither the primary current $I_{s1}$ to flow in the primary winding $N_1$ from its starting end nor the primary current $I_{s2}$ to flow opposite to $I_{s1}$ is present, the flux $\phi_2$ of the core of transformer $T_2$ reciprocates between $+\phi_m$ and $-\phi_m$ as shown in FIG. 53a(b) due to the voltage induced by the transformer $T_1$ whereby the transistors $Q_1$ and $Q_2$ alternately repeat on and off, thus effecting self-exciting oscillation. In this state, the flux $\phi_1$ of the transformer $T_1$ reciprocates between $\phi_{11}$ and $\phi_{12}$ before saturation points as shown in FIG. 53a(a). A voltage with its negative polarity on the side indicated by the dot in FIG. 53 is applied across the windings $N_{21}$ and $N_{22}$ as a result of switching of transistor $G_1$. (Note: the dot indicates the starting end of each winding.) This voltage, nearly equal to $2V_s$ with the core exciting component neglected, is applied across the winding $N_3$ of core $T_2$ through the resistor Z, causing voltages to be induced across the windings $N_{41}$ and $N_{42}$ in the directions of turning $Q_1$ on and $Q_2$ off respectively. When the core $T_2$ is saturated, the voltages induced across the secondary windings $N_{41}$ and $N_{42}$ vanish and the transistor $Q_1$ becomes turned off. On the other hand, the hysteresis curve of the core $T_2$ is directed to the $\phi_2$ axis or a reverse voltage is induced across each winding of $T_2$ by the effect of coil inductance. This voltage causes the transistor $Q_2$ to turn on and the transistor $Q_1$ to turn off. As a result, the core $T_2$ departs from saturation and is excited in the opposite direction, and the core $T_1$ is excited in the opposite direction accordingly. The above operations are repeated whereby self-exciting oscillation is maintained. The purpose of the capacitors $C_{b1}$ and $C_{b2}$ is to expedite on-off switching in the transistors $Q_1$ and $Q_2$. The current for exciting the cores $T_1$ and $T_2$ and the current induced in the secondary windings $N_{21}$ and $N_{22}$ by the base current of $Q_1$ and $Q_2$ flow in the resistors $R_{s1}$ and $R_{s2}$. These current can be limited to a substantially negligible value when cores whose coercive force is small and transistors whose amplification factor is large are used. The purpose of the resistor $Z_1$ is to hamper the current in the primary winding $N_3$ from being rapidly increased when the core $T_2$ is becoming saturated. As the resistor $Z_1$ an air-core reactor may be used to limit the increase in the current in the primary winding $N_3$ and thus to limit the current flowing in the resistors $R_{s1}$ and $R_{s2}$ through the secondary windings $N_{21}$ and $N_{22}$. As shown in FIG. 53a(a), the flux of core $T_1$ reciprocates between nonsaturated points $\phi_{11}$ and $\phi_{12}$ in the following manner. Any differences in the velocity of flux $\phi_1$ to move from $\phi_{12}$ to $\phi_{11}$ and from $\phi_{11}$ to $\phi_{12}$, the difference being due to the difference in $V_{CE}$ between transistors $Q_1$ and $Q_2$ or unbalance in the current between the secondary windings $N_{21}$ and $N_{22}$, is compensated for by the difference in the velocity of flux $\phi_2$ to move between $+\phi_m$ and $-\phi_m$. However, when the flux $\phi_{11}$ reaches its saturation point $+\phi_{ma}$ or the flux $\phi_{12}$ does its saturation $-\phi_{ma}$ due to an unbalance factor such as the difference in the base current between transistors $Q_1$ and $Q_2$, the voltage across the primary winding on the side of core $T_2$ vanishes, causing the two transistors to be operated in the reverse on-off mode, whereby self-exciting oscillation is maintained. According to the invention, it is desirable that the core $T_1$ be large in size and the core $T_2$ be small in size. With use of these cores under well adjusted unbalance factors, the flux $\phi_1$ reciprocates between the nonsaturated points $\phi_{11}$ and $\phi_{12}$. In FIG. 59, the reference $i'_o$ denotes a current induced in the secondary windings $N_{21}$ and $N_{22}$ due to the current exciting the two cores and the base drive current for the two transistors. In FIG. 59(a), the dotted line shows a waveform of voltage induced or applied across the secondary winding $N_{21}$ with its positive side indicated by the dot in FIG. 53; (b) is a waveform of voltage across the resistor $R_{s1}$ with the polarity indicated by the arrow mark in FIG. 53; (c) is a waveform of voltage across the resistor $R_{s2}$ with the polarity indicated; (d) is a waveform of voltage $V_o$ which represents the sum of the voltages $V_{s1}$ and $V_{s2}$; (e) is a waveform of flux $\phi_2$ of core $T_2$; and (f) is a waveform of current $I_{s1}$ or $I_{s2}$.

When the circuit (FIG. 53) is in the state of oscillation without load, only the exciting current $i'_o$ flows through the resistor $R_{s1}$ causing a voltage $V_{s1}$ when the transistor $Q_1$ is in the on state, or through the resistor $R_{s2}$ causing a voltage $V_{s2}$ opposite in polarity to $V_{s1}$ when the transistor $Q_2$ is in the on state. The waveforms of these voltages are shown in FIG. 59(b), (c) and (d). The current $i'_o$ slightly increases at switching of the voltage because the current in the primary winding $N_3$ tends to increase due to saturation in the core $T_2$ at inversion of the voltage.

Assume a current to be measured flows in the primary winding $N_1$. When a current $I_{s1}$ flows from the current source $S_f$ in the direction indicated in FIG. 53, the transistor $Q_1$ terminates conduction and the transistor $Q_2$ starts conduction. In this state the flux $\phi_2$ starts falling from $+\phi_m$ and the flux $\phi_1$ also starts falling from $\phi_{11}$. Because the core $T_1$ is in a nonsaturated state, the current $I_{s1}$ flowing in the primary winding $N_1$ induces a current $I_{10}$ in the secondary winding $N_{22}$ to preclude the effect of the primary current. The current $I_{10}$ flows in the secondary winding $N_{22}$ from its starting end because the current $I_{s1}$ flows in the primary winding from its starting end. The current $I_{10}$ flows by way of: $N_{22}$—$V_s$—$R_{s2}$—$Q_2$—$N_{22}$, satisfying the condition: $N_1 \times I_{s1} = N_{22}(=N_{21}) \times I_{10}$. In the transistor $Q_2$ the current flows from the emitter to the collector. If the amplification factor of the transistor $Q_2$ is not enough to allow the current $I_{10}$ to flow, the current passes through the diode $D_2$. When the transistor $Q_2$ is provided with a diode for protecting the transistor with the base used as the cathode and with the emitter used as the anode, the current flows by way of: the diode—base of $Q_2$—collector of $Q_2$. In the meantime, the sum of the power source voltage $V_s$ and the voltage drop $V_{s2}$ across the resistor $R_{s2}$ is applied across the secondary winding $N_{22}$ (with the voltage drop across the transistor or the diode neglected). A voltage double the value $(V_s+V_{s2})$ is applied across the primary winding $N_3$ of core $T_2$ through the resistor $Z_1$. The waveforms of these voltages are shown in FIG. 59 in the interval from h to p. The flux $\phi_2$ of core $T_2$ reaches $-\phi_m$ at the point p. Because the change in the flux in the core $T_1$ remains constant from $\phi_{11}$ to $\phi_{12}$, the product of the corresponding voltage and time is constant, or the area h-j-m-n is equal to the area h-k-l-p in FIG. 59. In other words, the point 1 moves along the line between points m and w. (The point w is $2V_s$ above the center o between points h and n.) When the flux $\phi_2$ reaches $-\phi_m$, the core $T_2$ is saturated whereby the flux polarity is inverted as in the operation without load, causing the transistor $Q_1$ to be turned on and the transistor $Q_2$ to be turned off. At this moment, the flux $\phi_2$ rises from $-\phi_m$ toward $+\phi_m$ and the flux $\phi_1$ from $\phi_{12}$ to $\phi_{11}$, and the secondary current starts flowing by way of $N_{21}$—$Q_1$—$R_{s1}$—$V_s$—$N_{21}$. A voltage is developed across the resistor $R_{s1}$ in the direction indicated in FIG. 53. This voltage is proportional to the primary current $I_{s1}$ with the core exciting current component neglected. The voltage applied across the secondary winding $N_{21}$ is equal to the difference between the voltage $V_s$ and the voltage drop across the resistor $R_{s1}$, or $V_s - V_{s1}$, where the voltage drop across the transistor $Q_1$ is neglected. The waveforms of these voltages are shown in FIG. 59 in the time interval from p to r. As described above, the area p-q-s-r is equal to the area n-t-u-v (=h-j-m-n), and the point q moves along the segment o-t.

Then the flux $\phi_2$ rises to $+\phi_m$ again and a series of the foregoin operations start again. According to the invention, therefore, the voltage drop obtained across the resistors $R_{s1}$ and $R_{s2}$ is proportional to the primary current (with the exciting current component neglected), or the value of unknown current (primary current) can be measured by measuring the voltage $V_o$ across the two resistors. This voltage $V_o$ is indicated by the solid line in FIG 59(d) with the current $i'_o$ neglected.

Figure 54:
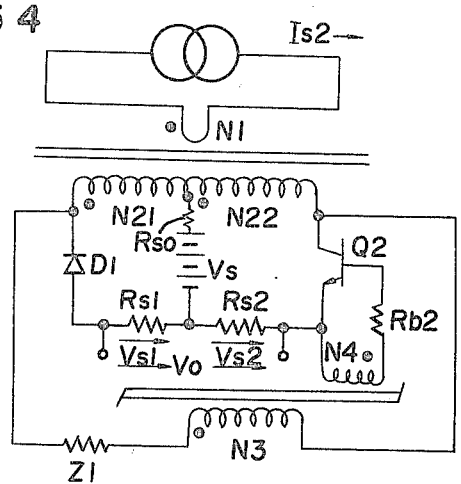

As described above, when the primary current is inverted, the secondary current is inverted accordingly as indicated by waveforms in FIG. 60 in which the waveforms shown in the right half are of inverted current on the primary and secondary sides. The output voltage $V_o$ across the resistors $R_{s1}$ and $R_{s2}$ is also inverted as the primary current is inverted. In other words, with this circuit, not only the value of the primary current but also the polarity thereof can be detected. Needless to say, the circuit can be simplified when the polarity of the primary current is known. An example of this circuit is shown in FIG. 54 in which when the primary current $I_{s1}$ is absent and the flux $\phi_2$ is located at $+\phi_m$ (FIG. 53a), no voltage is induced across the primary winding $N_3$ and the transistor $Q_2$ remains in the off state. Accordingly, the other circuit elements remain inoperative. Assume the resistor $R_s$ is zero in value. In this state, when the primary current $I_{s2}$ flows, a current $I_{10}$ is induced in the secondary winding $N_{21}$ according to the equi-ampere-turn law. This current flows by way of $N_{21}$—$V_S$—$R_{s1}$—$D_1$—$N_{21}$, causing a voltage drop to be developed across the resistor $R_{s1}$ proportional to the primary current. In this state, the voltage across the secondary winding $N_{21}$ is equal to the difference between the power source voltage $V_s$ and the voltage drop across the resistor $R_{s1}$ (i.e., $V_s - R_{v1}$), with the voltage drop across the diode neglected. When the change in the flux $\phi_2$ due to this secondary voltage reaches $-\phi_m$, the voltage induced across the winding $N_{42}$ causes the transistor $Q_2$ to be turned on as in the circuit shown in FIG. 54. As a result, the polarity is inverted and a secondary current canceling the current $I_{s2}$ flows by way of $V_s$—$N_{22}$—$Q_2$—$R_{s2}$—$V_s$ and a voltage $V_{s2}$ is developed across the resistor $R_{s2}$ proportional to the primary current. When the flux $\phi_2$ reaches $+\phi_m$ again, the transistor $Q_2$ turns off and another cycle of operations starts as in the circuit shown in FIG. 53. The operating modes are nearly the same as those shown in FIG. 59, excepting no oscillation takes place when the primary current is absent in the winding $N_1$ and the current flowing in the resistor $R_{s1}$ is proportional to the primary current as in the known ac current transformer. To invert the current $I_{s2}$, it is necessary to change the positions of transistor $Q_2$ and diode $D_1$. Briefly, according to the invention, a circuit comprising one transistor, one diode and one ocre can be operated as a dc current transformer.

Another example of circuit capable of detecting an unknown dc current will be described below. In this example, a resistor $R_{so}$ is used instead of the resistors $R_{s1}$ and $R_{s2}$ (FIGS. 53 and 54). As described, an ac current flows in the resistor $R_{so}$ proportional to the primary current. The resultant voltage across the resistor $R_{so}$ is rectified into an output $V_o$. In this circuit, the resistor $R_{so}$ may be located at the position shown in FIGS. 53 and 54 by way of a diode bridge. FIG. 60(f) shows the waveform of the voltage across the resistor $R_{so}$.

Figure 55:
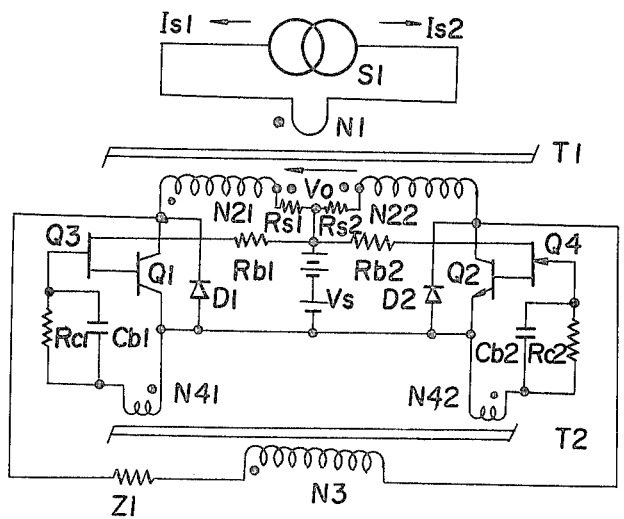

FIG. 55 shows another circuit for illustrating improvements on the circuit shown in FIG. 53. In the circuit shown in FIG. 53, the currents in the windings $N_{41}$ and $M_{42}$ for driving the bases of transistors $Q_1$ and $Q_2$ can be a source of error in the measurement of primary current. To solve this problem, the circuit shown in FIG. 55 uses amplifiers whose current amplification factor is high, in order to permit the transistors to be turned on and off by a small current. The amplifier is, for example, of field effect transistor or multistage transistor amplifier. The circuit in FIG. 55 uses field effect transistors as the amplifiers. The base current for the transistors is supplied directly from the power source $V_s$ not through the secondary windings $N_{21}$ and $N_{22}$ to preclude the base current in terms of secondary current in the windings $N_{21}$ and $N_{22}$ from flowing through the resistors $R_{s1}$ and $R_{s2}$ as in the circuits shown in FIGS. 53 and 54. This consideration serves to reduce measuring error.

FIG. 56 shows another embodiment of the invention for illustrating improvements on the embodiments shown in FIGS. 53 to 55. FIG. 56(a) is for bipolar operation, and FIG. 56(b) for unipolar operation. In the circuits shown in FIGS. 53 to 55, the windings $N_{21}$ and $N_{22}$ are used for supplying positive and negative currents to excite the core $T_1$. Whereas, in the circuit shown in FIG. 56, one excitation winding is used instead of the windings $N_{21}$ and $N_{22}$, the dc source is divided serially into two, the transistors are connected in series, and the excitation winding is connected between the junction between the two dc sources and the junction between the two transistors. The core $T_2$ is excited through the positive feedback winding $N_{22}$ so that the transistor $Q_1$ (or diode $D_1$) and transistor $Q_2$ (or diode $D_2$) are alternately turned on and off. This circuit is fundamentally the same as that shown in FIG. 53. Briefly, according to this embodiment, one resistor $R_s$ is used in place of two resistors $R_{s1}$ and $R_{s2}$ in the circuits shown in FIGS. 53 to 55.

In the embodiments of the invention shown in FIGS 53 to 56, the core $T_2$ is saturated for polarity switching for the purpose of operating the core $T_1$ in an unsaturated state. The core $T_2$ may be considered as an operational element operated so that the core $T_2$ is saturated through the output voltage from the core $T_1$, that is, the product of the voltage and the time on the core $T_1$ is maintained constant. To this effect, other suitable element can be used instead of the saturable core $T_2$. An example of this arrangement is shown in FIG. 57, in which the output voltage of the secondary winding $N_{22}$ of core $T_1$ is supplied to an element VT which makes the voltage-time product constant. The element VT comprises operational amplifiers A1, A2 and A3; the output voltage of the winding $N_{22}$ is applied to the operational amplifier A1 which has an integrating function. The voltage is integrated with respect to time by the circuit having a resistor $R_1$ and a capacitor $C_1$. The resultant output is supplied through a resistor $R_7$ to the comparator A2 of hysteresis type. The comparator A2 is capable of generating its positive and negative output voltages equal to each other at saturations in the core $T_1$. Thus the amplifiers A1 and A2 operate in combination so that the voltage-time product on the winding $N_{22}$ is maintained constant at switching from positive to negative and from negative to positive. As described, this function is the same as that of the core $T_2$. The purpose of the amplifier A3 is to switch the polarity of the flux $\phi_1$ when the core $T_1$ is saturated before the voltage-time product integrated by the amplifiers A1 and A2 reaches a given value. Here the amplifier A3 operates as a differential compensating comparator to stabilize the integral operation. To this effect, the resistor $R_6$ is larger than the resistor $R_7$ in value and the capacitance element $C_p$ is essentially responsible for the differential operation. The transistors $Q_2$ and $Q_1$ turn on alternately in response to positive and negative outputs of the amplifier A2 ans thus the polarity of the voltage applied to the core $T_1$ is switched.

Therefore, as described above, the element VT serves for the purpose of the core $T_2$ used in the circuits shown in FIGS. 53 to 56. The use of the element VT makes it possible to reduce the error attendant on the circuit using the core $T_2$ in which the increase in the current in the winding at saturation of flux $\phi_2$ affects the resistors $R_{s1}$ and $R_{s2}$. Furthermore, according to this embodiment, the voltage of the winding $N_{22}$ can be treated by a high impedance and hence the inductive error due to the winding $N_{22}$ can be neglected and the primary current can be measured with high accuracy. FIG. 58 shows waveforms of voltage and current used in the circuit shown in FIG. 57.

In the embodiments shown in FIGS. 56(a) and 57, power amplifiers may be used in place of transistors $Q_1$ and $Q_2$.

According to the invention, the core $T_2$ can be kept unsaturated by an element capable of maintaining the voltage-time product on the winding $N_{22}$ in positive and negative directions. Thus, with the core $T_1$, the primary dc current can be detected without accompanying ripple component. From the detected output, the polarity of the primary current can be identified. This enables the circuit of the invention to be operated as an ac transformer device capable of detecting the polarity of the primary current. According to the invention, the circuits disclosed above may be used as a voltage transformer device when the number of turns of the primary winding $N_1$ is increased to enable the core to be excited by a small amount of current and an impedance element such as a series resistance element or an inductance element is inserted in the input winding circuit.

Figure 61:
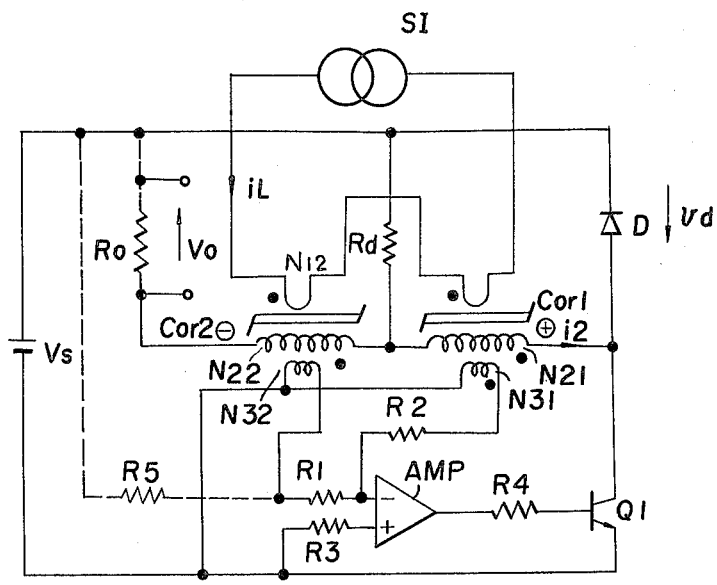
Figures 62A, 62B:
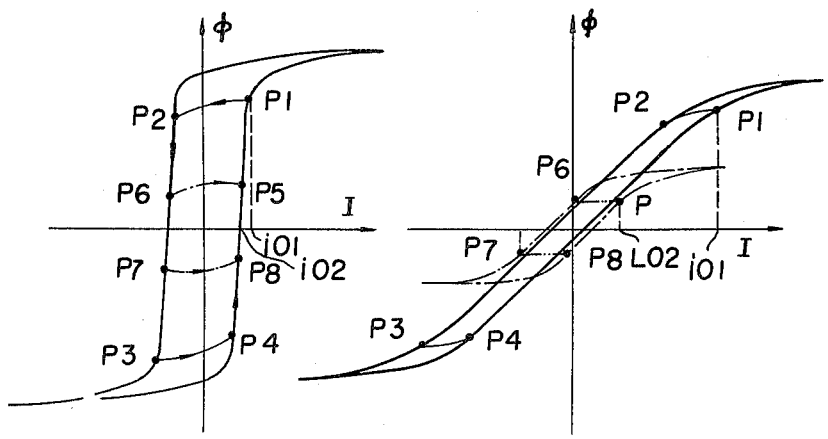
FIG. 62 is a diagram for illustrating flux behavior at cores.

FIG. 61 is a circuit diagram showing another transformer device of the invention, in which the references $Cor_1$ and $Cor_2$ denote cores of the same characteristic such as rectangular hysteresis characteristic as shown in FIG. 62(a), of which the magnetomotive force is small. The references $N_{11}$, $N_{21}$, $N_{31}$, $N_{12}$, $N_{22}$ and $N_{32}$ denote windings wound on the cores $Cor_1$ and $Cor_2$ respectively. The primary windings $N_{11}$ and $N_{12}$, connected in series to each other, carry current from a current source $S_I$, which current is to be measured. The secondary windings $N_{21}$ and $N_{22}$ are connected in series to each other and thence to a resistor $R_o$ through which the secondary current flows. The secondary winding is connected serially to a dc power source $V_s$ through a transistor $Q_1$ or short-circuited through a diode $D_1$. A dc amplifier AMP whose gain is sufficiently high is used to drive the base of the transistor $Q_1$. The outputs of the windings $N_{31}$ and $N_{32}$ are supplied to the negative input terminal of the amplifier AMP through resistors $R_2$ and $R_1$ respectively. The positive input terminal thereof is led to a negative potential.

Assume no current $i_L$ flows from the current source $S_I$. A positive voltage is applied to the negative input terminal of the amplifier AMP through a resistor $R_5$ whose resistance value is far higher than those of the resistors $R_1$ and $R_2$. The resultant amplifier output is 'low' and the transistor $Q_1$ remains in the off state, causing the circuit in FIG. 61 to be inoperative. When the current $i_L$ flows from the current source $S_I$ and the two cores are in an unsaturated state, currents flow in the primary windings $N_{12}$ and $N_{11}$ whose numbers of turns are equally $n_b$ and in the secondary windings $N_{22}$ and $N_{21}$ whose numbers of turns are equally $n_2$, satisfying the equi-ampere-turn law. Thus a current $i_2$ satisfying the condition $n_1 i_L \approx n_2 i_2$ flows by way of $N_{22}$—$N_{21}$—$D_1$—$R_o$—$N_{22}$. The current $i_2$ is detected in terms of voltage $V_o$ across the resistor $R_o$. While, on the other hand, a voltage in the direction indicated therein is induced across the series windings $N_{22}$ and $N_{21}$, being equal to the sum of the voltage $V_o$ and the voltage drop across the diode $D_1$. The winding $N_{21}$ is responsible for most part of the induced voltage because the current flowing in the winding $N_{21}$ is larger than that in the winding $N_{22}$ due to a bias resistor $R_d$. The exciting current for the core $Cor_1$ is larger than that for the core $Cor_2$ because the former has the winding $N_{21}$. As a result, the voltage induced across the winding $N_{31}$ is higher than that induced across the winding $N_{32}$, and the voltage being the difference between the voltages across the windings $N_{31}$ and $N_{32}$ is positive at the negative input terminal of the amplifier AMP. Accordingly the amplifier output is 'low' and the transistor $Q_1$ remains in the off state. When the core $Cor_1$ approaches its saturation level, more exciting current becomes necessary, with the result that most part of the voltage induced across the series windings $N_{21}$ and $N_{22}$ is shared by the winding $N_{22}$ and hence the voltage across the winding $N_{32}$ becomes higher than that across the winding $N_{31}$. Consequently, the amplifier output becomes positive, causing the transistor $Q_1$ to be turned on and its collector potential to approach negative and the diode $D_1$ to be cut off. In this state, the current $i_2$ flows by way of $V_s$—$R_o$—$N_{22}$—$N_{21}$—$Q_1$—$V_s$. The voltage applied across the series windings $N_{21}$ and $N_{22}$ is inverted and the fluxes of the core $Cor_1$ and $Cor_2$ move in the reverse direction to maintain the core $Cor_1$ unsaturable. Most part of the voltage applied across the series windings $N_{21}$ and $N_{22}$ is shared by the winding $N_{21}$ because the current in the winding $N_{21}$ is larger than that in the winding $N_{22}$ due to the bias resistor $R_d$. This voltage is fed back to the amplifier AMP through the windings $N_{31}$ and $N_{32}$. As a result, the voltage applied to the negative input terminal of the amplifier becomes negative and the resultant amplifier output is 'high' causing the transistor $Q_1$ to remain in the on state. The current $i_2$ flows therein satisfying the equi-ampere-turn law between the primary and secondary sides as in the operation wherein the transistor $Q_1$ is in the off state. When the transistor is in the on state and the flux of the core $Cor_1$ reversely approaches its saturation level, the voltage across the winding $N_{21}$ becomes smaller than that across the winding $N_{22}$. The voltage across the series windings $N_{21}$ and $N_{22}$ is detected by the amplifier AMP through windings $N_{31}$ and $N_{32}$, and the transistor $Q_1$ turns off as the result that the amplifier output turns into 'low' from 'high'. The current $i_2$ flows again through the diode $D_1$ and a cycle of the above operations starts again. As described above, the cores $Cor_1$ and $Cor_2$ are not saturated although they approach their saturation levels, and the current $i_2$ flows while the transistor $Q_1$ repeats on and off, satisfying the equi-ampere-turn law. The voltage developed across the resistor $R_o$ is the output $V_o$ which is proportional to the current $i_L$ to be measured. Because the two cores are in an unsaturated state even at switching in the transistor $Q_1$ from on to off and off to on, the equi-ampere-turn law holds at all times, precluding large slot-ripple as encountered in the prior art current transformer, although there is a small amount of excitation ripple in the output $V_o$ ascribed to excitation polarity inversion.

FIG. 62 is a diagram for illustrating hysteresis characteristics of the cores $Cor_1$ and $Cor_2$; (a) shows a hysteresis loop $P_1-P_2-P_3-P_4$ formed by the flux of $Cor_1$, and a hysteresis loop $P_5-P_6-P_7-P_8$ formed by the flux of $Cor_2$. There is a difference between exciting currents $i_{o1}$ and $i_{o2}$ at the switching points $P_1$ and $P_5$ because the exciting current for the core $Cor_1$ is larger than that for the core $Cor_2$ by an amount ascribed to the bias resistor $R_d$. The hysteresis loop formed by the flux of $Cor_1$ is larger than that formed by the flux of $Cor_2$. Therefore the maximum flux of $Cor_2$ may be smaller than that of $Cor_1$, or the core $Cor_2$ may be smaller in size than the core $Cor_1$. The two cores may be made of a material having a rectangular hysteresis characteristic or of a ferrite material having hysteresis characteristic shown in FIG. 62(b) in which points $P_1$ to $P_8$ correspond to points $P_1$ to $P_8$ in FIG. 62(a). In any case, there should be a difference in flux change between the two cores due to the bias resistor $R_d$ whereby the individual fluxes are inverted under the application of current of the same polarity.

FIG. 63 shows waveforms for illustrating operations of the circuit shown in FIG. 61; (a) is a waveform of primary current $i_L$ from current source $S_2$, (b) a waveform of flux $\phi_1$ of core $Cor_1$, (c) a waveform of flux $\phi_2$ of core $Cor_2$, (d) a waveform of voltage across the diode $D_1$, and (e) a waveform of voltage drop $V_o$ across resistor $R_o$. As apparent from FIG. 61, the ripple component in the output $V_o$ is negligibly small. The circuit of the invention dispenses with the need for an ac power source which has hitherto been needed for the conventional dc current transformer. Accordingly the circuit of the invention needs no rectifier means such as diodes. Furthermore, according to the invention, the circuit does not operate when no primary current is supplied from the current source. While the circuit of the invention operated for the purpose of a dc current transformer has been described, the circuit of the invention is readily applicable to potential transformers. To this effect, the numbers of turns of primary windings $N_{11}$ and $N_{12}$ are increased and a high impedance element is inserted between these windings and the voltage source whose voltage is to be measured.

Referring to FIG. 64, another embodiment of the invention is illustrated wherein the amplifier AMP (FIG. 61) is omitted. In FIG. 64, windings $N_{31}$ and $N_{32}$ are connected in series to each other through which a switching element comprising Darlington transistors $Q_1$ and $Q_2$ is driven. A capacitor $C_d$ is connected in series to the bias resistor $R_d$ for the purpose of improving the hysteresis characteristic of the core $Cor_1$. (Note: Without the capacitor $C_d$, the flux of the core $Cor_1$ is dc-biased by the resistor $R_d$, causing its hysteresis range to be limited.) The increase in the exciting current with time is bypassed through the capacitor $C_d$ as charge-discharge current so that the exciting current is supplied more for the core $Cor_1$ than for the core $Cor_2$. In this view, the circuit in FIG. 64 is fundamentally the same as that shown in FIG. 61.

Figure 65:
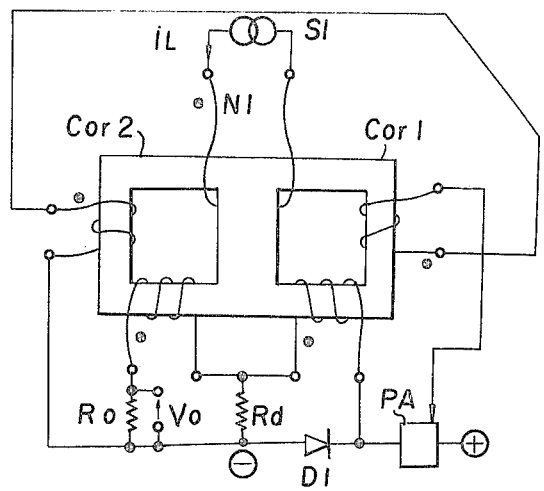

FIG. 65 shows another embodiment of the invention for an improved arrangement of cores $Cor_1$ and $Cor_2$. In this embodiment, one core is magnetically divided into two parts for use as cores $Cor_1$ and $Cor_2$. A power amplifier PA is used in place of the transistor $Q_1$ (or transistors $Q_1$ and $Q_2$) to be operated as a switching element. The voltage induced across the windings $H_{31}$ and $N_{32}$ is positively fed back to the power amplifier PA. This ciruit is operably the same as those shown in FIGS. 61 and 64.

The resistor $R_d$ or a series of resistor $R_d$ and capacitor $C_d$ may be connected in parallel to the winding $N_{22}$ which excites the core $Cor_2$, instead of the arrangement shown in FIGS. 61, 64 and 65. This modified arrangement serves to reduce the ripple component in the output $V_o$ as in the circuits shown in FIGS. 61, 64 and 65, although in this circuit the output accuracy is slightly lower because the current flowing through the resistor $R_d$ passes through the resistor $R_o$ although it is very small in value.

In this embodiment, resistors may be used in place of diodes $D_1$ to $D_3$. The current $i_2$ flows in the resistors while the transistor $Q_1$ or the amplifier PA is in the off state. The voltage drop across the resistor due to the current $i_2$ is generally larger than that across the diode and thus the off time of the transistor $Q_1$ or the power amplifier PA can be reduced and the on time thereof can be increased.

Figure 66:
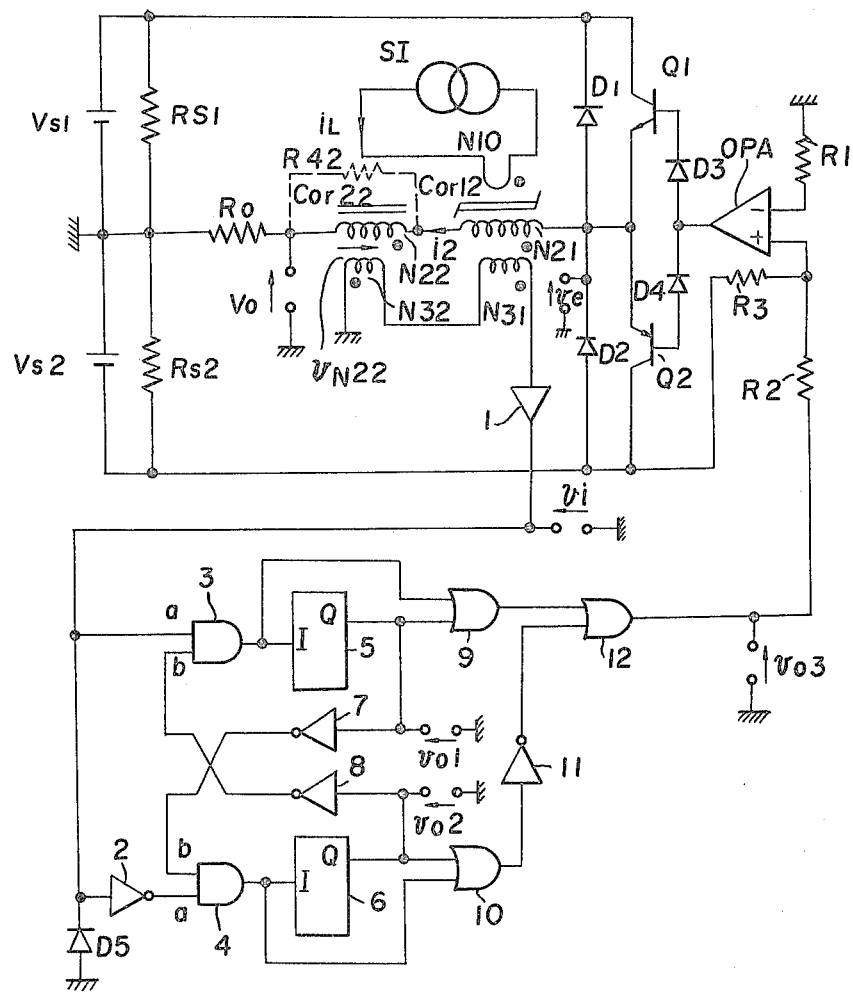

With reference to FIG. 66, there is shown a circuit diagram for illustrating another embodiment of the invention in which the symbols $V_{s1}$ and $v_{s2}$ denote dc power sources, $Q_1$ and $Q_2$ transistors, R is a resistor, D a diode, OPA an amplifier whose gain is sufficiently high, $Cor_1$ and $Cor_2$ a saturable core and a reactor core respectively, and $N_{10}$, $N_{21}$, $N_{31}$, $N_{22}$ and $N_{32}$ windings wound on the cores $Cor_1$ and $Cor_2$ with their starting ends indicated by dots. A current to be detected is supplied to the winding $N_{10}$ from a current source $S_I$. The numeral 1 denotes an amplifier whose gain is 1 and input impedance is high, 2, 7, 8 and 11 inverters, 3 and 4 AND gates, 9, 10 and 12 OR gates, and 5 and 6 one-shot circuits capable of generating at the output terminal 0 a positive signal of a given duration when the signal at the input terminal I changes its level from 'L' to 'H.' This circuit operates as a transformer device of which the output is a voltage drop $V_o$ induced across the resistor $R_o$ when the primary current is supplied to the winding $N_{10}$.

Assume no current $i_L$ flows the current source $S_I$ and the output of the amplifier OPA is positively saturated. In this state, the transistor $Q_1$ is in the on state and the transistor $Q_2$ is in the off state, and the common emitter stands at a positive potential $V_e (\approx V_{s1})$. While, a voltage approximately equal to $V_{s1}$ is applied across the series circuit of the windings $H_{21}$, $H_{22}$ and the resistor $R_o$. The winding $N_{22}$ is wound on the core $Cor_2$ to serve as a reactor when an air gap is formed on the core $Cor_2$. When change in the current with time is small and the core $Cor_1$ has a rectangular hysteresis characteristic, then nearly no voltage is induced across the winding $N_{21}$ and almost all the voltage $V_{s1}$ is applied across the winding $N_{21}$. In this state, only the exciting current for the core $Cor_1$ flows in the windings $N_{21}$ and $N_{22}$ and the resistor $R_o$. This current increases with time but is small in magnetomotive force and hence is small in absolute value. As a result, its change with time, di/dt, is small, the voltage drop across the resistor $R_o$ is small, and the voltage induced across the winding $N_{22}$ is small accordingly.

In the meantime, the flux of core $Cor_1$ approaches its positive saturation $+\phi_m$ from its negative saturation $-\phi_m$. The nearer the flux approaches $+\phi_m$, the greater becomes the magnetomotive force in the core $Cor_1$. The rapid increase in the magnetomotive force causes the voltage across the reactor winding $N_{22}$ to increase. (Note: This voltage is in the value $N_{22}(di/dt)$ where $N_{22}$ is the number of turns of winding $N_{22}$, and i is the exciting current component for the core $Cor_1$. The sum of the voltages induced across the windings $N_{31}$ and $N_{32}$ wound on the individual cores in reversely serial relationship is inverted from positive to negative, and the output voltage $V_i$ of the amplifier 1 is inverted from positive to negative accordingly. As a result, the voltage at the input terminal a of the AND gate 4 turns into positive from negative, and the resultant output turns into positive accordingly. The output terminals of the one-shot circuits 5 and 6 stand at 'L' level after these one-shot circuits generate one-shot signals, causing the input terminals b of the AND gates 3 and 4 to stand at a positive level. At the inversion of the output of the AND gate 4 into positive, the one-shot circuit 6 is driven to generate a positive voltage at its output terminal 0 for a given period of time. This output voltage is fed back to the input terminal b of the AND gate 3 through the inverter 8 whereby the output of the AND gate 3 is retained, causing the output of the OR gate 9 to remain 'L.' At the same time, the output of the OR gate 10 stands at 'H' and the output of the inverter 11 stands 'L.' Consequently, the output voltage $V_{o3}$ of the OR gate 12 turns into 'L' and positive input terminal of the amplifier OPA stands at a negative level. The resultant amplifier output becomes negative, causing the transistor $Q_2$ to turn on and the transistor $Q_1$ turn off. Thus the voltage across the series circuit of the resistor $R_o$ and the windings $N_{22}$ and $N_{21}$ is inverted, that is, the voltage $V_e$ is inverted into negative. This state is maintained unconditionally while the one-shot circuit 6 is in operation. When the output of the one-shot circuit 6 resumes 'L' after a given period of time, the output $V_i$ of the amplifier 1 still remains negative since the voltage induced across the winding $N_{31}$ is negative and the voltage induced across the winding $N_{32}$ is small. Therefore the output of the AND gate 4 is kept positive, the output of the OR gate 10 is positive, the output of the inverter 11 is negative, and the output $V_{o3}$ of the OR gate 12 is 'L.' Even after the output of the one-shot circuit 6 turns into 'L' from 'H,' the output of the amplifier OPA is kept negative. In the meantime, the flux $\phi_1$ of the core $Cor_1$ moves toward $-\phi_m$ from $+\phi_m$. When the flux $\phi_1$ reaches a point near $-\phi_m$, the exciting current in the winding $N_{21}$ tends to rapidly increase, causing the voltage $V_i$ to be inverted into positive. As a result, the output of the AND gate 3 is inverted from 'L' to 'H' to drive the one-shot circuit 5 to hold its output at 'H.' This output holds the input b of the AND gate 4 to make the one-shot circuit 6 inoperative, thereby causing the outputs of the OR gates 9 and 12 to remain positive. Accordingly, the voltage at the positive input terminal of the amplifier OPA turns into positive and its output turns into positive to maintain the transistor $Q_1$ on and the transistor $Q_2$ off. Even after the output of the one-shot circuit 5 resumes 'L' from 'H,' the output of the AND gate 3 remains positive as long as the output $V_i$ is positive. As a result, the output $V_{o3}$ of the OR gate 12 is held positive to allow the output of the amplifier OPA to remain positive. Thus, in the circuit shown in FIG. 66, the polarity of the voltage applied across the secondary winding is inverted each time the flux of the core $Cor_1$ approaches its saturation whereby self-quenching oscillation is maintained.

In this state, the voltage across the reversely serial windings $N_{32}$ and $N_{31}$ is positively fed back to the output $V_e$. If the voltage induced across the winding $N_{32}$ exceeds that across the winding $N_{31}$ in connection with the reactor winding $N_{22}$ and the saturable core winding $N_{21}$, the voltage $V_e$ will be inverted. If, however, the voltage induced across the winding $N_{31}$ is inverted to exceed the voltage induced across the winding $N_{32}$ immediately after the voltage across the winding $N_{32}$ exceeds that across the winding $N_{31}$, the need for the one-shot circuits 5 and 6 is obviated theoretically. The purpose of these one-shot circuits is to provide a time for which the flux polarity is inverted in the saturable core. Without the one-shot circuit, the voltage $V_e$ depends on the voltage of the reactor winding and ringing is likely to occur. FIG. 70 graphically illustrates the relationship between the exciting current and flux behavior in the cores $Cor_1$ and $Cor_2$.

In FIG. 70, the curve of flux change indicates the permeability $\mu$ which is proportional to the inductance of the individual winding. When the flux of the core $Cor_1$ reaches its saturation point $P_1$ (or $P'_1$), the voltage $V_e$ is inverted. When the flux moves below the point $P_2$, the inductance of the core $Cor_2$ becomes larger than that of the core $Cor_1$ and hence the voltage across the winding $N_{31}$ is higher than that across the winding $N_{32}$. In this state, stable positive feedback operation is maintained, that is, the same feedback polarity is maintained by the one-shot circuit over the period of the flux moves from the point $P_1$ to the point $P_2$. In FIG. 70, the dot-dash line indicates a gradient parallel to the flux characteristic curve of the core $Cor_2$, being in contact with the characteristic curve of the core $Cor_1$ at the point $P_2$.

In FIG. 66, the resistor $R_4$ connected in parallel to the winding $N_{22}$ of the core $Cor_2$ has a high resistance and is used to damp the stray capacitance ascribed to the windings and thereby to stabilize circuit operations.

In the circuit shown in FIG. 66, assume the current $i_L$ flows from the current source $S_I$ in the direction indicated therein. When the transistor $Q_1$ is in the on state and the transistor $Q_2$ in the off state, the current $i_I$ flows in the winding $N_{10}$ whose number of turns is $n_1$. In this state, the flux of the core $Cor_1$ is in an unsaturated region and the current $i_2$ flows in the winding $N_{21}$ in the direction indicated therein conforming to the equi-ampere-turn law where $i_2 = (n_1/n_2)i_L$, with the exciting current neglected. The current $i_2$ flows by way of $V_{sI}$—$Q_1$—$N_{21}$—$N_{22}$—$R_o$—$V_{sI}$. The voltage drop across the resistor $R_o$ is the output proportional to the current $i_2$, i.e., the current $i_L$. Then, when the flux of the core $Cor_1$ approaches its saturation, the transistor $Q_1$ turns off and the transistor $Q_2$ turns on. Nevertheless the current $i_2$ flows by way of $V_{s2}$—$Q_2$—$N_{21}$—$N_{22}$—$R_o$—$V_{s2}$ and the polarity of the output $V_o$ remains unchanged. The current $i_2$ flows in the transistor $Q_2$ from the collector to the emitter. If in this direction the amplification factor of the transistor $Q_2$ is insufficient, the current $i_2$ flows through the diode $D_2$. The diode $D_3$ is used to prevent the transistor $Q_1$ from being turned on during the above operation. Thus, while the transistors $Q_1$ and $Q_2$ repeat on and off, the output $V_o$ proportional to the primary current $i_L$ is obtained across the resistor $R_o$.

When the current $i_L$ flows from the current source $S_I$ in the reverse direction, the flow of the current $i_2$ is inverted and the output $V_o$ is inverted accordingly. Hence the polarity of the current $i_L$ can be identified.

The circuit shown in FIG. 66 can operate without using the reactor core $Cor_2$ and the windings $N_{22}$ and $N_{32}$. In practice, however, the flux of the core $Cor_1$ reaches a sufficiently deep saturation point, causing the output $V_o$ to accompany a large spiked ripple each time the voltage $V_e$ is inverted. The purpose of the core $Cor_2$ is to switch the polarity of the voltage $V_e$ immediately before the core $Cor_1$ is deeply saturated and thereby to minimize or eliminate the ripple. FIG. 67 shows waveforms for illustrating operations of the circuit shown in FIG. 66. In FIG. 67, waveforms shown in the left half are for operations where the current $i_L$ flows in the direction indicated in FIG. 66 and in the right half for operations where the current $i_L$ flows in the reverse direction. In FIG. 67, (a) is a waveform of the current $i_L$, (b) a waveform of the voltage $V_e$ at the common emitter of transistors $Q_1$ and $Q_2$, (c) a waveform of the flux $\phi_1$ of the core $Cor_1$, (d) a waveform of the voltage $V_{N22}$ induced across the reactor winding $N_{22}$, (e) a waveform of the output voltage $V_i$ of the amplifier 1, (f) a waveform of the output of the one-shot circuit 5, (g) a waveform of the output of the one-shot circuit 6, (h) a waveform of the positive input voltage of the amplifier OPA, and (i) a waveform of the voltage drop $V_o$ across the resistor $R_o$. In FIGS. 67(b), (c) and (i), the dotted lines indicate waveforms present when $i_L=0$.

As shown in FIG. 67(b), the voltage $V_e$ increases or decreases (or decreases or increases) in the positive direction (or negative direction) according to the polarity of the current $i_L$. Hence, by measuring the voltage $V_e$, the output of the circuit can be obtained. In FIG. 66, the circuit consisting essentially of the transistors $Q_1$ and $Q_2$ and the amplifier OPA may be used in place of the power amplifier.

Figure 68:
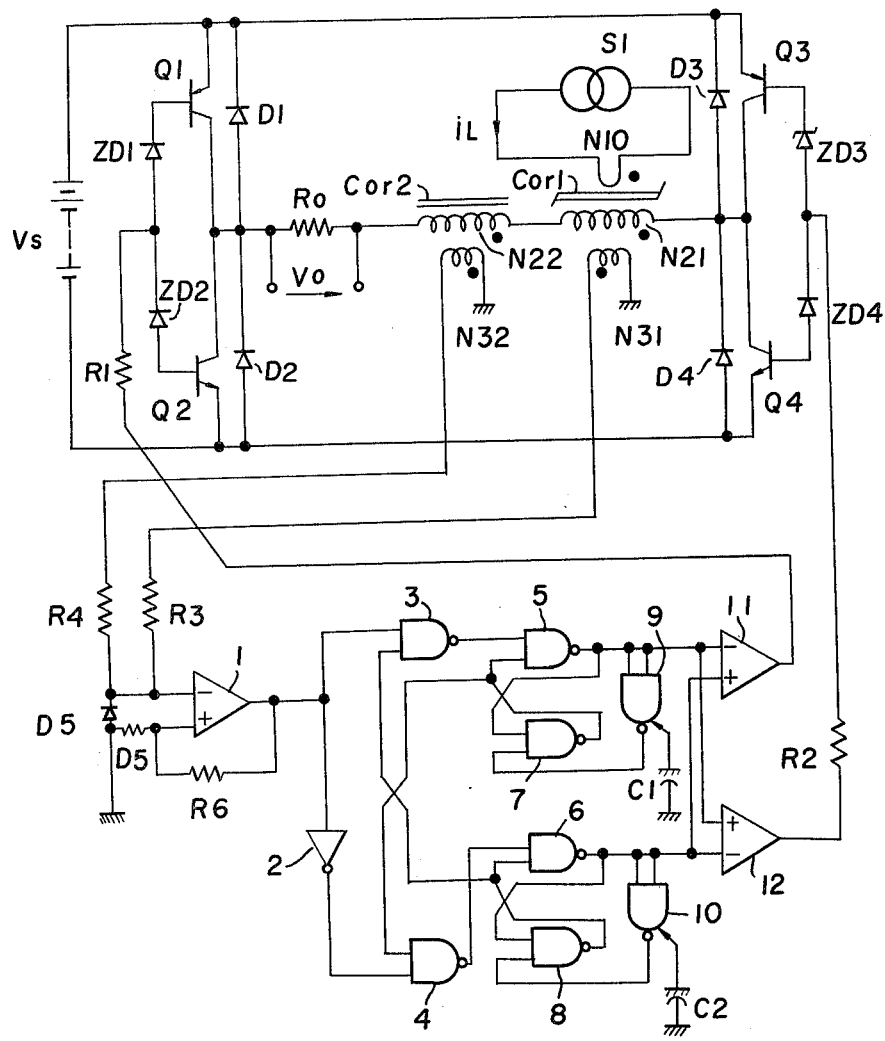

FIG. 68 shows another embodiment of the invention which is fundamentally the same as the one shown in FIG. 66. This embodiment uses one dc power source and four transistors. Currents are fed back through resistors $R_3$ and $R_4$ to the amplifier 1 from the windings $N_{31}$ and $N_{32}$ wound on the saturable core $Core_1$ and reactor core $Cor_2$ respectively. The difference current is amplified and supplied to NAND gates 3 and 4, NAND gates 5, 7 and 9 and NAND gates 6, 8 and 10 operate as one-shot circuits respectively, and their outputs are supplied to the negative and positive input terminals of comparator amplifiers 11 and 12 respectively. The comparator outputs drive a bridge transistor circuit comprising transistors $Q_1$ to $Q_4$ whereby a series circuit of windings $N_{21}$, $N_{22}$ and resistors $R_o$ is excited in both directions. The references $ZD_1$ to $ZD_4$ denote zener diodes. The amplifiers 1, 11 and 12 may be driven from one power source $V_s$.

Figure 69:
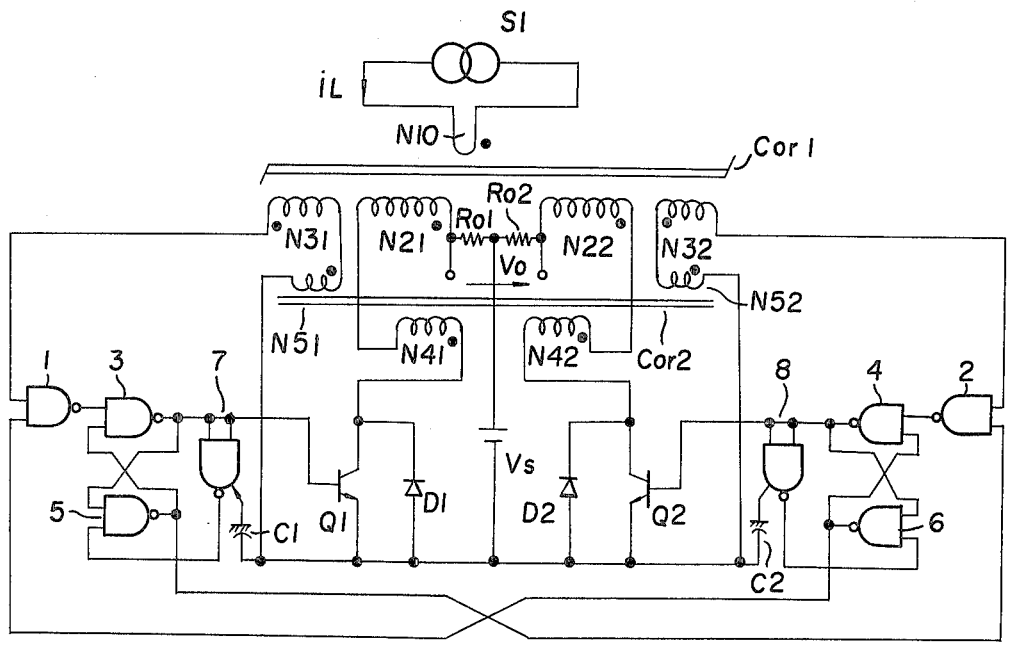

FIG. 69 shows another embodiment of the invention which comprises secondary windings $N_{21}$ and $N_{22}$ for the saturable core $Cor_1$. By turning on the transistor $Q_1$ and $Q_2$ alternately, the current satisfying the equi-ampere-turn law on the secondary side and canceling the current $i_L$ flows in the windings $N_{21}$ and $N_{22}$ alternately. This current is detected as an output $V_o$ across resistors $R_{o1}$ and $R_{o2}$. The reactor core $Cor_2$ is provided in common for the secondary windings $N_{41}$, $N_{51}$, $N_{42}$ and $N_{52}$ on the sides of transistors $Q_1$ and $Q_2$. For this purpose two cores may be used instead of one core $Cor_2$.

In the above embodiments of the invention, the saturable core $Cor_1$ has a rectangular hysteresis characteristic. Instead, the core $Cor_1$ may be of soft ferrite core having a hysteresis characteristic with a large gradient. In this case, the rapid increase in the exciting current is detected by the reactor and fed back and hence the excitation polarity is inverted immediately before the saturation. As a result, the ripple component in the output is reduced. In the embodiments shown in FIGS. 66, 68 and 69, the difference between the outputs of the windings of $Cor_1$ and $Cor_2$ is fed back whereby the exciting current is inverted. Instead, only the voltage across the winding of $Cor_1$ (or $Cor_2$) may be fed back without using the voltage across the winding of $Cor_2$ (or $Cor_1$). In this case, the core $Cor_1$ tends to be saturated slightly too deep; however, the resultant increase in current is limited by the winding of the core $Cor_2$ and the ripple in the output is limited accordingly.

In the above embodiments, the current source $S_I$ is used as the input current. Instead of the current source, a voltage source may be used. In this case, the number of turns of the winding $N_{10}$ is suitably increased and a high impedance element is connected in series to the winding $N_{10}$ whereby the output $V_o$ proportional to the voltage of the voltage source can be obtained.

As has been described above, the transformer device of the invention detects the primary current or voltage and its polarity as well in terms of the output proportional to the primary input. The circuit of the invention performs self-quenching oscillation and hence does not require the use of extra ac power source and the circuit construction can be simplified. Furthermore, one core suffices on which the input winding (i.e., the winding carrying the input current) is wound and therefore the circuit construction can be simplified.

While preferred embodiments of the invention and specific modifications thereof have been described, it is to be understood that the invention is not limited to the disclosed examples but numerous variations may occur to those skilled in the art without departing from the true spirit of the invention.

What is claimed is:

1. A current transformer device comprising:
two magnetic cores excited by one exciting current and maintained in the non-saturated state;
an input winding wound on at least one of the magnetic cores;
at least one exciting winding wound on the two magnetic cores and passing the exciting current;
detecting means including detecting windings wound on said magnetic cores for detecting a magnetic flux change rate of at least one of the magnetic cores;
exciting means connected to said at least one exciting winding and driven by an output of said detecting means for switching the polarity of a voltage applied to the exciting winding based on the output of the detecting means to maintain said cores in the non-saturated state; and
means for obtaining the current value passing through the exciting winding circuit.

2. The current transformer device according to claim 1 wherein: the conditions of magnetization of the two magnetic cores are different from each other.

3. A current transformer device comprising:
a plurality of magnetic cores shunted or divided into at least two magnetic passages, wherein the magnetic cores of said two magnetic passages are maintained in the non-saturated state;
an input winding wound on the magnetic cores;
at least one exciting winding wound on said magnetic cores;
an impedance shunt circuit connected to said exciting winding for causing different magnetic fluxes in the two magnetic passages;
means for switch-controlling the voltage applied to the exciting winding depending upon the corresponding magnetic flux in the two magnetic passages, such that said magnetic passages are maintained non-saturated; and
means for obtaining the current value passing through the exciting winding circuit.

* * * * *